United States Patent
Sugai et al.

(10) Patent No.: US 11,920,019 B2
(45) Date of Patent: Mar. 5, 2024

(54) RESIN COMPOSITION AND ELECTRONIC DEVICE

(71) Applicant: Konica Minolta, Inc., Tokyo (JP)

(72) Inventors: Tomomi Sugai, Hino (JP); Shinya Otsu, Koganei (JP); Hiroshi Nishimura, Hachioji (JP); Kunio Tani, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 69 days.

(21) Appl. No.: 17/278,033

(22) PCT Filed: Oct. 2, 2019

(86) PCT No.: PCT/JP2019/038882
§ 371 (c)(1),
(2) Date: Mar. 19, 2021

(87) PCT Pub. No.: WO2020/071415
PCT Pub. Date: Apr. 9, 2020

(65) Prior Publication Data
US 2021/0347964 A1    Nov. 11, 2021

(30) Foreign Application Priority Data

Oct. 3, 2018 (JP) .................. 2018-187968
Jan. 31, 2019 (JP) .................. 2019-016036
Jun. 25, 2019 (JP) .................. 2019-117543

(51) Int. Cl.
C08K 5/34        (2006.01)
C08L 101/00      (2006.01)
H01L 29/786      (2006.01)

(52) U.S. Cl.
CPC .............. *C08K 5/34* (2013.01); *C08L 101/00* (2013.01); *C08L 2203/20* (2013.01); *H01L 29/786* (2013.01)

(58) Field of Classification Search
CPC ...... C08K 5/34; C08L 101/00; C08L 2203/20
See application file for complete search history.

(56) References Cited

U.S. PATENT DOCUMENTS 5,731,138 A * 3/1998 Helling .............. G03C 7/39296
                                                          430/505

FOREIGN PATENT DOCUMENTS

| JP | 2015-122186 A | 7/2015 | |
| JP | 2015-122247 A | 7/2015 | |
| JP | 2015122186 A * | 7/2015 | ........... G02F 1/1343 |
| JP | 2015122247 A * | 7/2015 | ........... H01B 5/14 |
| JP | 2015-178628 A | 10/2015 | |
| WO | 2013/024849 A1 | 2/2013 | |
| WO | 2017/073133 A1 | 5/2017 | |

OTHER PUBLICATIONS

PCT, International Search Report for the corresponding application No. PCT/JP2019/038882, dated Dec. 3, 2019, with English translation.
PCT, Written Opinion of the ISA for the corresponding application No. PCT/JP2019/038882, dated Dec. 3, 2019, with English translation.
CNIPA, Office Action/Search Report for the corresponding application No. 201980065525.4, dated Jan. 28, 2022, with English translation.
Office Action/Search Report dated May 16, 2023 for the corresponding Japanese application No. 2020-550492, with English translation.

* cited by examiner

*Primary Examiner* — Bijan Ahvazi
(74) *Attorney, Agent, or Firm* — LUCAS & MERCANTI, LLP

(57) ABSTRACT

A resin composition includes a resin or a resin precursor, and a nitrogen-containing aromatic heterocyclic compound. The nitrogen-containing aromatic heterocyclic compound has a structure represented by the following general formula (1), the following general formula (6) or the following general formula (7):

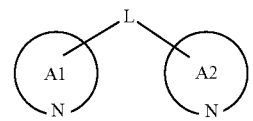

General Formula (1)

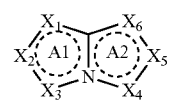

General formula (6)

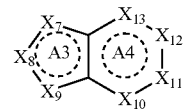

General formula (7)

In the general formula (1), A1 and A2 each represent a 6-membered nitrogen-containing aromatic heterocyclic ring together with a nitrogen atom, and the 6-membered nitrogen-containing aromatic heterocyclic ring optionally forms a fused ring; and L represents a single bond, or a linking group derived from an aromatic hydrocarbon ring, an aromatic heterocyclic ring, or an alkyl group. The resin composition includes the nitrogen-containing aromatic heterocyclic compound in a range from 0.10 to 30% by mass relative to the resin or the resin precursor.

3 Claims, No Drawings

RESIN COMPOSITION AND ELECTRONIC DEVICE

CROSS REFERENCE TO RELATED APPLICATION

This Application is a 371 of PCT/JP2019/038882 filed on Oct. 2, 2019, which claims priority of Japanese patent application nos. 2018-187968 filed Oct. 3, 2018, 2019-016036 filed Jan. 31, 2019, and 2019-117543 filed Jun. 25, 2019, the above applications are incorporated herein by reference.

TECHNICAL FIELD

The present invention relates to a resin composition and an electronic device, and in particular relates to a resin composition and an electronic device which are excellent in adhesiveness to a metallic conductive layer, stability in high temperature storage, and light transmittance.

BACKGROUND ART

Light conductive elements have been recently used in various fields of, for example, substrates of not only various displays of liquid crystal systems, plasma systems, organic electroluminescent systems, field-emission systems, and the like, but also optoelectronic devices, such as touch panels, mobile phones, electronic paper, various solar batteries, and various electroluminescent light control elements, as well as electrodes and electromagnetic wave shielding layers of various sensors, or heating elements of anti-fogging films and snow melting tanks. Metallic conductive layers are widely used as conductive layers for use in such conductive elements.

In a case where any layer formed from a resin is present in an underlayer of such a metallic conductive layer, there are the problems about adhesiveness at the interface between such a metallic conductive layer and such a resin layer, and stability in high temperature storage.

Materials used for forming such metallic conductive layers of such conductive elements are, for example, metals, such as Au, Ag, Pt, Cu, Rh, Pd, Al, Cr, Mo, W, and Ti, alloys of Ag, Cu, Al, Mo, W, and Ti, and metal materials, such as $In_2O_3$, CdO, $CdIn_2O_4$, $Cd_2SnO_4$, $TiO_2$, $SnO_2$, ZnO, and indium tin oxide (ITO). While silver is often used among such metal materials, silver is very easily aggregated mutually. Thus, no uniform film can be formed at the interface between such a metallic conductive layer and such a resin layer, and a sea-island structure is usually formed to thereby makes it difficult to form a thin silver layer, resulting in not only inferior light transmittance, but also further progression of separation between a silver layer and such a resin layer in high temperature storage, and there is the problem about stability in high temperature storage. Metals other than silver also have the same problem.

For example, Patent Literatures 1 and 2, although disclose a technique about a resin layer, do not describe the problems about adhesiveness at the interface between a metallic conductive layer and such a resin layer, and stability in high temperature storage.

CITATION LIST

Patent Literature

[Patent Literature 1] WO 2013/024849
[Patent Literature 2] JP 2015-178628 A

SUMMARY OF INVENTION

Technical Problem

The present invention has been made in view of the above problems and circumstances, and an object thereof to be achieved is to provide a resin composition which is excellent in adhesiveness to a metallic conductive layer, stability in high temperature storage, and light transmittance, and an electronic device using the resin composition.

Solution to Problem

The present inventor has found in the course of studies about the sources of the above problems in order to solve the above problems that a specified amount of a nitrogen-containing aromatic heterocyclic compound having a specified structure can be contained in a resin or a resin precursor to thereby allow for interaction with a metal in a metallic conductive layer and suppression of diffusion of the metal and, as a result, a mixture or the like can be provided which is favorable in adhesiveness to a metallic conductive layer and which is excellent in stability in high temperature storage and light transmittance, thereby leading to the present invention.

That is, the object of the present invention can be achieved by the following means.

Item 1. A resin composition including a resin or a resin precursor, and a nitrogen-containing aromatic heterocyclic compound, wherein the nitrogen-containing aromatic heterocyclic compound has a structure represented by the following general formula (1), the following general formula (6) or the following general formula (7), and the resin composition includes the nitrogen-containing aromatic heterocyclic compound in a range from 0.10 to 30% by mass relative to the resin or the resin precursor:

[Formula 1]

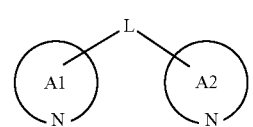

General Formula (1)

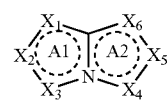

General formula (6)

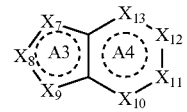

General formula (7)

wherein, in the general formula (1), A1 and A2 each represent a 6-membered nitrogen-containing aromatic heterocyclic ring together with a nitrogen atom, and the 6-membered nitrogen-containing aromatic heterocyclic ring optionally forms a fused ring; and L represents a single bond, or a linking group derived from an aromatic hydrocarbon ring, an aromatic heterocyclic ring, or an alkyl group;

in the general formula (6), $X_1$ to $X_6$ each represent —N=, —NH—, or —$CR_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further haves a substituent; and A1 and A2 form a heteroaryl ring; and in the general formula (7), $X_7$ to $X_9$ each represent —N═, —NH—, or —CR$_1$—; $X_{10}$ to $X_{13}$ each represent —N═ or —CR$_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent, and at least one of $X_{10}$ to $X_{13}$ represents —N═; and A3 and A4 form a heteroaryl ring.

Item 2. The resin composition according to Item 1, wherein the resin includes any of a polyimide resin, an acrylic resin, a cellulose ester resin, a polycarbonate resin, a cycloolefin resin, a phenol resin, an epoxy resin, a polyphenylene ether resin, a polyester resin, or a melamine resin.

Item 3. The resin composition according to Item 1 or Item 2, wherein the resin includes any of a polyimide resin, an acrylic resin, or a melamine resin.

Item 4. The resin composition according to any one of Item 1 to Item 3, including the compound having the structure represented by the general formula (1), the general formula (6) or the general formula (7) in a range from 1 to 10% by mass relative to the resin or the resin precursor.

Item 5. The resin composition according to any one of Item 1 to Item 4, wherein at least one of A1 and A2 in the general formula (1) represents a pyridine ring, a pyrimidine ring, a pyrazine ring, a quinazoline ring, a quinoxaline ring, an azacarbazole ring, an azadibenzofuran ring, an azadibenzothiophene ring, an imidazole ring, a benzimidazole ring, a pyrazole ring, or a benzpyrazole ring.

Item 6. The resin composition according to any one of Item 1 to Item 5, wherein at least one of A1 and A2 in the general formula (1) represents a pyridine ring, a pyrimidine ring, a quinazoline ring, an azacarbazole ring, an azadibenzofuran ring, an azadibenzothiophene ring, or a benzimidazole ring.

Item 7. The resin composition according to any one of Item 1 to Item 6, wherein at least one of A1 and A2 in the general formula (1) has a structure represented by the following general formula (2):

[Formula 2]

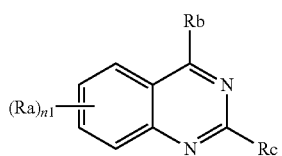

General formula (2)

wherein, in the general formula (2), Ra, Rb and Rc each independently represent a hydrogen atom or a substituent; and n1 represents an integer of 1 to 4; wherein a linking position with the linking group L in the general formula (1) is a substitutable position on the substituent represented by Ra, Rb and Rc, or a substitutable position other than a position at which Ra, Rb and Rc are each present as a substituent on a quinazoline ring.

Item 8. The resin composition according to any one of Item 1 to Item 6, wherein at least one of A1 and A2 in the general formula (1) has a structure represented by the following general formula (3):

[Formula 3]

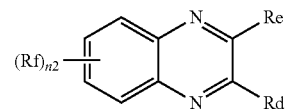

General formula (3)

wherein, in the general formula (3), Re, Rd and Rf each independently represent a hydrogen atom or a substituent; and n2 represents an integer of 1 to 4; wherein a linking position with the linking group L in the general formula (1) is a substitutable position on the substituent represented by Re, Rd and Rf, or a substitutable position other than a position at which Re, Rd and Rf are each present as a substituent on a quinazoline ring.

Item 9. The resin composition according to any one of Item 1 to Item 6, wherein the compound having the structure represented by the general formula (1) is a compound having a structure represented by the following general formula (4):

[Formula 4]

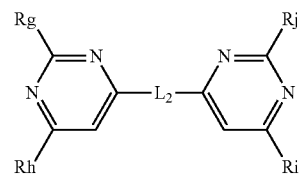

General formula (4)

wherein, in the general formula (4), Rg, Rh, Ri and Rj each independently represent a hydrogen atom or a substituent; at least one of Rg, Rh, Ri and Rj represents a 6-membered aromatic heterocyclic ring and the 6-membered aromatic heterocyclic ring optionally forms a fused ring; and L2 represents a single bond, or a linking group derived from an aromatic hydrocarbon ring, an aromatic heterocyclic ring or an alkyl group.

Item 10. The resin composition according to any one of Item 1 to Item 6, wherein the compound having the structure represented by the general formula (1) is a compound having a structure represented by the following general formula (5):

[Formula 5]

Ar—(Rk)$_{n3}$          General formula (5)

wherein, in the general formula (5), Ar represents a carbazole ring, a dibenzofuran ring, an azadibenzofuran ring, a dibenzothiophene ring, an azadibenzothiophene ring, an azacarbazole ring, a naphthalene ring, an anthracene ring, a phenanthrene ring, or a fluorene ring; Rk represents a hydrogen atom or a substituent; at least two Rk each represent a 6-membered aromatic heterocyclic ring and the 6-membered aromatic heterocyclic ring optionally forms a fused ring; and n3 represents 2 or more.

Item 11. An electronic device including a resin layer and a metallic conductive layer, wherein the resin layer includes the resin composition according to any one of Item 1 to Item 10, and the resin layer and the metallic conductive layer are adjacent.

Item 12. The electronic device according to Item 11, wherein the metallic conductive layer includes any of Ag, Cu, Al, Mo, W, or Ti, or includes an alloy of any of Ag, Cu, Al, Mo, W, or Ti.

Item 13. The electronic device according to Item 11 or Item 12, wherein the resin composition includes two or more resin precursors.

Item 14. The electronic device according to any one of Item 11 to Item 13, wherein the resin layer includes an inorganic particle.

Item 15. The electronic device according to any one of Item 11 to Item 14, wherein the resin layer is a resin layer including a cured product obtained by curing with a light or heat polymerization initiator.

Item 16. An electronic device including a resin layer and a metallic conductive layer, wherein
the electronic device includes an intermediate layer between the resin layer and the metallic conductive layer, the intermediate layer including a compound having a structure represented by the following general formula (1), the following general formula (6) or the following general formula (7):

[Formula 6]

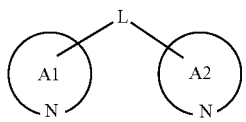

General Formula (1)

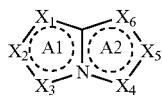

General formula (6)

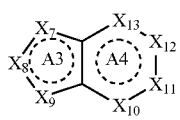

General formula (7)

wherein, in the general formula (1), A1 and A2 each represent a 6-membered nitrogen-containing aromatic heterocyclic ring together with a nitrogen atom, and the 6-membered nitrogen-containing aromatic heterocyclic ring optionally forms a fused ring; and L represents a single bond, or a linking group derived from an aromatic hydrocarbon ring, an aromatic heterocyclic ring, or an alkyl group;

in the general formula (6), $X_1$ to $X_6$ each represent —N=, —NH—, or —$CR_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent; and A1 and A2 form a heteroaryl ring; and in the general formula (7), $X_7$ to $X_9$ each represent —N=, —NH—, or —$CR_1$—; $X_{10}$ to $X_{13}$ each represent —N= or —$CR_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent, and at least one of $X_{10}$ to $X_{13}$ represents —N=; and A3 and A4 form a heteroaryl ring.

Item 17. The resin composition according to Item 16, wherein the resin includes any of a polyimide resin, an acrylic resin, a cellulose ester resin, a polycarbonate resin, a cycloolefin resin, a phenol resin, an epoxy resin, a polyphenylene ether resin, a polyester resin, or a melamine resin.

Item 18. The resin composition according to Item 16 or Item 17, wherein at least one of A1 and A2 in the general formula (1) represents a pyridine ring, a pyrimidine ring, a pyrazine ring, a quinazoline ring, a quinoxaline ring, an azacarbazole ring, an azadibenzofuran ring, an azadibenzothiophene ring, an imidazole ring, a benzimidazole ring, a pyrazole ring, or a benzpyrazole ring.

Item 19. The resin composition according to any one of Item 16 to Item 18, wherein at least one of A1 and A2 in the general formula (1) has a structure represented by the following general formula (2):

[Formula 7]

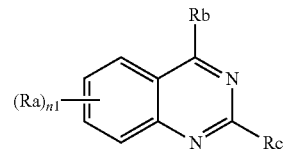

General formula (2)

wherein, in the general formula (2), Ra, Rb and Rc each independently represent a hydrogen atom or a substituent; and n1 represents an integer of 1 to 4; wherein a linking position with the linking group L in the general formula (1) is a substitutable position on the substituent represented by Ra, Rb and Rc, or a substitutable position other than a position at which Ra, Rb and Rc are each present as a substituent on a quinazoline ring.

Item 20. The resin composition according to any one of Item 16 to Item 18, wherein at least one of A1 and A2 in the general formula (1) has a structure represented by the following general formula (3):

[Formula 8]

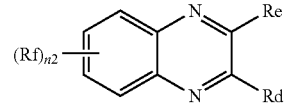

General formula (3)

wherein, in the general formula (3), Re, Rd and Rf each independently represent a hydrogen atom or a substituent; and n2 represents an integer of 1 to 4; wherein a linking position with the linking group L in the general formula (1) is a substitutable position on the substituent represented by Re, Rd and Rf, or a substitutable position other than a position at which Re, Rd and Rf are each present as a substituent on a quinazoline ring.

Item 21. The resin composition according to any one of Item 16 to Item 18, wherein the compound having the structure represented by the general formula (1) is a compound having a structure represented by the following general formula (4):

[Formula 9]

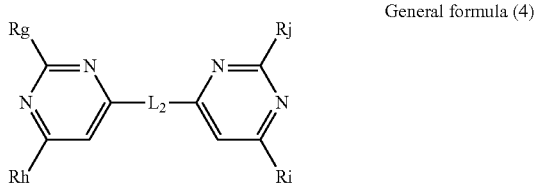

General formula (4)

wherein, in the general formula (4), Rg, Rh, Ri and Rj each independently represent a hydrogen atom or a substituent; at least one of Rg, Rh, Ri and Rj represents a 6-membered aromatic heterocyclic ring and the 6-membered aromatic heterocyclic ring optionally forms a fused ring; and L2 represents a single bond, or a linking group derived from an aromatic hydrocarbon ring, an aromatic heterocyclic ring or an alkyl group.

Item 22. The resin composition according to any one of Item 16 to Item 18, wherein the compound having the structure represented by the general formula (1) is a compound having a structure represented by the following general formula (5):

[Formula 10]

Ar—(Rk)$_{n3}$           General formula (5)

wherein, in the general formula (5), Ar represents a carbazole ring, a dibenzofuran ring, an azadibenzofuran ring, a dibenzothiophene ring, an azadibenzothiophene ring, an azacarbazole ring, a naphthalene ring, an anthracene ring, a phenanthrene ring, or a fluorene ring; Rk represents a hydrogen atom or a substituent; at least two Rk each represent a 6-membered aromatic heterocyclic ring and the 6-membered aromatic heterocyclic ring optionally forms a fused ring; and n3 represents 2 or more.

Item 23. The electronic device according to any one of Item 16 to Item 22, wherein the metallic conductive layer includes any of Ag, Cu, Al, Mo, W, or Ti, or includes an alloy of any of Ag, Cu, Al, Mo, W, or Ti.

Advantageous Effects of Invention

According to the above means of the present invention, there can be provided a resin composition which is excellent in adhesiveness to a metallic conductive layer, stability in high temperature storage, and light transmittance, and an electronic device using the resin composition.

The expression mechanisms or the action mechanisms of the effects of the present invention, although are not clear, are presumed as follows.

The compound having the structure represented by the general formula (1), the general formula (6) or the general formula (7) has an aromatic heterocyclic ring containing a nitrogen atom in its molecule, and thus interacts with a metal to thereby secure the metal. That is, metal diffusion can be suppressed.

A common nitrogen atom-containing aromatic heterocyclic ring compound is weak in interaction with a metal and is weak in effect of suppressing metal diffusion. The present inventors have made intensive studies, and as a result, such an effect is strongly exerted in the case of a compound (compound having the following structure A and structure B) which forms mainly the following two interactions.

Herein, M in the compound having the following structure A and structure B represents a metal. Two molecules interact with each other:

A: in a case where a nitrogen (N) atom is present at the ortho-position of a fused ring structure, and B: in a case where many nitrogen (N) atoms which freely rotate are present in such molecules.

[Formula 11]

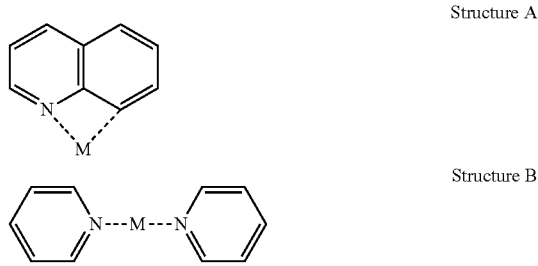

Structure A

Structure B

Accordingly, in a case where the compound having the structure A is a compound having any structure represented by the general formulae (2) and (3) and in a case where the compound having the structure B is a compound having any structure represented by the general formulae (4) and (5), metal diffusion can be certainly suppressed, and as a result, adhesiveness to a metallic conductive layer is favorable and stability in high temperature storage is excellent. Such a metallic conductive layer can be a thin film, and thus an excellent light transmittance may be achieved.

DESCRIPTION OF EMBODIMENTS

The resin composition of the present invention is a resin composition including a resin or a resin precursor, and a nitrogen-containing aromatic heterocyclic compound, wherein the nitrogen-containing aromatic heterocyclic compound has a structure represented by the following general formula (1), general formula (6) or general formula (7), and the resin composition includes the nitrogen-containing aromatic heterocyclic compound in a range from 0.10 to 30% by mass relative to the resin or the resin precursor.

Such characteristics are technical characteristics common to or corresponding to those of each embodiment described below.

In an aspect of the present invention, the resin preferably includes any of a polyimide resin, an acrylic resin, a cellulose ester resin, a polycarbonate resin, a cycloolefin resin, a phenol resin, an epoxy resin, a polyphenylene ether resin, a polyester resin, or a melamine resin from the viewpoints of mechanical characteristics and electric characteristics, and in particular, preferably includes any of a polyimide resin, an acrylic resin, or a melamine resin.

The compound having the structure represented by the general formula (1), the general formula (6) or the general formula (7) in a range from 1 to 10% by mass relative to the resin or the resin precursor is preferably included from the viewpoint of improvements in stability in high temperature storage and in production of a resin layer.

At least one of A1 and A2 in the general formula (1) preferably represents a pyridine ring, a pyrimidine ring, a pyrazine ring, a quinazoline ring, a quinoxaline ring, an azacarbazole ring, an azadibenzofuran ring, an azadibenzothiophene ring, an imidazole ring, a benzimidazole ring, a pyrazole ring, or a benzpyrazole ring from the viewpoints of an affinity force to a metallic conductive layer, and stability, and in particular, preferably represents a pyridine ring, a pyrimidine ring, a quinazoline ring, an azacarbazole ring, an azadibenzofuran ring, an azadibenzothiophene ring, or a benzimidazole ring.

The compound having the structure represented by the general formula (1) is preferably a compound having any structure represented by the general formulae (2) to (5) from the viewpoints of suppression of metal diffusion, adhesiveness to a metallic conductive layer, and stability in high temperature storage.

The electronic device of the present invention is an electronic device including a resin layer and a metallic conductive layer, wherein the resin layer includes the resin composition, and the resin layer and the metallic conductive layer are adjacent.

This can lead to an electronic device which is excellent in adhesiveness at the interface between the metallic conductive layer and the resin layer, stability in high temperature storage, and light transmittance.

The metallic conductive layer preferably includes any of Ag, Cu, Al, Mo, W, or Ti, or includes an alloy of any of Ag, Cu, Al, Mo, W, or Ti, from the viewpoint of interaction with an organic compound having a nitrogen atom having an unshared pair of electrons in the present invention.

The resin composition preferably includes two or more resin precursors from the viewpoint that respective resin characteristics can be simultaneously satisfied.

The resin layer preferably includes an inorganic particle from the viewpoint of an enhancement in physical strength or the like.

Furthermore, the resin layer is preferably a resin layer including a cured product obtained by curing with a light or heat polymerization initiator from the viewpoint of not only surface curability, but also pencil hardness, heat resistance, and the like.

Another electronic device of the present invention is an electronic device including a resin layer and a metallic conductive layer, wherein the electronic device includes an intermediate layer between the resin layer and the metallic conductive layer, the intermediate layer including the compound having the structure represented by the general formula (1), the general formula (6) or the general formula (7). This can also lead to an electronic device which is excellent in adhesiveness at the interface between the metallic conductive layer and the resin layer, stability in high temperature storage, and light transmittance.

Hereinafter, the present invention and components thereof, and modes and aspects for carrying out the present invention will be described. In the present application, "to" is used as meaning that numerical values described before and after "to" are included as the lower limit value and the upper limit value, respectively.

[Resin Composition]

The resin composition of the present invention is a resin composition including a resin or a resin precursor, and a nitrogen-containing aromatic heterocyclic compound, wherein the nitrogen-containing aromatic heterocyclic compound has a structure represented by the following general formula (1), general formula (6) or general formula (7), and the resin composition includes the nitrogen-containing aromatic heterocyclic compound in a range from 0.10 to 30% by mass relative to the resin or the resin precursor.

[Formula 12]

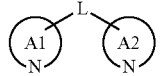

General formula (1)

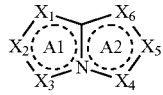

General formula (6)

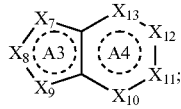

General formula (7)

In the general formula (1), A1 and A2 each represent a 6-membered nitrogen-containing aromatic heterocyclic ring together with a nitrogen atom, and the 6-membered nitrogen-containing aromatic heterocyclic ring optionally forms a fused ring; and L represents a single bond, or a linking group derived from an aromatic hydrocarbon ring, an aromatic heterocyclic ring, or an alkyl group.

In the general formula (6), $X_1$ to $X_6$ each represent —N=, —NH—, or —$CR_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent; and A1 and A2 form a heteroaryl ring.

In the general formula (7), $X_7$ to $X_9$ each represent —N=, —NH—, or —$CR_1$—; $X_{10}$ to $X_{13}$ each represent —N= or —$CR_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent, and at least one of $X_{10}$ to $X_{13}$ represents —N=; and A3 and A4 form a heteroaryl ring.

The resin composition of the present invention preferably includes the compound having the structure represented by the general formula (1), the general formula (6) or the general formula (7) in a range from 1 to 10% by mass relative to the resin or the resin precursor from the viewpoint of improvements in stability in high temperature storage and in production of a resin layer.

<Compound Having Structure Represented by General Formula (1)>

Examples of the 6-membered aromatic heterocyclic ring formed together with a nitrogen atom, represented by A1 and A2 in the general formula (1), include pyridine, pyrimidine, pyrazine, and triazine. Examples of the 6-membered nitrogen-containing aromatic heterocyclic ring forming a fused ring include quinazoline, quinoline, isoquinoline, azadibenzofuran, azacarbazole, azadibenzothiophene, a benzimidazole ring, a benzoquinoline ring, and a benzoisoquinoline ring.

Examples of the aromatic hydrocarbon ring for use in the linking group represented by L include a benzene ring (phenyl ring), a biphenyl ring, a terphenyl ring, a naphthalene ring, an anthracene ring, a phenanthrene ring, and a fluorene ring, examples of the aromatic heterocyclic ring for use in the linking group represented by L include a carbazole ring, a dibenzofuran ring, an azadibenzofuran ring, a dibenzothiophene ring, an azadibenzothiophene ring, and an azacarbazole ring, and examples of the alkyl group for use in the linking group represented by L include a methyl group, an ethyl group, an isopropyl group, a propyl group, a butyl group, a t-butyl group, and a hexyl group.

At least one of A1 and A2 in the general formula (1) preferably has a structure represented by the following general formula (2) or (3). The compound having the structure represented by the general formula (1) is preferably a compound having a structure represented by the following general formula (4) or (5).

<Structure Represented by General Formula (2)>

[Formula 13]

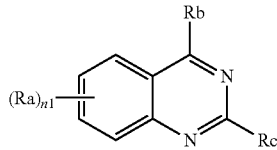

General formula (2)

In the general formula (2), Ra, Rb and Rc each independently represent a hydrogen atom or a substituent; and n1 represents an integer of 1 to 4. Herein, a linking position with the linking group L in the general formula (1) is a substitutable position on the substituent represented by Ra, Rb and Rc, or a substitutable position other than a position at which Ra, Rb and Rc are each present as a substituent on a quinazoline ring.

Examples of the substituent represented by Ra, Rb and Rc in the general formula (2) include an aromatic hydrocarbon ring, an aromatic heterocyclic ring, alkyl, cyano, and a halogen atom. Examples of the 6-membered aromatic heterocyclic ring represented by at least one of Ra, Rb and Rc include the same as those exemplified with respect to A1 and A2 in the general formula (1).

<Structure Represented by General Formula (3)>

[Formula 14]

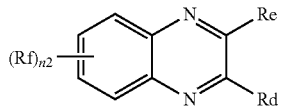

General formula (3)

In the general formula (3), Re, Rd and Rf each independently represent a hydrogen atom or a substituent; and n2 represents an integer of 1 to 4; wherein a linking position with the linking group L in the general formula (1) is a substitutable position on the substituent represented by Re, Rd and Rf, or a substitutable position other than a position at which Re, Rd and Rf are each present as a substituent on a quinazoline ring.

The substituent represented by Re, Rd and Rf in the general formula (3) is the same as the substituent represented by Ra, Rb and Rc in the general formula (2). Examples of the 6-membered aromatic heterocyclic ring represented by at least one of Re, Rd and Rf include the same as those exemplified with respect to A1 and A2 in the general formula (1).

<Compound Having Structure Represented by General Formula (4)>

[Formula 15]

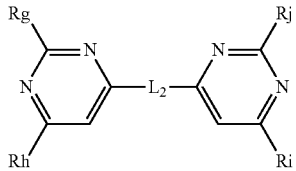

General formula (4)

In the general formula (4), Rg, Rh, Ri and Rj each independently represent a hydrogen atom or a substituent; at least one of Rg, Rh, Ri and Rj represents a 6-membered aromatic heterocyclic ring and the 6-membered aromatic heterocyclic ring optionally forms a fused ring; and L2 represents a single bond, or a linking group derived from an aromatic hydrocarbon ring, an aromatic heterocyclic ring or an alkyl group.

The substituent represented by Rg, Rh, Ri and Rj in the general formula (4) is the same as in the substituent represented by Ra, Rb and Rc in the general formula (2). Examples of the 6-membered aromatic heterocyclic ring represented by at least one of Rg, Rh, Ri and Rj include the same as those exemplified with respect to A1 and A2 in the general formula (1).

Respective examples of the aromatic hydrocarbon ring, the aromatic heterocyclic ring, and the alkyl group represented by L₂ include the same as those exemplified with respect to L in the general formula (1).

<Compound Having Structure Represented by General Formula (5)>

[Formula 16]

Ar—(Rk)$_{n3}$    General formula (5)

In the general formula (5), Ar represents a carbazole ring, a dibenzofuran ring, an azadibenzofuran ring, a dibenzothiophene ring, an azadibenzothiophene ring, an azacarbazole ring, a naphthalene ring, an anthracene ring, a phenanthrene ring, or a fluorene ring; Rk represents a hydrogen atom or a substituent; at least two Rk each represent a 6-membered aromatic heterocyclic ring and the 6-membered aromatic heterocyclic ring is optionally fused; and n3 represents 2 or more.

The substituent represented by Rk in the general formula (5) is the same as in the substituent represented by Ra, Rb and Rc in the general formula (2). Examples of the 6-membered aromatic heterocyclic ring represented by Rk include the same as those exemplified with respect to A1 and A2 in the general formula (1).

Examples of exemplary compounds of the compound having the structure represented by the general formula (1) include the following, but are not limited thereto in the present invention.

[Formula 17]
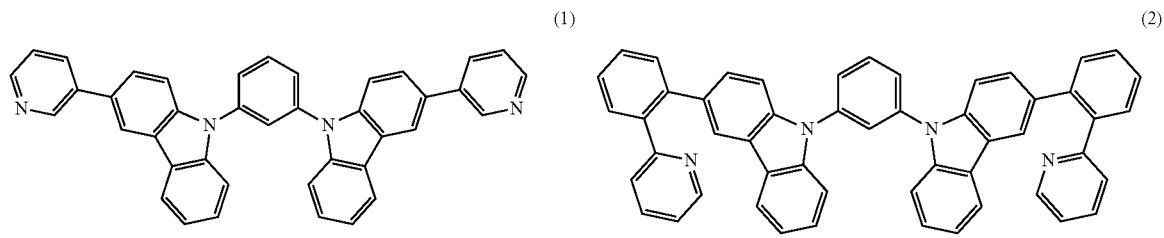
(1) (2)
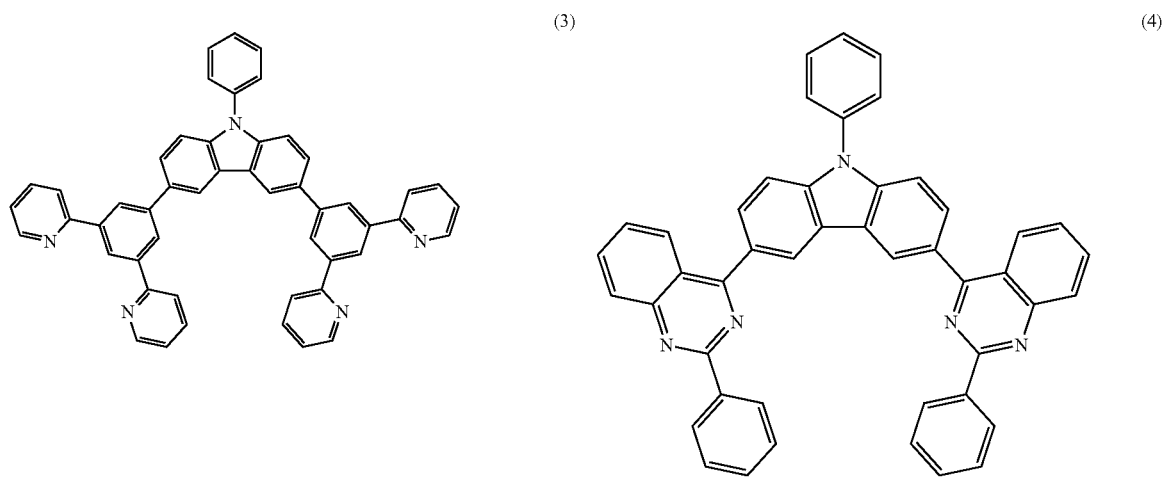
(3) (4)
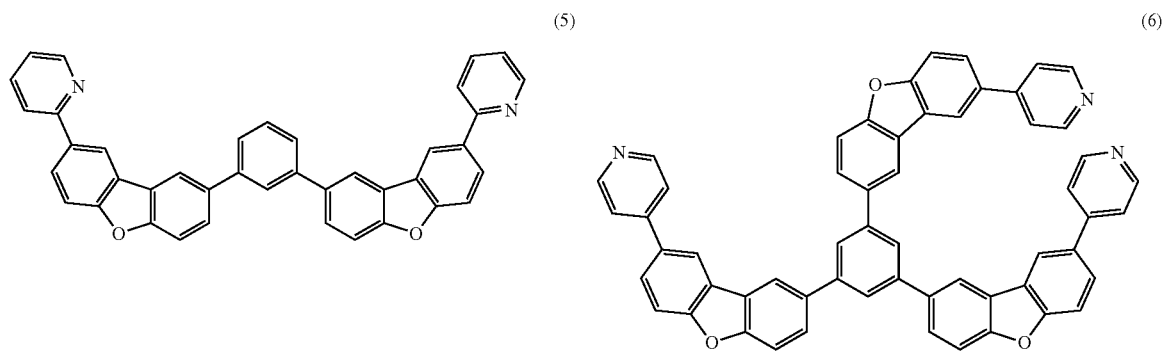
(5) (6)
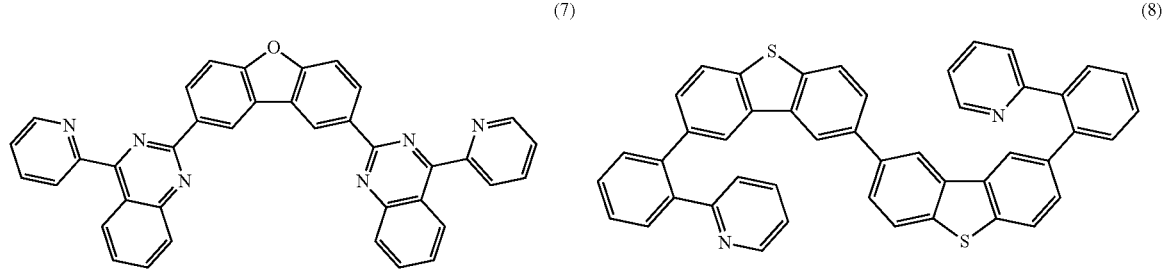
(7) (8)

-continued
[Formula 18]
(9)
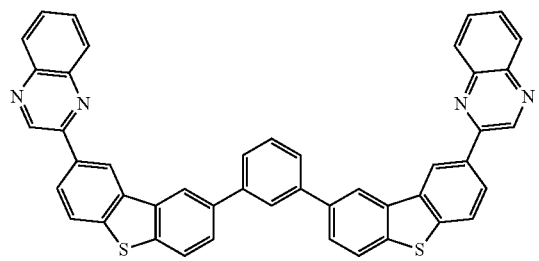
(10)
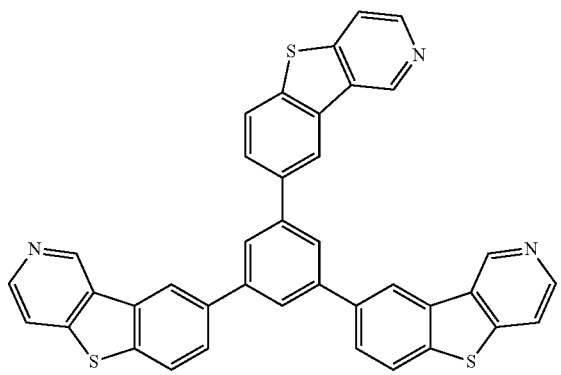
(11)
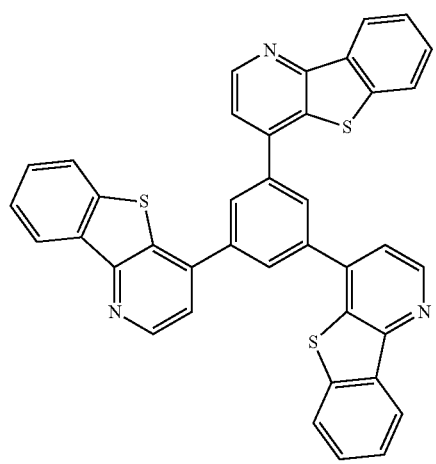
(12)
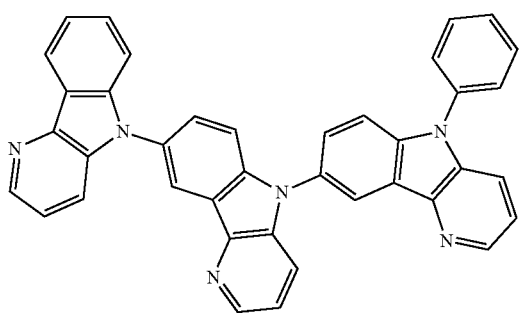
(13)
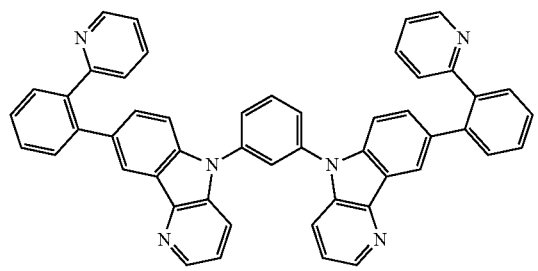
(14)
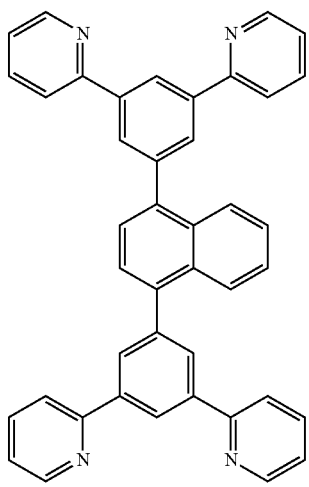

-continued
(15)
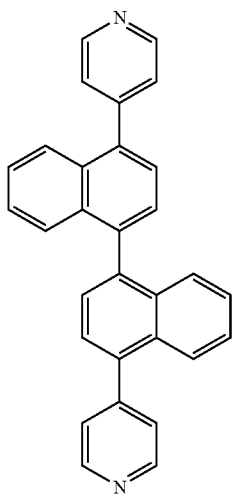
(16)
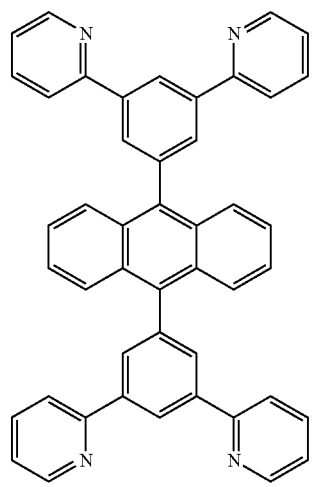
[Formula 19]
(17)
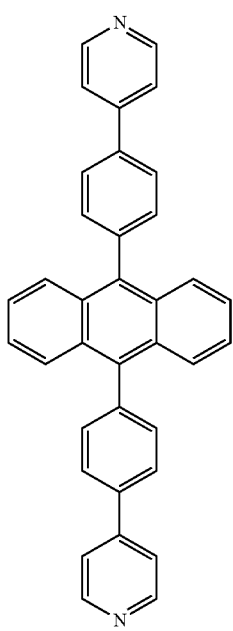
(18)
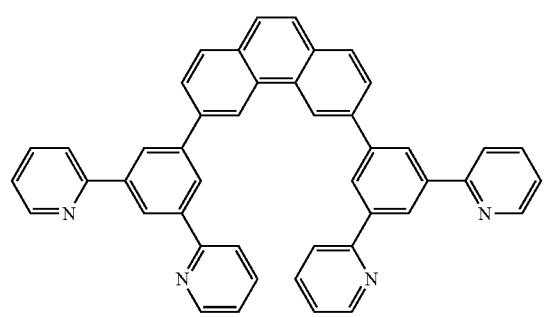
(19)
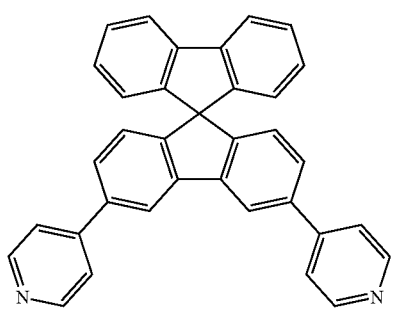
(20)
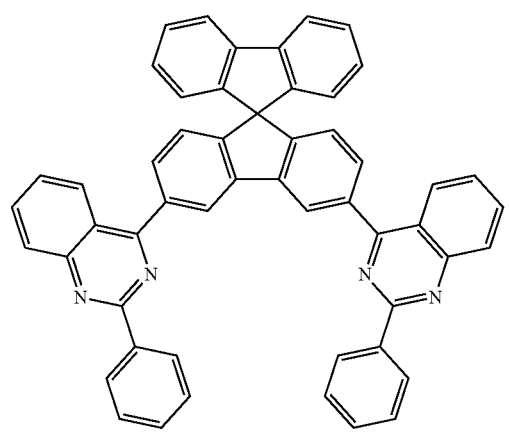

-continued
(21)
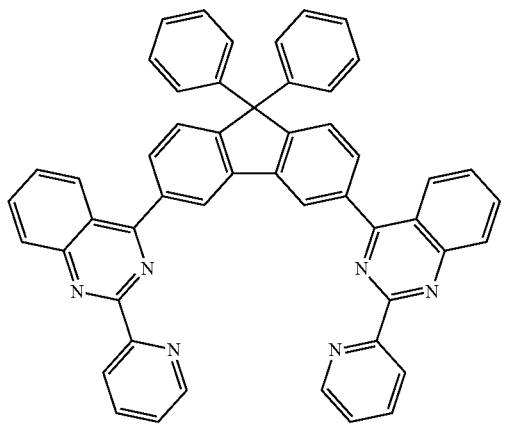
(22)
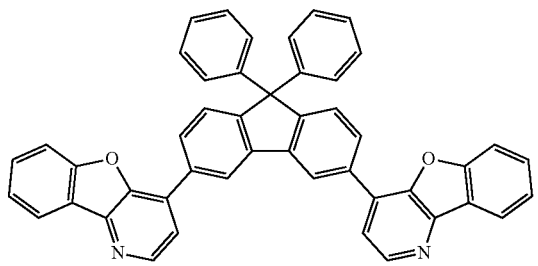
(23)
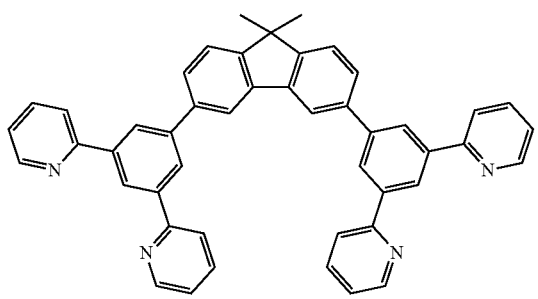
(24)
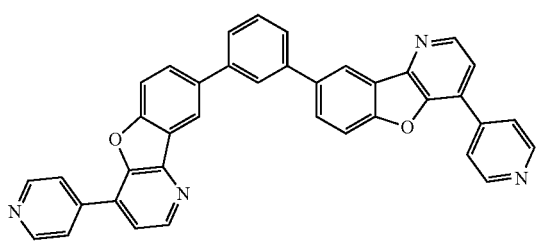
(25)
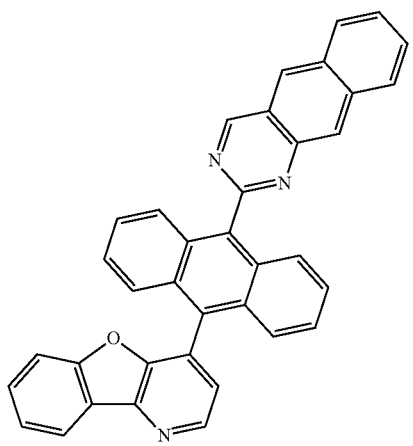

[Formula 20]
(26) 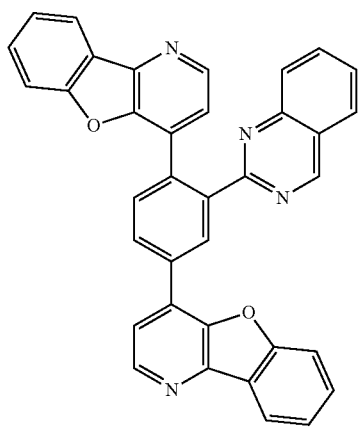
(27) 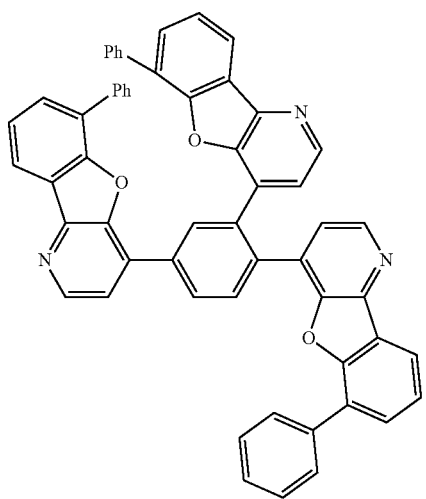
(28) 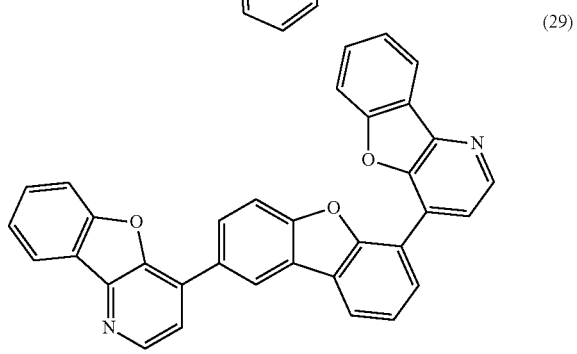
(29) 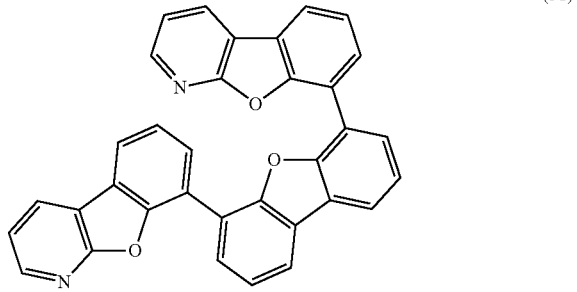
(30) 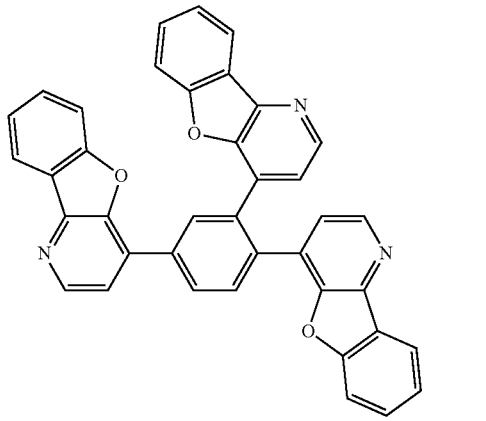
(31) 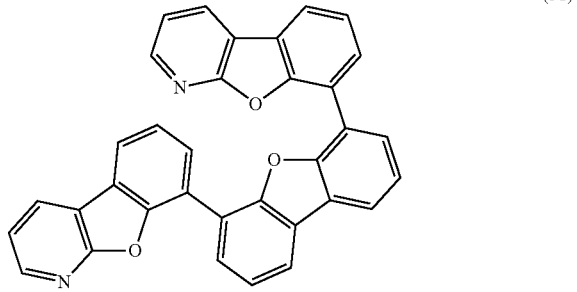
(32) 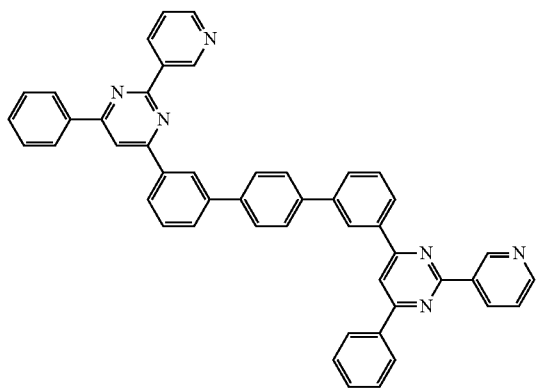
(33) 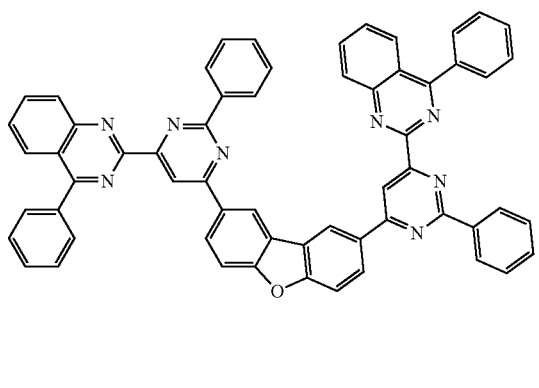

-continued
[Formula 21]
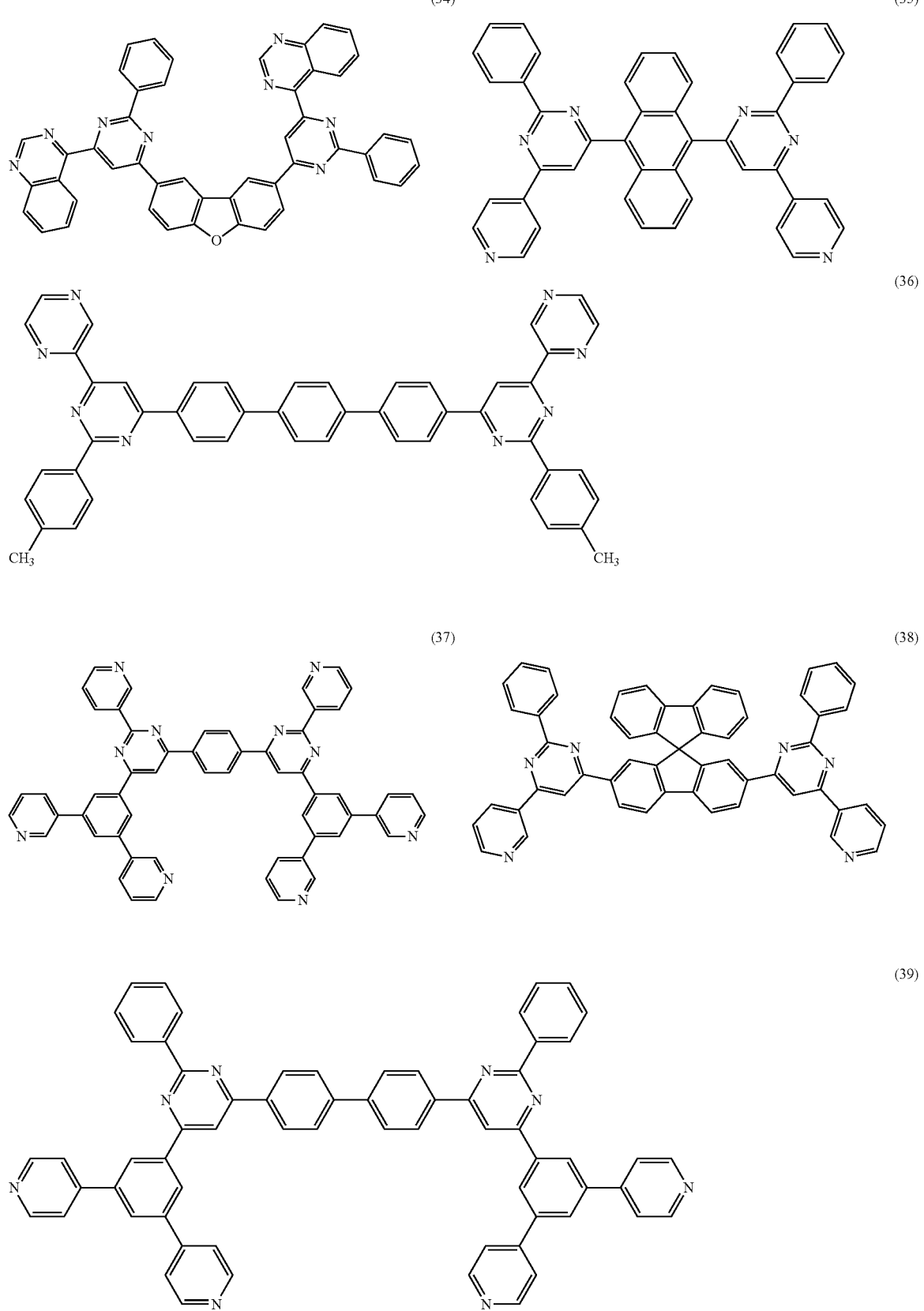

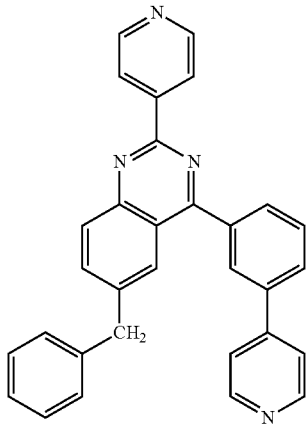
[Formula 22]
(40)
(41)
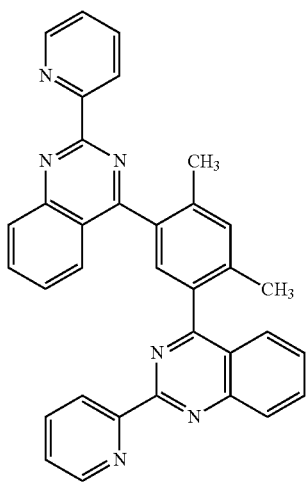
(42)
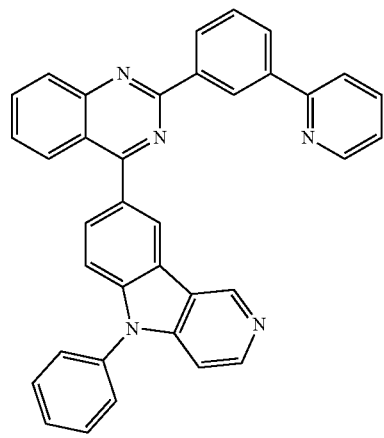
(43)
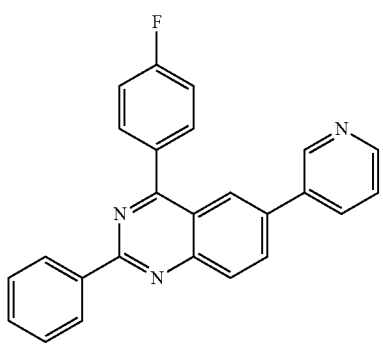
(44)
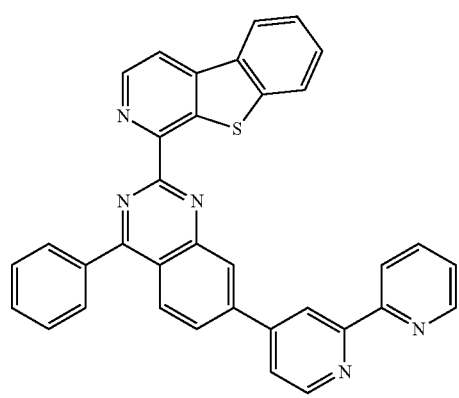

-continued
(45) 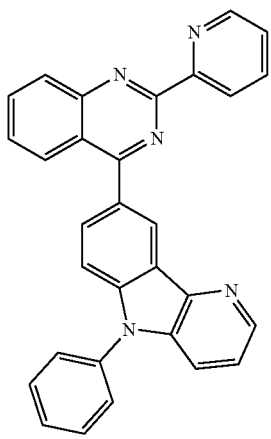
(46) 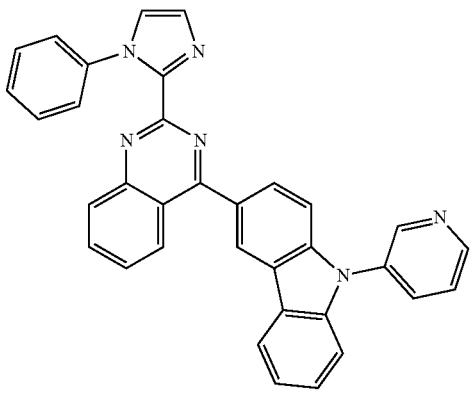
(47) 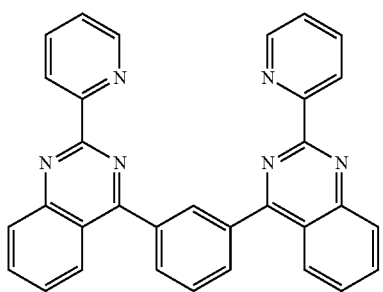
(48) 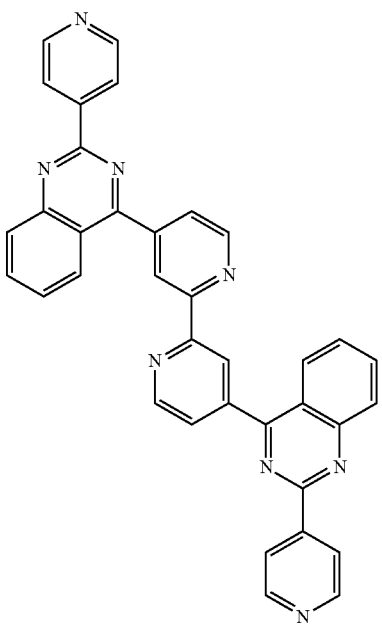
(49) 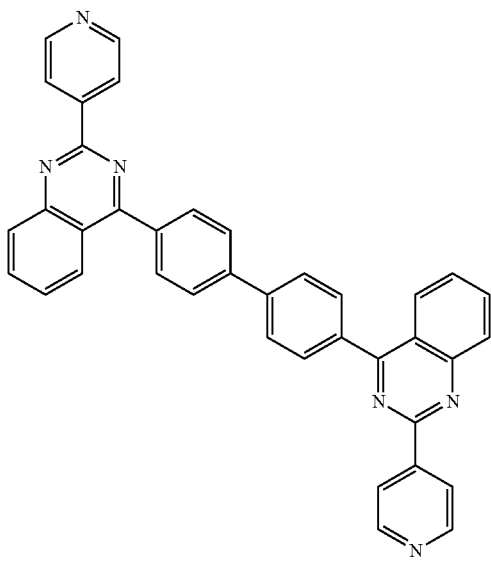
(50) 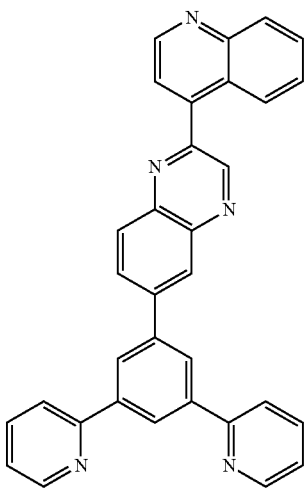

(51)
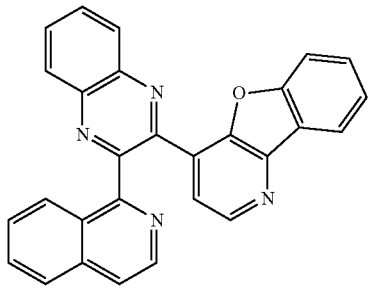
[Formula 23]
(52) (53)
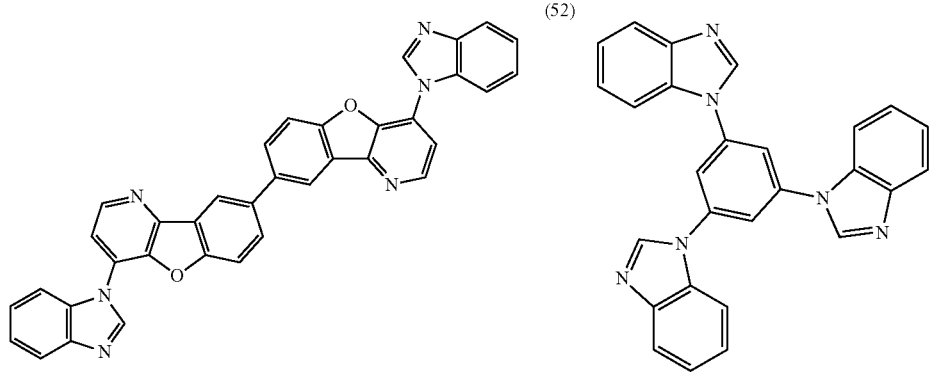
(54) (55)
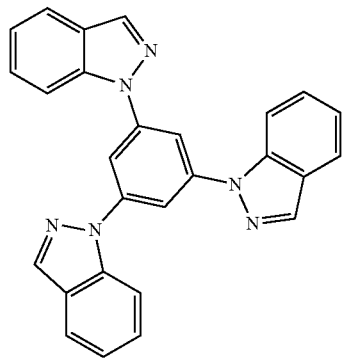
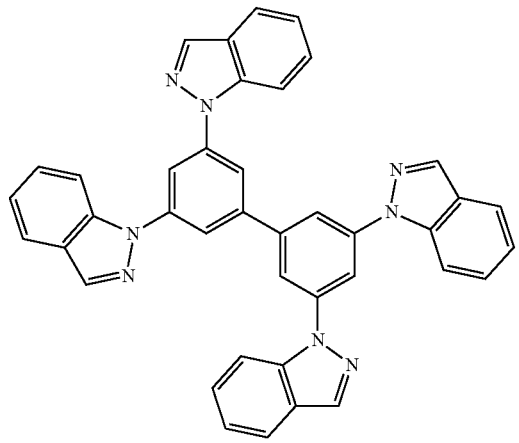

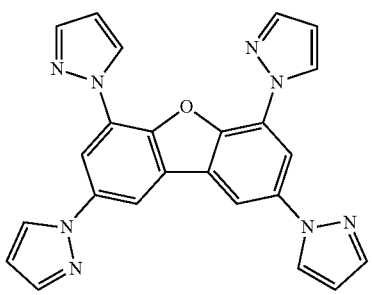
(56)

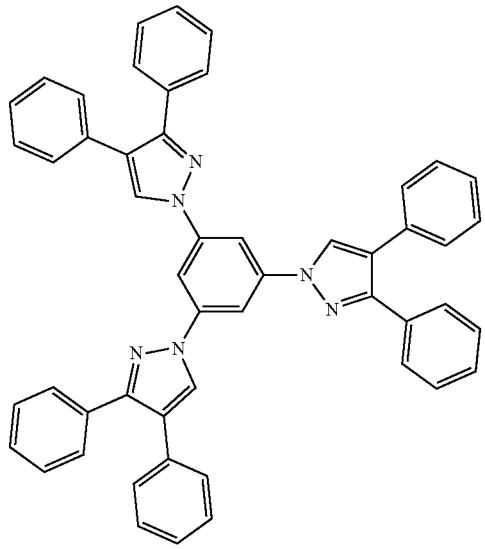
(57)

<Compound Having Structure Represented by General Formula (6)>

In the general formula (6), $X_1$ to $X_6$ represents —N=, —NH—, or —CR$_1$—.

$R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent.

A1 and A2 form a heteroaryl ring.

—CR$_1$— preferably has an aryl group or a heteroaryl group. Further preferably, such an aryl group and a heteroaryl group are each preferably substituted with an alkyl group, an alkoxy group, or a carbonyl group.

Examples of exemplary compounds of the compound having the structure represented by the general formula (6) include the following, but are not limited thereto in the present invention.

[Formula 24]

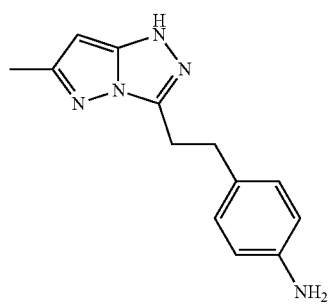
(6-1)

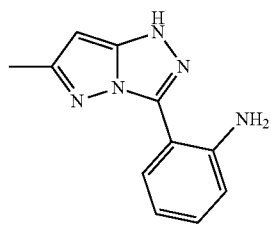
(6-2)

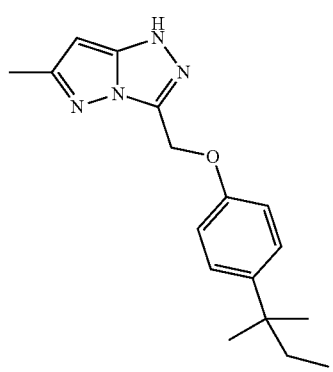
(6-3)

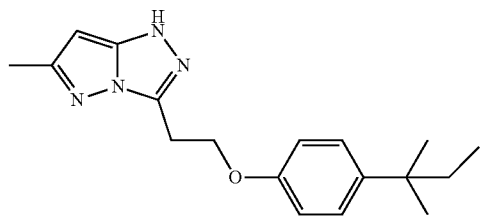
(6-4)

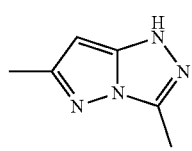
(6-5)

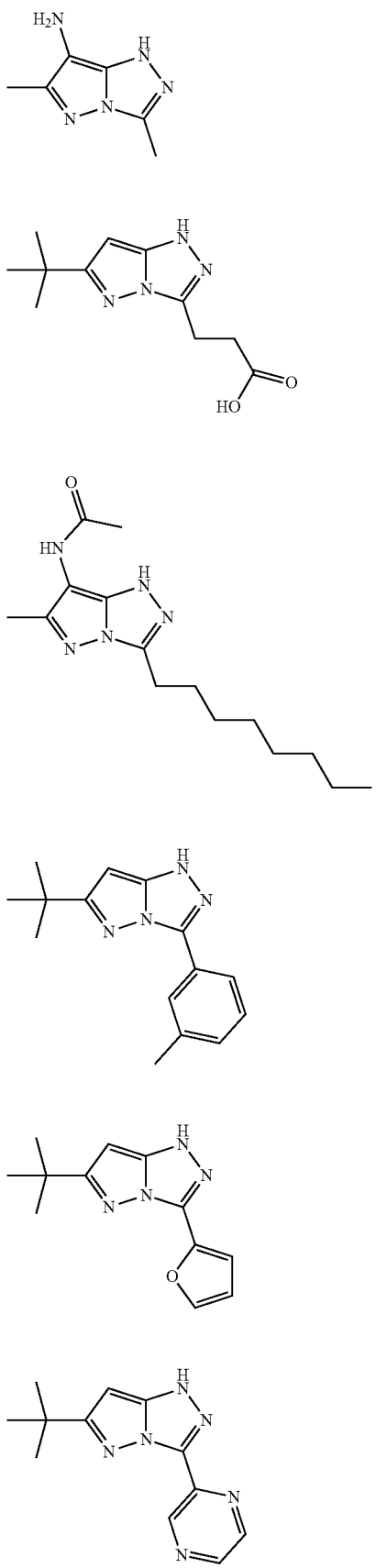
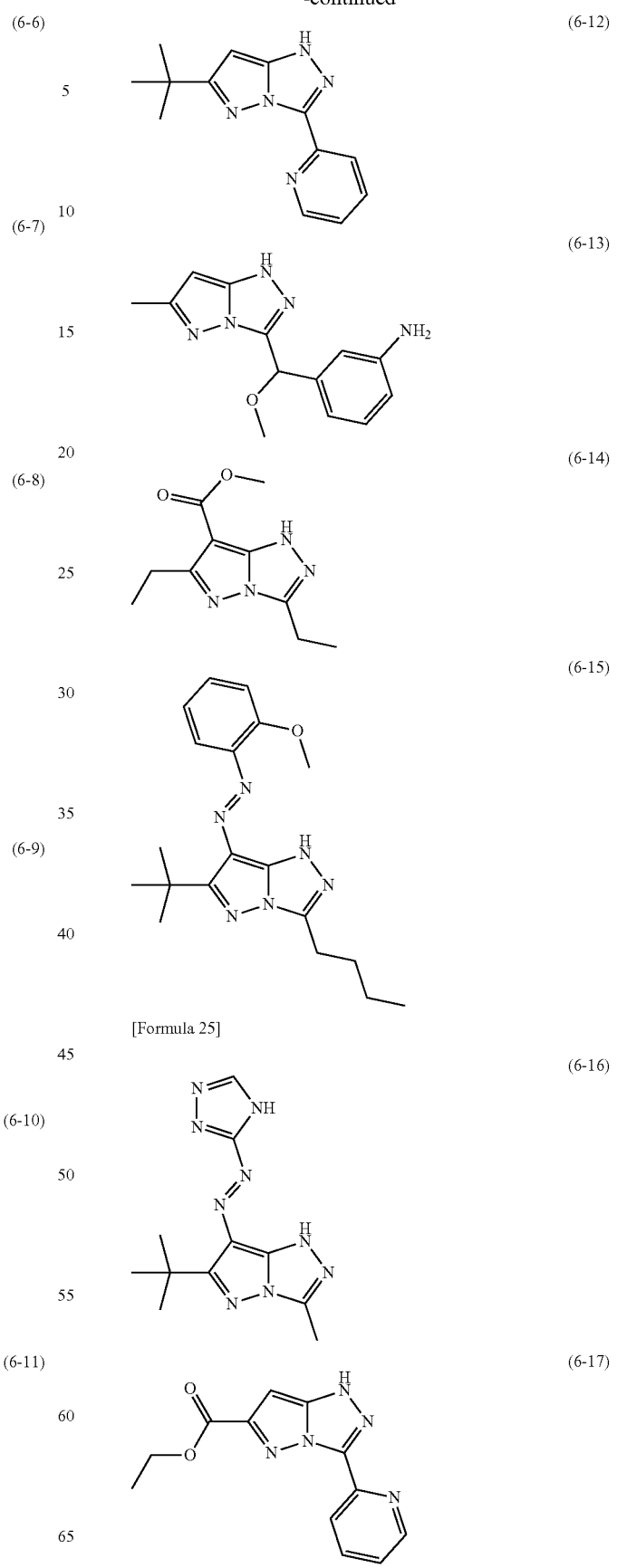

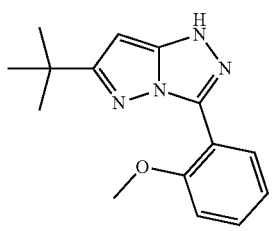
(6-18)
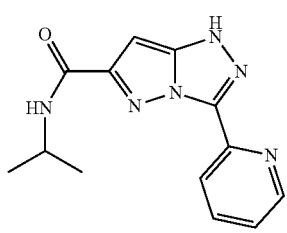
(6-19)
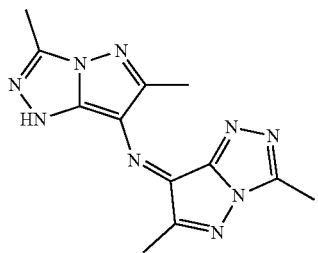
(6-20)
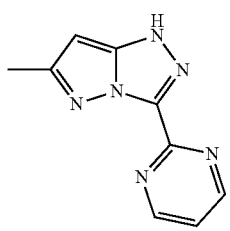
(6-21)
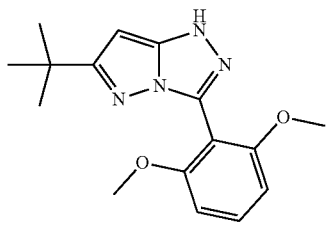
(6-22)
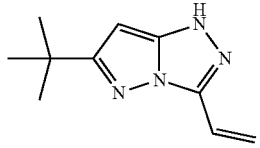
(6-23)
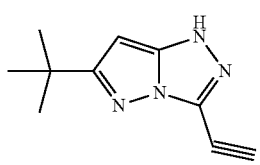
(6-24)
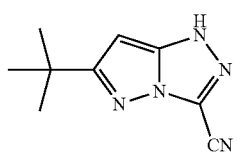
(6-25)
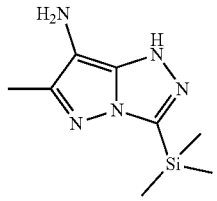
(6-26)
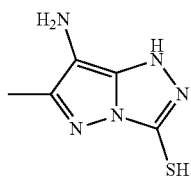
(6-27)
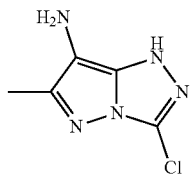
(6-28)
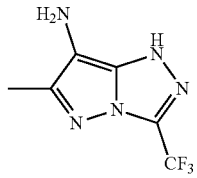
(6-29)
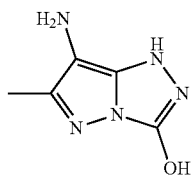
(6-30)
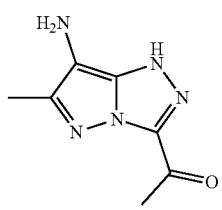
(6-31)
[Formula 26]
(6-32)

(6-33) (6-34) (6-35) (6-36) (6-37) (6-38) (6-39) (6-40)

(6-41) (6-42) (6-43) (6-44) (6-45) (6-46) (6-47)

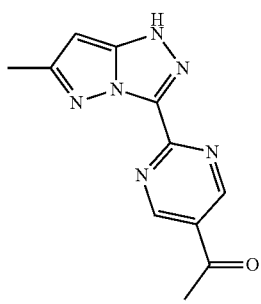
(6-48)

<Compound Having Structure Represented by General Formula (7)>

In the general formula (7), $X_7$ to $X_9$ each represent —N=, —NH—, or —CR$_1$—; $X_{10}$ to $X_{13}$ each represent —N= or —CR$_1$—; $R_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent, and at least one of $X_{10}$ to $X_{13}$ represents —N=; and A3 and A4 form a heteroaryl ring.

—CR$_1$— preferably has an aryl group or a heteroaryl group. Further preferably, such an aryl group and a heteroaryl group are each preferably substituted with an alkyl group, an alkoxy group, or a carbonyl group.

Examples of exemplary compounds of the compound having the structure represented by the general formula (7) include the following, but are not limited thereto in the present invention.

[Formula 27]

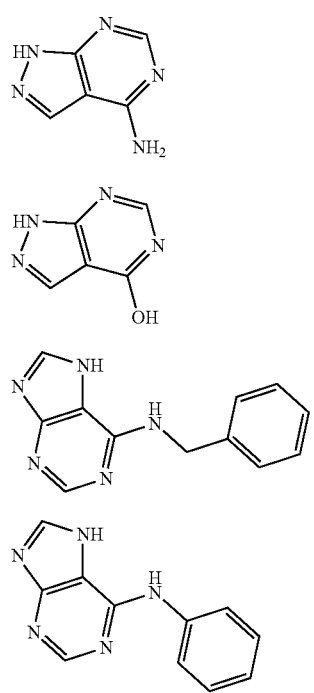

(7-1)

(7-2)

(7-3)

(7-4)

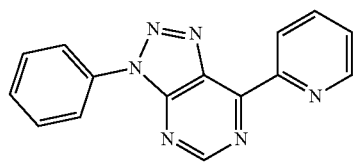
(7-5)

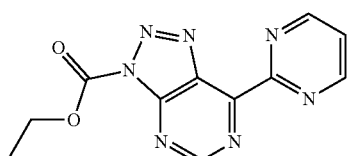
(7-6)

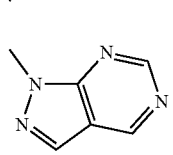
(7-7)

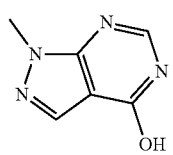
(7-8)

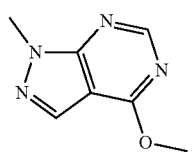
(7-9)

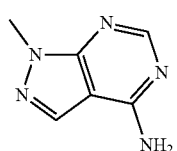
(7-10)

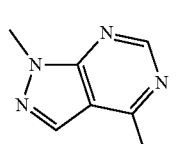
(7-11)

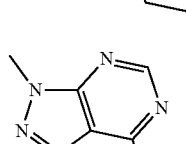
(7-12)

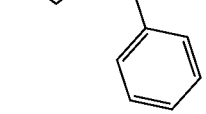
(7-13)

(7-14) 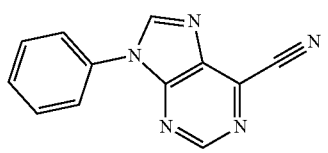
(7-15) 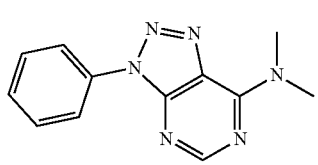
(7-16) 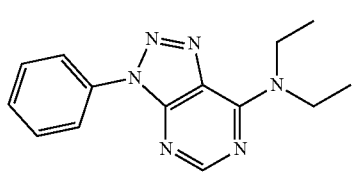
(7-17) 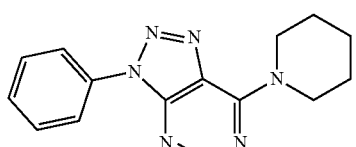
(7-18) 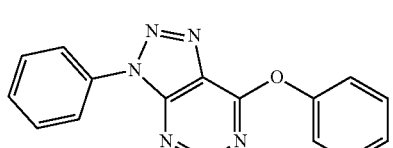
(7-19) 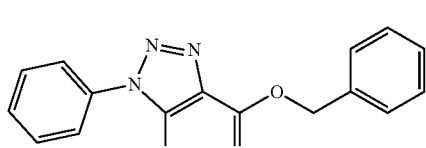
(7-20) 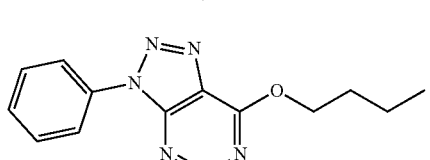
[Formula 28]
(7-22) 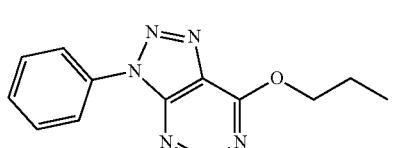
(7-23) 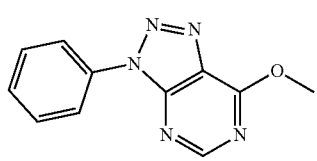
(7-24)
(7-25)
(7-26)
(7-27)
(7-28)
(7-29)
(7-30)
(7-31) 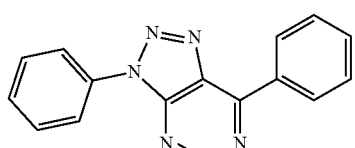

(7-32)
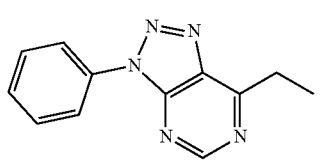
(7-33)
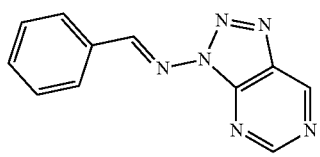
(7-34)
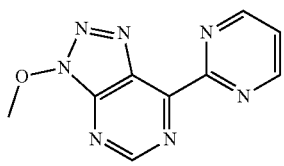
(7-35)
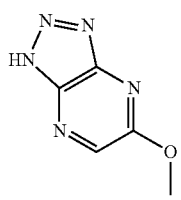
(7-36)
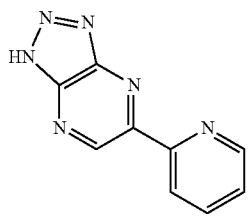
(7-37)
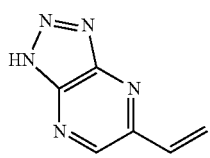
(7-38)
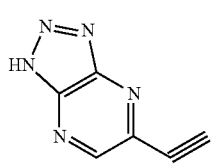
(7-39)
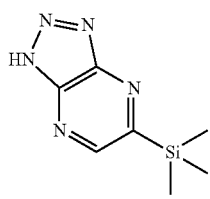
[Formula 29]
(7-40)
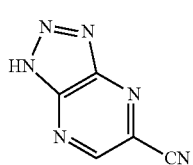
(7-41)
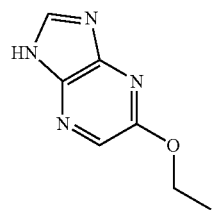
(7-42)
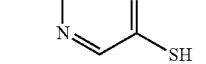
(7-43)
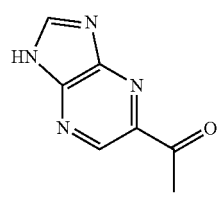
(7-44)
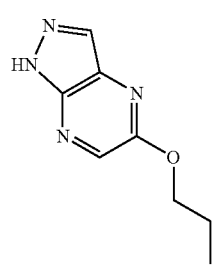
(7-45)
(7-46)
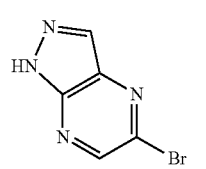
(7-47)
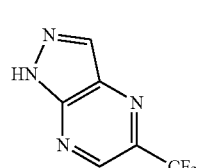
(7-48)
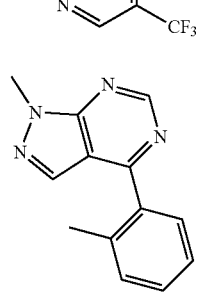

(7-49)

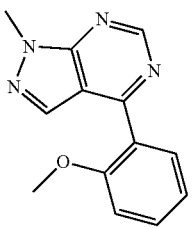

(7-50)

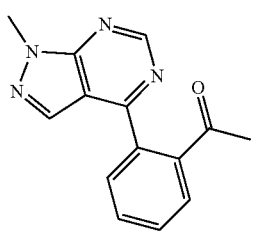

<Resin or Resin Precursor>

The resin preferably includes any of a polyimide resin, an acrylic resin, a cellulose ester resin, a polycarbonate resin, a cycloolefin resin, a phenol resin, an epoxy resin, a polyphenylene ether resin, a polyester resin, or a melamine resin from the viewpoints of mechanical characteristics, such as heat resistance and dimension stability, and electric characteristics, such as insulating properties.

Examples of the cellulose ester resin include triacetylcellulose (abbreviated name: TAC), diacetylcellulose, and acetylpropionylcellulose.

Examples of the polycarbonate resin include Panlite and Multilon (which are manufactured by Teijin Limited).

Examples of the cycloolefin resin include Zeonor (manufactured by Zeon Corporation), Arton (manufactured by JSR Corporation), and Apel (manufactured by Mitsui Chemicals Inc.).

Examples of the acrylic resin include polymethyl methacrylate, Acrylite (manufactured by Mitsubishi Rayon Co., Ltd.), and Sumipex (manufactured by Sumitomo Chemical Co., Ltd.).

Examples of the polyester resin include polyethylene terephthalate (abbreviated name: PET) and polyethylene naphthalate (abbreviated name: PEN).

Among the above resins, any of the polyimide resin, the acrylic resin, the epoxy resin, or the melamine resin among is more preferably included, the polyimide resin is preferably included particularly in a case where the resin layer is a resin film, and the acrylic resin or the epoxy resin is preferably included in a case where the resin layer is a resist.

The polyimide resin which can be used is one having a structure represented by the following general formula:

[Formula 30]

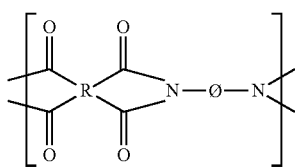

in the general formula, R represents an aromatic hydrocarbon ring or an aromatic heterocyclic ring, or a tetravalent aliphatic hydrocarbon group or alicyclic hydrocarbon group having 4 to 39 carbon atoms; and Φ represents a divalent aliphatic hydrocarbon group, alicyclic hydrocarbon group or aromatic hydrocarbon group having 2 to 39 carbon atoms, or a group of a combination thereof, in which such groups each optionally contain at least one group selected from the group consisting of —O—, —SO$_2$—, —CO—, —CH$_2$—, —C(CH$_3$)$_2$—, —OSi(CH$_3$)$_2$—, —C$_2$H$_4$O— and —S—, as a bonding group.

Examples of the aromatic hydrocarbon ring represented by R include a fluorene ring, a benzene ring, a biphenyl ring, a naphthalene ring, an azulene ring, an anthracene ring, phenanthrene ring, a pyrene ring, a crycene ring, a naphthacene ring, a triphenylene ring, an o-terphenyl ring, a m-terphenyl ring, a p-terphenyl ring, an acenaphthene ring, a coronene ring, a fluoranthrene ring, a naphthacene ring, a pentacene ring, a perylene ring, a pentaphene ring, a picene ring, a pyrene ring, a pyranthrene ring, and an anthranthrene ring.

Examples of the aromatic heterocyclic ring represented by R include a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzthiazole ring, a benzoxazole ring, a quinoxaline ring, a quinazoline ring, a phthalazine ring, a thienothiophene ring, a carbazole ring, an azacarbazole ring (which represents one where any one or more carbon atoms constituting a carbazole ring are each replaced with a nitrogen atom), a dibenzosilole ring, a dibenzofuran ring, a dibenzothiophene ring, a ring where any one or more carbon atoms constituting a benzothiophene ring or a dibenzofuran ring are each replaced with a nitrogen atom, a benzodifuran ring, a benzodithiophene ring, an acridine ring, a benzoquinoline ring, a phenazine ring, a phenanthridine ring, a phenanthroline ring, a cycladine ring, a quindoline ring, a tepenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, a dibenzocarbazole ring, an indolocarbazole ring, and a dithienobenzene ring.

Examples of the tetravalent aliphatic hydrocarbon group having 4 to 39 carbon atoms, represented by R, include groups such as a butane-1,1,4,4-triyl group, an octane-1,1,8,8-triyl group, and a decane-1,1,10,10-triyl group.

Examples of the tetravalent alicyclic hydrocarbon group having 4 to 39 carbon atoms, represented by R, include groups such as a cyclobutane-1,2,3,4-tetrayl group, a cyclopentane-1,2,4,5-tetrayl group, a cyclohexane-1,2,4,5-tetrayl group, a bicyclo[2.2.2]oct-7-ene-2,3,5,6-tetrayl group, a bicyclo[2.2.2]octane-2,3,5,6-tetrayl group, a 3,3',4,4'-dicyclohexyltetrayl group, a 3,6-dimethylcyclohexane-1,2,4,5-tetrayl group, and a 3,6-diphenylcyclohexane-1,2,4,5-tetrayl group.

Examples of the divalent aliphatic hydrocarbon group having or not having the bonding group and having 2 to 39 carbon atoms, represented by D, include any group represented by the following structural formulae.

[Formula 31]

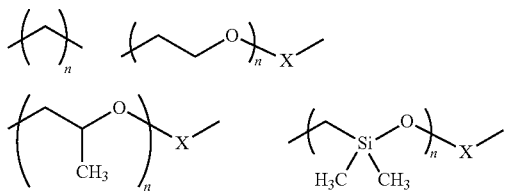

Examples of the divalent alicyclic hydrocarbon group having or not having the bonding group and having 2 to 39 carbon atoms, represented by D, include any group represented by the following structural formulae.

[Formula 32]

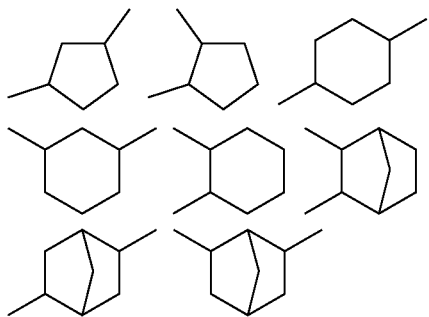

Examples of the divalent aromatic hydrocarbon group having or not having the bonding group and having 2 to 39 carbon atoms, represented by D, include any group represented by the following structural formulae.

[Formula 33]

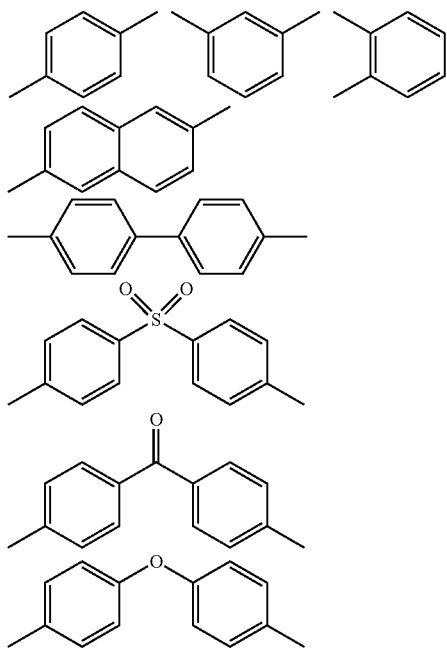

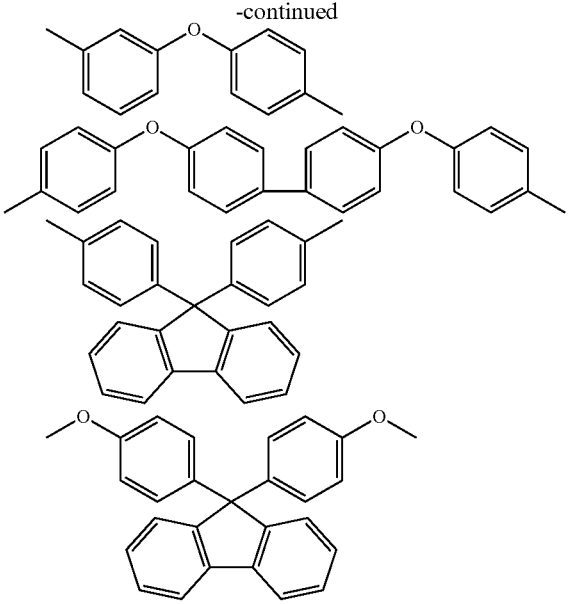

Examples of the group of a combination of the aliphatic hydrocarbon group, the alicyclic hydrocarbon group, and the aromatic hydrocarbon group, represented by D, include any group represented by the following structural formulae.

[Formula 34]

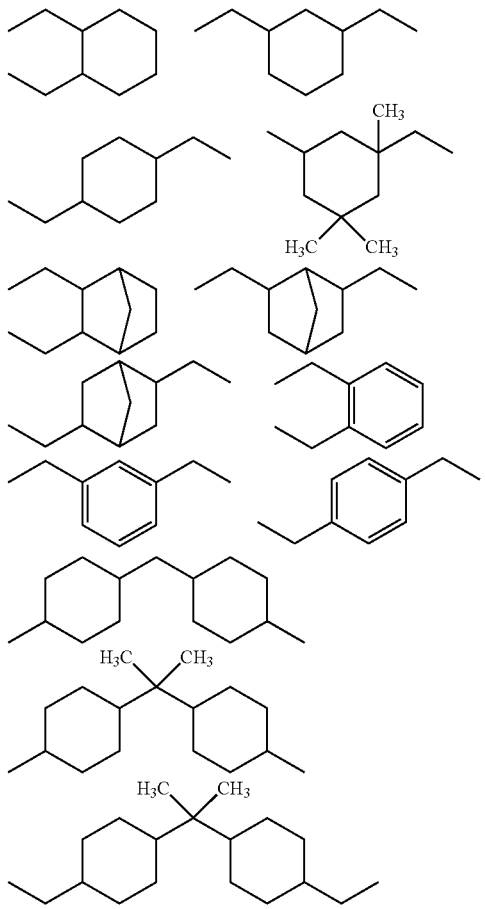

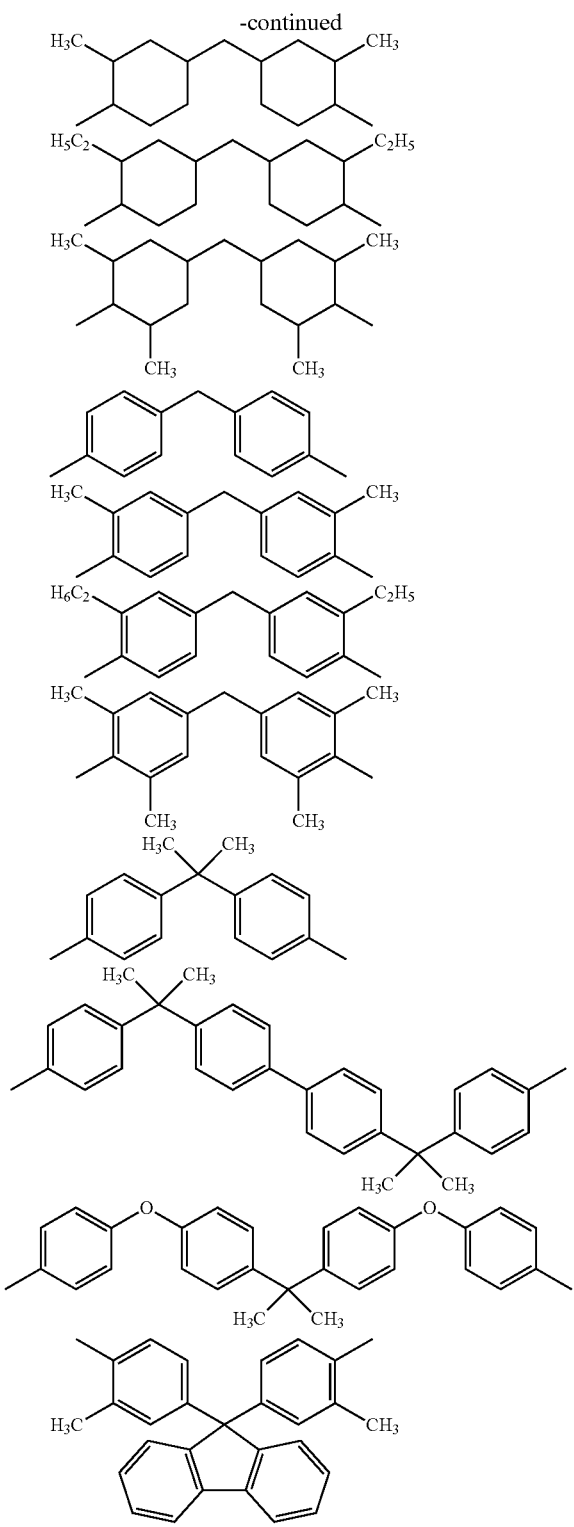

The resin is preferably included in a resin film or resist described below and thus used, and the resin film may be a film produced according to melt casting film formation or may be a film produced according to solution casting film formation.

A resin precursor (varnish or the like) may be used instead of the resin, and in such a case, the resin precursor (varnish or the like) can be mixed with the compound having the structure represented by the general formula (1) and then the resultant can be cured by heat, light and/or the like and then used. The resin precursor in the present invention is a component (monomer, oligomer, or the like) constituting the resin.

In a case where the resin is included in a resist and thus used, the resin preferably has a photoreactive functional group and a thermosetting functional group in its molecule.

Examples of the photoreactive functional group include any monomer of a (meth)acryloyl group, and examples of the thermosetting functional group include each any monomer of a hydroxy group, a carboxy group, an isocyanate group, an imino group, an epoxy group, an oxetanyl group, a mercapto group, a methoxymethyl group, a methoxyethyl group, an ethoxymethyl group, an ethoxyethyl group, and an oxazoline group.

Specific examples of a monomer having one (meth)acryloyl group in its molecule can include methyl (meth)acrylate, ethyl (meth)acrylate, butyl (meth)acrylate, isoamyl acrylate, isobutyl (meth)acrylate, lauryl (meth)acrylate, stearyl (meth)acrylate, octyl acrylate, decyl acrylate, isomyristyl acrylate, isostearyl acrylate, 2-ethylhexyl-diglycol acrylate, 2-hydroxybutyl acrylate, 2-acryloyloxyethylhexahydrophthalic acid, butoxyethyl acrylate, ethoxy diethylene glycol acrylate, methoxy diethylene glycol acrylate, methoxy polyethylene glycol acrylate, methoxy propylene glycol acrylate, phenoxyethyl acrylate, tetrahydrofurfuryl acrylate, isobornyl acrylate, 2-hydroxyethyl (meth)acrylate, hydroxypropyl (meth)acrylate, hydroxybutyl (meth)acrylate, 2-hydroxy-3-phenoxypropyl acrylate, 2-acryloyloxyethylsuccinic acid, 2-acryloyloxyethylphthalic acid, 2-acryloyloxyethyl-2-hydroxyethyl-phthalic acid, glycidyl methacrylate, lactone-modified flexible acrylate, t-butylcyclohexyl acrylate, and acryloyl morpholine.

Specific examples of a polyfunctional monomer having two (meth)acryloyl groups in its molecule can include diethylene glycol diacrylate, triethylene glycol diacrylate, tetraethylene glycol diacrylate, tripropylene glycol diacrylate, polypropylene glycol diacrylate, 1,4-butanediol diacrylate, 1,6-hexanediol diacrylate, 1,9-nonanediol diacrylate, neopentyl glycol diacrylate, dimethylol-tricyclodecane diacrylate, a polyurethane diacrylate compound, PO adduct diacrylate of bisphenol A, hydroxypivalic acid neopentyl glycol diacrylate, and polytetramethylene glycol diacrylate.

Examples of the polyfunctional include polyfunctional acrylates or methacrylate monomers corresponding thereto, typified by pentaerythritol triacrylate, trimethylolpropane triacrylate, trimethylolmethane triacrylate, ethylene oxide-modified trimethylolpropane triacrylate, ethylene oxide-modified pentaerythritol tetraacrylate, propylene oxide-modified trimethylolpropane triacrylate, epichlorohydrin-modified trimethylolpropane triacrylate, pentaerythritol tetraacrylate, pentaerythritol tetramethacrylate, pentaerythritolethoxy tetraacrylate, tetramethylolmethane tetraacrylate, ethylene oxide-modified phosphoric acid triacrylate, epichlorohydrin-modified glycerol triacrylate, dipentaerythritol hexaacrylate, dipentaerythritol monohydroxy pentaacrylate, ditrimethylolpropane tetraacrylate, glycerin propoxy triacrylate, caprolactone-modified trimethylolpropane triacrylate, caprolactam-modified dipentaerythritol hexaacrylate, bisphenol fluorene dihydroxy acrylate, bisphenol fluorene dimethacrylate, or any silsesquioxane-modified product thereof.

Specific examples of one having a hydroxy group as a thermosetting functional group include 2-hydroxyethyl (meth)acrylate, 2-hydroxypropyl (meth)acrylate, 4-hydroxybutyl (meth)acrylate, pentaerythritol tri(meth)acrylate, dipentaerythritol monohydroxy penta(meth)acrylate, and 2-hydroxypropyl (meth)acrylate, and examples of a commercially available product thereof include Light Ester HO, Light Ester HOP, and Light Ester HOA (which are trade names of Kyoeisha Chemical Co., Ltd.).

Specific examples of one having a carboxy group as a thermosetting functional group include acrylic acid, methacrylic acid, an acrylic acid dimer, 2-methacryloyloxyethyl succinic acid, 2-methacryloyloxyethyl hexahydrophthalic acid, and phthalic acid monohydroxyethyl acrylate, and examples of a commercially available product thereof include Light Ester HO-MS and Light Ester HO-HH (which are trade names of Kyoeisha Chemical Co., Ltd.), and Aronix M-5400 (trade name of Toagosei Co., Ltd.).

Specific examples of one having an isocyanate group as a thermosetting functional group include 2-methacryloyloxyethyl isocyanate (for example, trade name MOI of Showa Denko K.K.).

Specific examples of one having an epoxy group as a thermosetting functional group include glycidyl methacrylate and a (meth)acryloyl group-containing alicyclic epoxy resin, and examples of a commercially available product thereof include Cyclomer M100, Cyclomer A200, and Cyclomer 2000 (which are trade names of Daicel Corporation).

Specific examples of one having an oxetanyl group as a thermosetting functional group include oxetane (meth)acrylate, and examples of a commercially available product thereof include OXE-10 and OXE-30 (trade names of Osaka Organic Chemical Industry Ltd.).

Specific examples of one having a mercapto group as a thermosetting functional group include ethyl thioacrylate, ethyl thiomethacrylate, biphenyl thioacrylate, biphenyl thiomethacrylate, nitrophenyl thioacrylate, nitrophenyl thiomethacrylate, triphenylmethyl thioacrylate, triphenylmethyl thiomethacrylate, trisacrylate of 1,2-bis[(2-mercaptoethyl)thio]-3-mercaptopropane, 2-(mercaptomethyl)-methyl ester of 2-propenoic acid, and 2-[(2-mercaptoethyl)thio]ethyl ester of methacrylic acid.

Specific examples of one having a methoxymethyl group as a thermosetting functional group include methoxymethyl acrylate, methoxymethyl methacrylate, dimethoxymethyl acrylate, and dimethoxymethyl methacrylate, and examples of a commercially available product thereof include Nikalac MX-302 (acrylic-modified alkylated melamine, trade name of Sanwa Chemical Co., Ltd.).

Specific examples of one having a methoxyethyl group as a thermosetting functional group include 1-methoxyethyl acrylate, 1-methoxyethyl methacrylate, 2-methoxyethyl acrylate, 2-methoxyethyl methacrylate, 1,1-methoxyethyl acrylate, and 1,1-methoxyethyl methacrylate.

Specific examples of one having an ethoxyethyl group as a thermosetting functional group include 1-ethoxyethyl acrylate, 1-ethoxyethyl methacrylate, 2-ethoxyethyl acrylate, and 2-ethoxyethyl methacrylate.

Specific examples of one having an ethoxymethyl group as a thermosetting functional group include N-ethoxymethyl acrylamide, N-ethoxymethyl methacrylamide, ethoxymethyl acrylate, and ethoxymethyl methacrylate.

Specific examples of one having an oxazoline group as a thermosetting functional group include 2-methyl-2-{[3-(4,5-dihydro-2-oxazoyl)benzoyl]amino}ethyl ester of 2-propenoic acid, 2-methyl-2-(4,5-dihydro-2-oxazoyl)ethyl ester of 2-propenoic acid, and 3-(4,5-dihydro-4,4-dimethyl-2-oxazoyl)propyl ester of 2-propenoic acid.

[Electronic Device]

(1) First Embodiment

An electronic device according to a first embodiment of the present invention is an electronic device including a resin layer and a metallic conductive layer, wherein the resin layer includes the resin composition, and the resin layer and the metallic conductive layer are adjacent.

<Metallic Conductive Layer>

The metal for use in the metallic conductive layer can be any metal, such as gold, silver, platinum, zinc, palladium, rhodium, osmium, ruthenium, iridium, copper, nickel, cobalt, iron, tin, chromium, titanium, tantalum, tungsten, or indium, or any alloy thereof.

A metal oxide can be preferably used as a metal compound, and examples thereof include $TiO_2$, ITO (indium tin oxide), ZnO, $Nb_2O_5$, $ZnO/Sb_2O_5$ (zinc antimonate), $ZrO_2$, $CeO_2$, $Ta_2O_5$, $Ti_3O_5$, $Ti_4O_7$, $Ti_2O_3$, TiO, $SnO_2$, $La_2Ti_2O_7$, IZO (indium-zinc oxide), AZO (aluminum-zinc oxide), GZO (gallium-zinc oxide), ATO (antimony-tin oxide), ICO (indium-cerium oxide), $Bi_2O_3$, α-GIO, $Ga_2O_3$, $GeO_2$, $SiO_2$, $Al_2O_3$, $HfO_2$, SiO, MgO, $Y_2O_3$, $WO_3$, and a-GIO (gallium-indium oxide).

<Resin Layer>

The resin layer in the present invention includes the resin composition of the present invention.

The resin composition includes a resin or a resin precursor, and a compound having the structure represented by the general formula (1), the general formula (6) or the general formula (7).

The resin is not particularly limited, and preferably includes any of the above-mentioned polyimide resin, acrylic resin, cellulose ester resin, polycarbonate resin, cycloolefin resin, phenol resin, epoxy resin, polyphenylene ether resin, polyester resin, or melamine resin from the viewpoints of mechanical characteristics and electric characteristics. The resin more preferably includes any of the above-mentioned polyimide resin, acrylic resin, epoxy resin, or melamine resin. In particular, in a case where the resin layer is a resin film, the resin preferably includes the polyimide resin, and in a case where the resin layer is a resist, the resin preferably includes the acrylic resin or the epoxy resin. In a case where the resin layer is a resist, preferably, two or more resin precursors are included, the resin layer includes a light or heat polymerization initiator and is a resin layer formed from a cured product with such an initiator, and an inorganic particle is included. The two or more resin precursors are each preferably a precursor of the acrylic resin or the epoxy resin.

The compound having the structure represented by the general formula (1), the general formula (6) or the general formula (7) (nitrogen-containing aromatic heterocyclic compound) in a range from 0.10 to 30% by mass relative to the resin or the resin precursor is included, and in a range from 1 to 10% by mass is preferably included from the viewpoint that stability in high temperature storage and film production are improved.

The resin layer preferably includes not only the resin composition, but also any additive described below.

Herein, such any additive included differs between a case where the resin layer is a resin film and a case where the resin layer is a resist, and thus such cases are each separately described below.

(A) Resin Film

In a case where the resin layer is used in the form of a resin film, the resin layer preferably includes not only the resin composition, but also, if necessary, a matting agent, an ultraviolet absorber, an antioxidant, a peeling strength, and/or the like.

(Matting Agent)

The resin film in the present invention can include a matting agent of any inorganic fine particle of, for example, silicon dioxide, titanium dioxide, aluminum oxide, zirconium oxide, calcium carbonate, kaolin, talc, fired calcium silicate, hydrated calcium silicate, aluminum silicate, magnesium silicate, or calcium phosphate, or a crosslinked polymer in order to enhance handleability. In particular, silicon dioxide is preferable because of being capable of decreasing the haze of the film.

(Ultraviolet Absorber)

The resin film in the present invention preferably includes an ultraviolet absorber from the viewpoint of an enhancement in light resistance. The ultraviolet absorber is for the purpose of absorbing ultraviolet light at 400 nm or less to thereby enhance light resistance, and in particular, preferably has a transmittance at a wavelength of 370 inn, in a range from 0.1 to 30%, more preferably in a range from 1 to 20%, further preferably in a range from 2 to 10%.

(Antioxidant)

An antioxidant is also called anti-aging agent. In a case where the electronic device or the like is placed in a high-humidity and high-temperature state, the resin film may be degraded in some cases.

An antioxidant serves to, for example, delay or prevent decomposition of the resin film by, for example, halogen contained in an amount of the remaining solvent in the resin film and/or phosphoric acid in a phosphoric acid-based plasticizer, and thus can be included in the resin film in the present invention.

Such an antioxidant here used is preferably a hindered phenol-based compound, and examples thereof can include 2,6-di-t-butyl-p-cresol, pentaerythrityl-tetrakis[3-(3,5-di-t-butyl-4-hydroxyphenyl)propionate], triethylene glycol-bis[3-(3-t-butyl-5-methyl-4-hydroxyphenyl)propionate], 1,6-hexanediol-bis[3-(3,5-di-t-butyl-4-hydroxyphenyl) propionate], 2,4-bis-(n-octylthio)-6-(4-hydroxy-3,5-di-t-butylanilino)-1,3,5-triazine, 2,2-thio-diethylenebis[3-(3,5-di-t-butyl-4-hydroxyphenyl)propionate], octadecyl-3-(3,5-di-t-butyl-4-hydroxyphenyl)propionate, N,N'-hexamethylenebis(3,5-di-t-butyl-4-hydroxy-hydrocinnamamide), 1,3,5-trimethyl-2,4,6-tris(3,5-di-t-butyl-4-hydroxybenzyl)benzene, and tris-(3,5-di-t-butyl-4-hydroxybenzyl)-isocyanurate.

In particular, 2,6-di-t-butyl-p-cresol, pentaerythrityl-tetrakis[3-(3,5-di-t-butyl-4-hydroxyphenyl)propionate], and triethylene glycol-bis[3-(3-t-butyl-5-methyl-4-hydroxyphenyl)propionate] are preferable. Such an antioxidant may be used in combination with, for example, a hydrazine-based metal deactivator, such as N,N'-bis[3-(3,5-di-t-butyl-4-hydroxyphenyl)propionyl]hydrazine and/or a phosphorus-based processing stabilizer, such as tris(2,4-di-t-butylphenyl)phosphite.

(Peeling Accelerator)

There are many surfactants which are additives remarkably exerting the effect of reducing peeling resistance of the resin film, and preferably, a phosphoric acid ester-based surfactant, a carboxylic acid or carboxylic acid salt-based surfactant, a sulfonic acid or sulfonic acid salt-based surfactant, and a sulfuric acid ester-based surfactant are each effective as a peeling agent. A fluorine-based surfactant is also effective where some of hydrogen atoms bound to a hydrocarbon chain of the surfactant is replaced with a fluorine atom. The peeling agent is exemplified below.

RZ-1 $C_8H_{17}O—P(=O)—(OH)_2$
RZ-2 $C_{12}H_{25}O—P(=O)—(OK)_2$
RZ-3 $C_{12}H_{25}OCH_2CH_2O—P(=O)—(OK)_2$
RZ-4 $C_{15}H_{31}(OCH_2CH_2)_5O—P(=O)—(OK)_2$
RZ-5 $\{C_{12}H_{25}O(CH_2CH_2O)_5\}_2—P(=O)—OH$
RZ-6 $\{C_1H_{35}(OCH_2CH_2)_8O\}_2—P(=O)—ONH_4$
RZ-7 $(t-C_4H_9)_3—C_6H_2—OCH_2CH_2O—P(=O)—(OK)_2$
RZ-8 iso-$C_9H_{19}—C_6H_4—O—(CH_2CH_2O)_5—P(=O)—(OK)(OH)$
RZ-9 $C_{12}H_{25}SO_3Na$
RZ-10 $C_{12}H_{25}OSO_3Na$
RZ-11 $C_{17}H_{33}COOH$
RZ-12 $C_{17}H_{33}COOH—N(CH_2CH_2OH)_3$
RZ-13 iso-$C_8H_{17}—C_6H_4—O—(CH_2CH_2O)_3—(CH_2)_2SO_3Na$
RZ-14 (iso-$C_9H_{19})_2—C_6H_3—O—(CH_2CH_2O)_3—(CH_2)_4SO_3Na$
RZ-15 sodium triisopropylnaphthaleneslufonate
RZ-16 sodium tri-t-butylnaphthaleneslufonate
RZ-17 $C_{17}H_{33}CON(CH_3)CH_2CH_2SO_3Na$
RZ-18 $C_{12}H_{25}—C_6H_4SO_3.NH_4$ (B) Resist In a case where the resin layer is used in the form of a resist, the resin layer preferably includes not only the resin composition, but also, if necessary, for example, a light polymerization initiator or a thermosetting agent, a colorant, an inorganic particle (filler), and/or a gelling agent.

(Light Polymerization Initiator)

Examples of the light polymerization initiator include a photo-radical initiator and a photo-cationic polymerization initiator. In the present invention, a photo-radical polymerization initiator is used as the light polymerization initiator. The photo-radical polymerization initiator here used can be any compound which generates radical by, for example, light, laser, or an electron beam to thereby initiate a radical polymerization reaction.

Examples of the photo-radical polymerization initiator include benzoin and benzoin alkyl ether compounds, such as benzoin, benzoin methyl ether, benzoin ethyl ether, and benzoin isopropyl ether; acetophenone compounds, such as acetophenone, 2,2-dimethoxy-2-phenylacetophenone, 2,2-diethoxy-2-phenylacetophenone, and 1,1-dichloroacetophenone; aminoacetophenone compounds, such as 2-methyl-1-[4-(methylthio)phenyl]-2-morpholinopropan-1-one, 2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, and N,N-dimethylaminoacetophenone; anthraquinone compounds, such as 2-methylanthraquinone, 2-ethylanthraquinone, 2-t-butylanthraquinone, and 1-chloroanthraquinone; thioxanthone compounds, such as 2,4-dimethylthioxanthone, 2,4-diethylthioxanthone, 2-chlorothioxanthone, and 2,4-diisopropylthioxanthone; ketal compounds, such as acetophenone dimethyl ketal and benzyl dimethyl ketal; a 2,4,5-triarylimidazole dimer; riboflavin tetrabutyrate; thiol compounds, such as 2-mercaptobenzoimidazole, 2-mercaptobenzooxazole, and 2-mercaptobenzothiazole; organic halogen compounds, such as 2,4,6-tris-s-triazine, 2,2,2-tribromoethanol and tribromomethylphenylsulfone; benzophenone compounds or xanthone compounds, such as benzophenone and 4,4'-bisdiethylaminobenzophenone; and phosphine oxide compounds, such as 2,4,6-trimethylbenzoyldiphenylphosphine oxide.

Such light polymerization initiators may be used singly or in combinations of two or more kinds thereof.

(Thermosetting Agent)

Examples of the thermosetting agent include an organic acid, an amine compound, an amide compound, a hydrazide compound, an imidazole compound, an imidazoline compound, a phenol compound, a urea compound, a polysulfide compound, and an acid anhydride. The thermosetting agent here used may be a modified polyamine compound, such as an amine-epoxy adduct, or may be any thermosetting agent other than the above.

(Colorant)

Examples of the colorant can include pigments and dyes known and commonly used, such as Phthalocyanine-Blue, Phthalocyanine-Green, Iodine-Green, Disazoyellow, Crystal Violet, titanium oxide, carbon black, and naphthalene black.

Such colorants may be used singly or as a mixture of two or more kinds thereof.

(Inorganic Particle)

Examples of the inorganic particle (filler) include silica, talc, clay, mica, hydrotalcite, alumina, magnesium oxide, aluminum hydroxide, aluminum nitride, and boron nitride.

A lower content of the filler in the resin composition is more preferable from the viewpoint that the thickness accuracy of the resin composition is much more increased and furthermore any void is more hardly generated in the resin composition.

(Gelling Agent)

Examples of the gelling agent preferably include low molecular weight compounds having a molecular weight of less than 1000, for example, stearone (18-pentatriacontanone), 16-hentriacontanone, 12-tricosanone, fatty acid alcohols, such as UNILIN 425, fatty acid esters, stearic acid inulin-fatty acid dextrins (Rheopearl series available from Chiba Flour Milling Co., Ltd.), L-glutamic acid derivatives (available from Ajinomoto Fine-Techno Co., Inc.), fatty acid amides (FATTY AMID series available from Kao Corporation), glyceryl behenate eicosadioate (Nomcort HK-G, Nisshin OilliO Group, Ltd.), and jojoba ester (Floraester 70, available from Ikeda Corporation), but are not limited thereto.

Specific examples of the gelling agent which is a fatty acid amide include FATTY AMID E: emcic acid amide, FATTY AMID T: oleic acid amide, and FATTY AMID O—N: hardened tallow acid amide (which are available from Kao Corporation), Nikka Amide APL: stearic acid amide (available from Nihon Kasei Co., Ltd.), and GP-1: N-lauroyl-L-glutamic acid dibutyl amide (available from Ajinomoto Fine-Techno Co., Inc.).

Examples of the gelling agent particularly preferably used include a compound having any structure represented by the following general formulae (I) and (II) from the viewpoint of gelling ability.

  General formula (I):

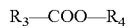  General formula (II):

In the formulae, $R_1$ to $R_4$ each independently represent an alkyl chain having a linear moiety having 12 or more carbon atoms and optionally having a branched moiety.

The compound having the structure represented by the general formula (I) is called ketone wax, and the compound having the structure represented by the general formula (II) is called fatty acid ester.

Examples of the ketone wax include distearyl ketone, dipalmityl ketone, and dilauryl ketone, and examples of the fatty acid ester include stearyl stearate, cetyl palmitate, and behenyl behenate, but are not limited thereto.

The gelling agent can be included in the resist, thereby allowing pinning properties of the resin composition to be enhanced due to sol-gel layer phase transition by the gelling agent.

(Other Component)

The resist may further include other component. Such other component is not particularly limited, and examples thereof include a pigment dispersant, an adhesion aid, such as a coupling agent, a leveling agent, a defoaming agent, and a polymerization inhibitor.

<Method for Producing Resin Film>

The resin film for use as the resin layer in the present invention may be a film produced by melt casting film formation or may be a film produced by solution casting film formation.

Hereinafter, a solution casting film formation method will be described as an example with respect to a method for producing a polyimide film as the method for producing the resin film in the present invention, and any other resin film, such as an acrylic film or the like, can also be produced by the same method.

The method for producing a polyimide film preferably includes a step of dissolving the above polyimide in a solvent to prepare a dope (dope preparation step), a step of casting the dope on a support to form a cast film (casting step), a step of evaporating the solvent from the cast film on the support (solvent evaporation step), a step of peeling the cast film from the support (peeling step), a step of drying the resulting film (first drying step), a step of stretching the film (stretching step), a step of further drying the film stretched (second drying step), and a step of winding the resulting polyimide film (winding step).

<Method for Producing Resist>

The method for producing the resist for use as the resin layer in the present invention preferably includes a step of forming a coating film of a resist composition on a substrate, a step of exposing the coating film for patterning formation, a step of developing the coating film exposed, in an aqueous alkaline solution, a step of substituting an alkaline ion group bonded to an acid group included in the coating film developed, with a hydrogen ion group by a washing liquid, and a step of thermally curing the coating film.

Alternatively, the method preferably includes a step of subjecting the above resist composition to drawing of a pattern with an inkjet apparatus, and a step of applying light irradiation and heat to the resist composition subjected to drawing of a pattern, and curing the resultant to form a resist pattern.

The metallic conductive layer is formed on the resin film or resist produced as above.

The metallic conductive layer can be formed by a vacuum film formation method, such as a chemical vapor deposition method (CVD) or a physical vapor deposition method (PVD), and in particular, any physical vapor deposition method, such as a vacuum deposition method, a sputtering method, an ion plating method, or an electron beam deposition method is preferable.

The metallic conductive layer can also be formed by applying a composition for metallic conductive layer formation, or providing a lattice pattern of a metal wire on the resin film or resist in a case where the metallic conductive layer is a metal mesh. The metallic conductive layer can also be pressure bonded with an adhesive.

(2) Second Embodiment

An electronic device according to a second embodiment of the present invention is an electronic device including a resin layer and a metallic conductive layer, wherein the electronic device includes an intermediate layer between the resin layer and the metallic conductive layer, the intermediate layer including the compound having the structure represented by the general formula (1), the general formula (6) or the general formula (7). That is, while the electronic device according to the first embodiment has a layer configuration where the resin layer and the metallic conductive layer are adjacent and the resin layer includes the resin or the resin precursor and the compound having the structure represented by the general formula (1), the general formula (6) or the general formula (7), the electronic device according to the second embodiment has a layer configuration where an intermediate layer including the compound having the structure represented by the general formula (1), the general formula (6) or the general formula (7) is provided between the resin layer including the resin or the resin precursor and the metallic conductive layer.

<Metallic Conductive Layer>

The metallic conductive layer of the electronic device according to the second embodiment is the same as the metallic conductive layer of the electronic device according to the first embodiment.

<Resin Layer>

The resin layer of the electronic device according to the second embodiment includes the resin or the resin precursor, and does not include the compound having the structure represented by the general formula (1), the general formula (6) or the general formula (7) (nitrogen-containing aromatic heterocyclic compound).

The resin layer may include any additive used in the resin layer of the electronic device according to the first embodiment, besides the nitrogen-containing aromatic heterocyclic compound.

<Intermediate Layer>

The intermediate layer is a layer including the compound having the structure represented by the general formula (1), the general formula (6) or the general formula (7) (nitrogen-containing aromatic heterocyclic compound), and does not include the resin or the resin precursor included in the resin layer.

The intermediate layer may include other organic low molecular weight compound(s) (for example, an UV absorber and/or an antioxidant), besides the nitrogen-containing aromatic heterocyclic compound. The nitrogen-containing aromatic heterocyclic compound is preferably included as a main component in the intermediate layer, and is preferably included in the range from 60 to 100% by mass relative to the entire intermediate layer.

The structure represented by the general formula (1), the general formula (6) or the general formula (7) is the same as the structure described above, and each exemplary compound is also the same as described above.

[Application]

Examples of the electronic device of the present invention can include an organic EL device, a liquid crystal display device (LCD), an organic photoelectric conversion device, a printed substrate, a thin film transistor, a touch panel, a polarization plate, and a phase difference film. The electronic device is preferably used in a flexible printed substrate, a LED lighting device, and a front member for a flexible display from the viewpoint that the effects of the present invention are more efficiently obtained.

<Flexible Printed Substrate>

The flexible printed substrate is obtained by pressure bonding the metallic conductive layer to a resin film including the resin composition of the present invention, with an adhesive. Examples of the additive here used include acrylic, polyimide-based, and epoxy-based adhesives.

Such a metallic conductive layer to be thermally pressure bonded to the resin film with the adhesive is preferably copper foil from the viewpoint of a reduction in cost, and may be any foil of other metal, such as aluminum, gold, silver, nickel, or tin.

<LED Lighting Device>

The LED lighting device is not particularly limited as long as a substrate for LED, using the resin film including the resin composition of the present invention, is used, and examples of such a substrate include a double-faced substrate and a composite substrate with an aluminum plate. In a case where more heat dissipation is demanded according to an increase in brightness of LED, heat dissipation can be enhanced by formation of a composite with an aluminum plate. An application to an organic electroluminescent lighting device with an organic material can also be made.

<Front Member for Flexible Display>

The front member for a flexible display is not particularly limited as long as it is formed by using the resin film including the resin composition of the present invention. A flexible display where the front member for a flexible display is mounted is configured by stacking, for example, an organic EL device obtained by stacking an organic functional layer, such as a light-emitting layer, on a substrate, a gas barrier film, a film color filter, a polarization plate provided with a polarization plate protection film on one or both surfaces thereof, and a film-type touch sensor in the listed order. The front member for a flexible display is, for example, stacked on a film-type touch sensor of a flexible display configured as described above.

The resin film including the resin composition of the present invention may be used in the substrate of the organic EL device forming the flexible display, or may be used in the polarization plate protection film of the polarization plate forming the flexible display.

EXAMPLES

Hereinafter, the present invention will be specifically described with reference to Examples, but the present invention is not limited thereto. Herein, the designation "part(s)" or "%", which is used in Examples, is expressed as "part(s) by mass" or "% by mass", unless particularly noted.

Example 1

Each polyimide for use in Examples was prepared according to the following procedure.

<Synthesis of Polyimide A>

A 500-mL separable four-necked flask equipped with a stainless steel anchor-type stirrer, a nitrogen introduction tube, and a Dean-Stark apparatus was charged with 56.11 g (0.18 mol) of 4,4'-oxydiphthalic acid anhydride (ODPA), 32.09 g (0.18 mol) of diethyltoluenediamine (DETDA), 326.87 g of gamma-butyrolactone (GBL), 2.85 g of pyridine, and 33 g of toluene, and a reaction system was purged with nitrogen. The resultant was stirred in a nitrogen stream at 80° C. for 30 minutes to thereby dissolve ODPA, thereafter heated to 180° C., and stirred with heating for 6 hours.

Water generated in the reaction was removed in the form of an azeotropic mixture with toluene and pyridine, outside the reaction system. After completion of the reaction, the resultant was cooled to room temperature, thereby obtaining a polyimide solution having a concentration of 20% by mass. The structure of the resulting polyimide was as drawn in the following formula.

To the polyimide solution was loaded isopropanol, and the resultant was stirred and then cooled, thereby obtaining a solid of polyimide A.

[Formula 35]

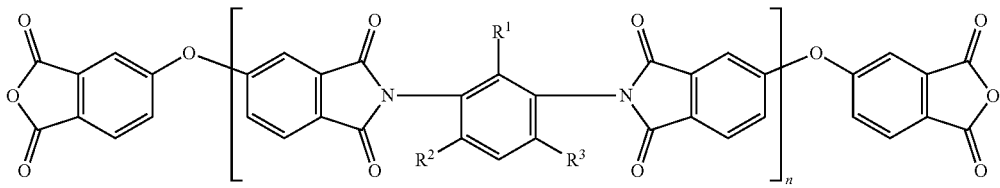

In the formula, one of $R^1$ to $R^3$ represents a methyl group and two thereof each represent an ethyl group.

<Synthesis of Polyimide B>

An apparatus similar to the apparatus used in synthesis of polyimide A was charged with 46.80 g (0.15 mol) of ODPA, 38.16 g (0.15 mol) of 4,4'-diamino-3,3',5,5'-tetramethyldiphenylmethane, 147.67 g of GBL, 2.39 g of pyridine, and 50 g of toluene, and a reaction system was purged with nitrogen. The resultant was stirred in a nitrogen stream at 80° C. for 30 minutes to thereby dissolve ODPA, thereafter heated to 180° C., and stirred with heating for 7 hours.

Water generated in the reaction was removed in the form of an azeotropic mixture with toluene and pyridine, outside the reaction system. After completion of the reaction, 100 g of GBL was added after cooling to 120° C., thereby obtaining a polyimide solution having a concentration of 25% by mass. The structure of the resulting polyimide was as drawn in the following formula. To the polyimide solution was loaded isopropanol, and the resultant was stirred and then cooled, thereby obtaining a solid of polyimide B.

[Formula 36]

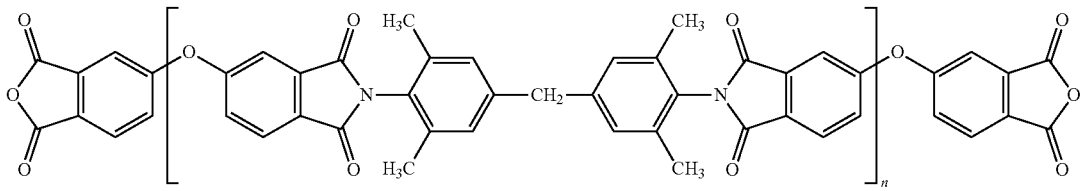

In the formula, n represents the number of repeating units.

<Synthesis of Polyimide C>

Tetracarboxylic acid dianhydride was produced by using 5-norbornene-2-spiro-2'-cyclopentanone-5'-spiro-2"-5"-norbornene according to the method described in Macromolecules (vol. 27), page 1117, published in 1994. Such tetracarboxylic acid dianhydride was thus produced, and as a result, norbornane-2-spiro-α-cyclopentanone-α'-spiro-2"-norbornane-5,5",6,6"-tetracarboxylic acid dianhydride was obtained at a total yield of 88%.

Next, a 30-ml three-necked flask was heated and dried by a heat gun. The three-necked flask sufficiently dried was first charged with 0.200 g (1.00 mmol) of 4,4'-diaminodiphenyl ether (solid), thereafter 2.7 g of dimethylacetamide was added thereto, and the resultant was stirred to thereby dissolve the solid, thereby obtaining a dissolved liquid.

Next, 0.384 g (1.00 mmol) of norbornane-2-spiro-α-cyclopentanone-α'-spiro-2"-norbornane-5,5",6,6"-tetracarboxylic acid dianhydride obtained as described above was added to the dissolved liquid, the atmosphere in the three-necked flask was replaced with a nitrogen atmosphere, and thereafter the resultant was stirred at room temperature (25° C.) under a nitrogen atmosphere for 12 hours, thereby obtaining a reaction liquid including polyimide having the following structure. To the polyimide solution was loaded isopropanol, and the resultant was stirred and then cooled, thereby obtaining a solid of polyimide C.

[Formula 37]

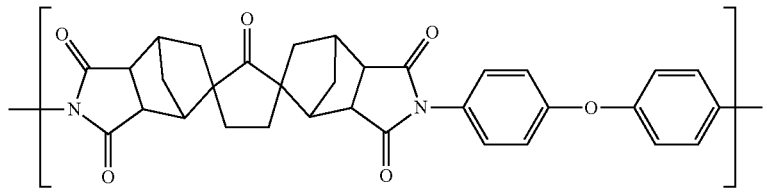

<Synthesis of Polyimide D>

Tetracarboxylic acid dianhydride was produced by using 5-norbornene-2-spiro-2'-cyclohexanone-6'-spiro-2''-5''-norbornene according to the method described in Macromolecules (vol. 27), page 1117, published in 1994. Such tetracarboxylic acid dianhydride e was thus produced, and as a result, norbornane-2-spiro-α-cyclohexanone-α'-spiro-2''-norbornane-5,5'',6,6''-tetracarboxylic acid dianhydride was obtained at a total yield of 87%.

Next, a 30-ml three-necked flask was heated and dried by a heat gun. The three-necked flask sufficiently dried was first charged with 0.200 g (1.00 mmol) of 4,4'-diaminodiphenyl ether (solid), thereafter 2.7 g of dimethylacetamide was added thereto, and the resultant was stirred to thereby dissolve the solid, thereby obtaining a dissolved liquid.

Next, 0.398 g (1.00 mmol) of norbornane-2-spiro-α-cyclohexanone-α'-spiro-2''-norbornane-5,5'',6,6''-tetracarboxylic acid dianhydride obtained as described above was added to the dissolved liquid, the atmosphere in the three-necked flask was replaced with a nitrogen atmosphere, and thereafter the resultant was stirred at room temperature (25° C.) under a nitrogen atmosphere for 12 hours, thereby obtaining a reaction liquid including polyimide having the following structure. To the polyimide solution was loaded isopropanol, and the resultant was stirred and then cooled, thereby obtaining a solid of polyimide D.

[Formula 38]

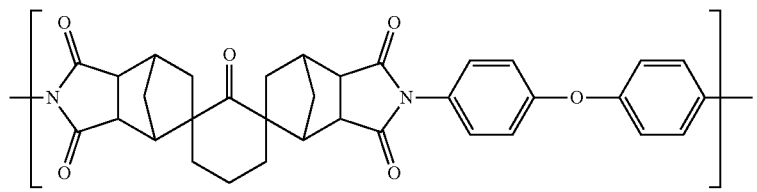

<Synthesis of Polyimide E>

A four-necked flask equipped with a dry nitrogen gas introduction tube, cooler, a Dean-Stark condenser filled with toluene, and a stirrer was charged with 25.59 g (57.6 mmol) of 2,2-bis(3,4-dicarboxyphenyl)-1,1,1,3,3,3-hexafluoropropane dianhydride (acid anhydride 1 described below) (manufactured by Daikin Industries, Ltd.) added to N,N-dimethylacetamide (134 g), and the resultant was subjected to stirring at room temperature in a nitrogen stream.

Thereto was added 19.2 g (60 mmol) of 4,4'-diamino-2,2'-bis(trifluoromethyl)biphenyl (diamine 1 described below) (manufactured by Daikin Industries, Ltd.), and the resultant was heated and stirred at 80° C. for 6 hours.

Thereafter, the outer temperature was raised to 190° C., and water generated according to imidization was azeotropically distilled off, together with toluene. Heating, refluxing, and stirring were continued for 6 hours, and no generation of water was here observed. Heating was conducted for 7 hours with toluene being continuously distilled off, furthermore methanol was loaded for re-precipitation after distilling off toluene, and the solid content was dried, thereby obtaining a solid of polyimide E.

<Synthesis of Polyimide F>

(Polymerization of Polyimide Precursor)

Polyamide acid was produced by using a reaction apparatus including a stainless separable flask as a reaction vessel, including two paddle blades in a stirring apparatus in the separable flask, and including a cooling apparatus. Such a polymerization reaction was performed with a flow of nitrogen gas subjected to dehydration by passing through a calcium chloride tube for prevention of incorporation of moisture, at 0.05 L/min.

The separable flask was charged with 223.5 g of N,N-dimethylacetamide (DMAC) as a polymerization solvent, and 40.0 g (0.125 mol) of diamine 2 which was the following exemplary compound as a diamine was dissolved therein. To such a solution was added 55.5 g (0.125 mol) of acid anhydride 2 which was an exemplary compound as an acid anhydride, and stirred and completely dissolved. The concentration of charging of diamine 2 and acid anhydride 2 in such a reaction solution was 30% by mass relative to the entire reaction liquid.

(Chemical Imidization to Polyimide)

DMAC was added to the solution to allow the solid content concentration to be 15% by mass, and 60 g (molar ratio of imidization accelerator/amide group in polyamide acid=3) of pyridine (pkBH+; 5.17) as an imidization accelerator was added thereto and completely dispersed. To a solution obtained by such dispersion was added 30.6 g (molar ratio of dehydrating agent/amide group in polyamide acid=1.2) of acetic anhydride at a rate of 1 g per minute, and furthermore stirred for 30 minutes. After the stirring, the inner temperature was raised to 50° C., and overheating and stirring were performed for 5 hours.

(Extraction of Polyimide)

The resulting solution was added to methanol, and an objective polyimide powder was precipitated. The resulting white precipitate was sufficiently washed with methanol, and thereafter heated to 50° C. and dried with a drying apparatus, thereby extracting polyimide F. Polyimide F had a weigh average molecular weight of 203000 and a rate of imidization of 100%.

<Synthesis of Polyimide G>

Polyimide G was synthesized in the same manner as in synthesis of polyimide F except that diamine 3 and acid anhydride 3 described below were used.

<Synthesis of Polyimide H>

Polyimide H was synthesized in the same manner as in synthesis of polyimide F except that diamine 4 and acid anhydride 4 described below were used.

[Formula 39]

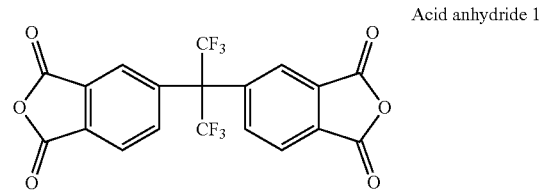

Acid anhydride 1

-continued

Diamine 1

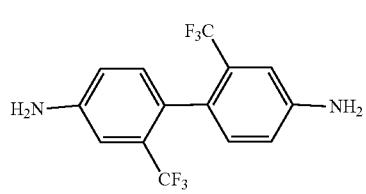

Acid anhydride 2

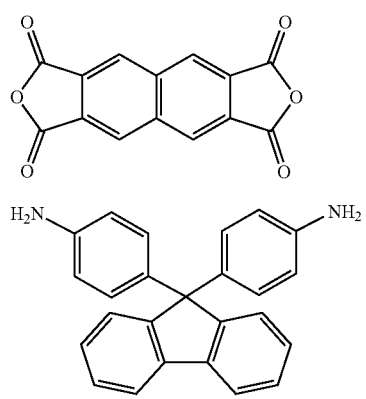

Diamine 2

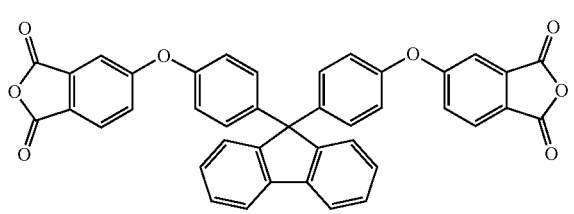

Acid anhydride 3

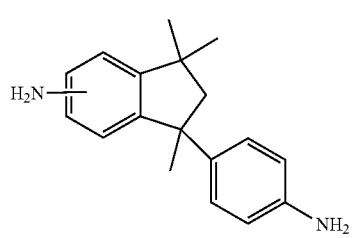

Diamine 3

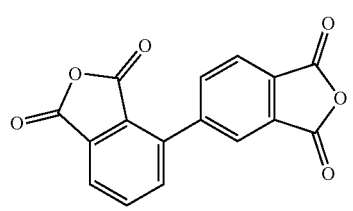

Acid anhydride 4

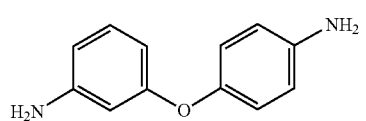

Diamine 4

<Production of Polyimide Film 101>

(Preparation of Dope)

A main dope having the following composition was prepared. First, dichloromethane (boiling point 40° C.) was added into a pressure dissolution tank. To the pressure dissolution tank containing a solvent was loaded polyimide A prepared, under stirring. The resultant was subjected to heating, complete dissolution under stirring, and filtration with Azumi Filter Paper No. 244 manufactured by Azumi Filter Paper Co., Ltd., and thereafter the remaining component was added, and stirred and dissolved, thereby preparing a main dope.

(Composition of Main Dope)

| | |
|---|---|
| Dichloromethane | 350 parts by mass |
| Polyimide A | 100 parts by mass |
| Matting agent (Aerosil R812, manufactured by Nippon Aerosil Co., Ltd.) | 0.5 parts by mass |

(Casting Step)

Next, the dope was uniformly cast on a stainless belt support at a temperature of 30° C. and a width of 1500 mm by use of an endless belt casting apparatus. The temperature of the stainless belt was controlled to 30° C.

(Peeling Step)

The solvent was evaporated until the amount of the remaining solvent in the film cast on the stainless belt support was 75%, and the film was then peeled at a peeling tension of 180 N/m from the stainless belt support.

(Stretching Step)

The polyimide film peeled was stretched 1.50-fold in the width direction by use of a clip-type tenter under application of heat at 200° C. The amount of the remaining solvent at the start of stretching was 20% by mass.

(Drying Step)

The film stretched was dried at a drying temperature so that the amount of the remaining solvent was less than 0.1% by mass at a conveyance tension of 100 N/m for a drying time of 15 minutes, thereby obtaining polyimide film 101 having a dry thickness of 50 μm.

(Electrode Production Step)

Polyimide film 101 dried was cut out to a size of 50 mm×50 mm, and secured to a substrate holder of a commercially available vacuum deposition apparatus.

A crucible for deposition in the vacuum deposition apparatus was filled with silver in an optimal amount for production. The crucible for deposition, here used, was one produced from a tantalum material for resistive heating.

After reduction in pressure to a degree of vacuum of $1×10^{-4}$ Pa, the crucible for deposition, where silver was placed, was energized and heated, deposition was made at a rate of deposition of 0.1 nm/second to form an electrode having a thickness of 8 nm, and the electrode was defined as polyimide electrode 101.

<Production of Polyimide Film 103>

Polyimide film 103 and electrode 103 thereof were produced in the same manner as in in production of polyimide electrode 101 except that CDBP as a comparative compound was further used to prepare the following main dope.

(Composition of Main Dope)

| | |
|---|---|
| Dichloromethane | 350 parts by mass |
| Polyimide A | 90 parts by mass |
| Comparative compound (CDBP) | 10 parts by mass |
| Matting agent (Aerosil R812, manufactured by Nippon Aerosil Co., Ltd.) | 0.5 parts by mass |

[Formula 40]

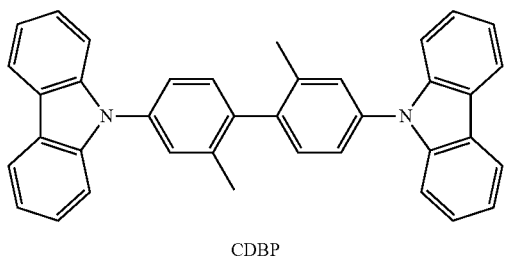

CDBP

<Production of Polyimide Film 107>

Polyimide film 107 was produced in the same manner as in production of polyimide film 101 except that compound (2) according to Inventive Example was further used to prepare the following main dope. Electrode 107 was produced in the same manner as in production of electrode 101 except that the thickness was 10 inn.

(Composition of Main Dope)

| | |
|---|---|
| Dichloromethane | 350 parts by mass |
| Polyimide A | 90 parts by mass |
| Compound (2) | 10 parts by mass |
| Matting agent (Aerosil R812, manufactured by Nippon Aerosil Co., Ltd.) | 0.5 parts by mass |

<Production of Polyimide Films 102, 104 to 106 and 108 to 211>

Polyimide films 102, 104 to 106, 108 to 211 and electrodes thereof were each produced in the same manner as in production of polyimide film 107 except that the type of the polyimide, each additive compound (compound (2), compound (12), compound (18), compound (30), compound (32), compound (47), compound (6-5), compound (6-6), compound (6-9), compound (6-18), compound (6-21) to compound (6-32), compound (7-1), compound (7-5), compound (7-12), compound (7-13), compound (7-32), and compound (7-34) to compound (7-47)) and the amount of addition thereof, and the thickness of each electrode were changed as shown in Table I and Table II below. The amount of addition of the additive compound in the Tables is expressed by part(s) by mass under the assumption that the total amount including the amount of each polyimide used is 100 parts by mass.

Polyimide films 102, 146, 147, 158, 169, 180, 197, 202, and 207 in Comparative Examples were each a polyimide film obtained by singly using each of polyimides B to H as in production of polyimide film 101.

[Evaluation]

<Light Transmittance (%)>

Each of the polyimide electrodes produced was subjected to measurement of the light transmittance at a wavelength of 550 nm.

The measurement of the light transmittance was performed using a spectrophotometer (U-3300 manufactured by Hitachi High-Tech Science Corporation) under the assumption that the state of no base material corresponded to a baseline.

<Sheet Resistance Value>

Each of the polyimide electrodes produced was subjected to measurement of the sheet resistance value [S2/sq.].

The measurement of the sheet resistance value was performed using a resistivity meter (MCP-T610 manufactured by Mitsubishi Chemical Analytech) according to a four-terminal four-probe method of a low current-applied system.

<Change in Sheet Resistance Value in High Temperature Storage>

Each of the polyimide electrodes produced was subjected to measurement of the sheet resistance value after hours at a temperature of 80° C.

The resulting sheet resistance value after high temperature storage and that measured as described above were compared, and the rate of change in resistance value was evaluated based on the following evaluation criteria. Ratings 3, 4, and 5 in the following evaluation were regarded as levels not causing any problems in practical use.

5: the rate of change in sheet resistance value after high temperature storage exhibited a value of less than 5.0%.

4: the rate of change in sheet resistance value after high temperature storage exhibited a value of 5.0% or more and less than 7.5%.

3: the rate of change in sheet resistance value after high temperature storage exhibited a value of 7.5% or more and less than 10.0%.

2: the rate of change in sheet resistance value after high temperature storage exhibited a value of 10.0% or more.

1: the sheet resistance value after high temperature storage could not be measured.

TABLE I-1

| Polyimide film No. | Polyimide Type | Additive compound Type | Amount of addition [part(s) by mass] | Thickness of electrode [nm] | Light transmittance [%] | Sheet resistance value [Ω/sq.] | Change in sheet resistance value in high temperature storage | Note |
|---|---|---|---|---|---|---|---|---|
| 101 | A | — | — | 8 | 36.5 | 96.8 | 1 | Comparative Example |
| 102 | A | — | — | 10 | 34.0 | 33.9 | 2 | Comparative Example |
| 103 | A | Comparative compound | 10 | 8 | 35.0 | 101.6 | 1 | Comparative Example |
| 104 | A | Compound (2) | 0.05 | 8 | 36.9 | 97.1 | 1 | Comparative Example |
| 105 | A | Compound (2) | 1 | 8 | 43.4 | 34.6 | 3 | Inventive Example |
| 106 | A | Compound (2) | 5 | 10 | 38.1 | 24.5 | 3 | Inventive Example |
| 107 | A | Compound (2) | 10 | 10 | 40.3 | 15.6 | 4 | Inventive Example |
| 108 | A | Compound (2) | 35 | | Failed to produce polyimide film | | | Comparative Example |
| 109 | A | Compound (12) | 10 | 10 | 42.2 | 14.4 | 4 | Inventive Example |
| 110 | A | Compound (32) | 10 | 10 | 40.9 | 15.7 | 4 | Inventive Example |
| 111 | A | Compound (47) | 10 | 10 | 43.7 | 12.8 | 5 | Inventive Example |
| 112 | A | Compound (6-5) | 10 | 10 | 40.1 | 18.2 | 4 | Inventive Example |
| 113 | A | Compound (6-6) | 10 | 10 | 40.5 | 17.6 | 4 | Inventive Example |
| 114 | A | Compound (6-9) | 10 | 10 | 40.1 | 18.2 | 4 | Inventive Example |

TABLE I-1-continued

| Polyimide film No. | Polyimide Type | Additive compound Type | Amount of addition [part(s) by mass] | Thickness of electrode [nm] | Light transmittance [%] | Sheet resistance value [Ω/sq.] | Change in sheet resistance value in high temperature storage | Note |
| --- | --- | --- | --- | --- | --- | --- | --- | --- |
| 115 | A | Compound (6-18) | 10 | 10 | 40.5 | 17.6 | 4 | Inventive Example |
| 116 | A | Compound (6-21) | 10 | 10 | 41.3 | 15.8 | 5 | Inventive Example |
| 117 | A | Compound (6-22) | 10 | 10 | 40.7 | 16.8 | 4 | Inventive Example |
| 118 | A | Compound (6-23) | 10 | 10 | 39.3 | 20.2 | 3 | Inventive Example |
| 119 | A | Compound (6-24) | 10 | 10 | 39.5 | 20.1 | 3 | Inventive Example |
| 120 | A | Compound (6-25) | 10 | 10 | 40.1 | 18.9 | 4 | Inventive Example |
| 121 | A | Compound (6-26) | 10 | 10 | 39.9 | 19.9 | 4 | Inventive Example |
| 122 | A | Compound (6-27) | 10 | 10 | 40.1 | 19.2 | 4 | Inventive Example |
| 123 | A | Compound (6-28) | 10 | 10 | 40.2 | 19.5 | 4 | Inventive Example |
| 124 | A | Compound (6-29) | 10 | 10 | 39.3 | 19.6 | 4 | Inventive Example |
| 125 | A | Compound (6-30) | 10 | 10 | 39.5 | 19.5 | 4 | Inventive Example |
| 126 | A | Compound (6-31) | 10 | 10 | 39.8 | 20.1 | 4 | Inventive Example |
| 127 | A | Compound (6-32) | 10 | 10 | 40.2 | 18.9 | 4 | Inventive Example |
| 128 | A | Compound (7-1) | 10 | 10 | 40.1 | 18.9 | 4 | Inventive Example |
| 129 | A | Compound (7-5) | 10 | 10 | 40.9 | 16.6 | 4 | Inventive Example |
| 130 | A | Compound (7-12) | 10 | 10 | 39.2 | 19.2 | 4 | Inventive Example |
| 131 | A | Compound (7-32) | 10 | 10 | 39.5 | 19.5 | 4 | Inventive Example |
| 132 | A | Compound (7-34) | 10 | 10 | 42.1 | 14.3 | 5 | Inventive Example |
| 133 | A | Compound (7-35) | 10 | 10 | 40.1 | 19.8 | 4 | Inventive Example |
| 134 | A | Compound (7-36) | 10 | 10 | 40.6 | 18.2 | 4 | Inventive Example |

TABLE I-2

| Polyimide film No. | Polyimide Type | Additive compound Type | Amount of addition [part(s) by mass] | Thickness of electrode [nm] | Light transmittance [%] | Sheet resistance value [Ω/sq.] | Change in sheet resistance value in high temperature storage | Note |
| --- | --- | --- | --- | --- | --- | --- | --- | --- |
| 135 | A | Compound (7-37) | 10 | 10 | 39.4 | 20.1 | 3 | Inventive Example |
| 136 | A | Compound (7-38) | 10 | 10 | 39.3 | 20.4 | 3 | Inventive Example |
| 137 | A | Compound (7-39) | 10 | 10 | 39.8 | 19.9 | 4 | Inventive Example |
| 138 | A | Compound (7-40) | 10 | 10 | 39.9 | 19.1 | 4 | Inventive Example |
| 139 | A | Compound (7-41) | 10 | 10 | 39.5 | 20.2 | 4 | Inventive Example |
| 140 | A | Compound (7-42) | 10 | 10 | 39.9 | 19.4 | 4 | Inventive Example |
| 141 | A | Compound (7-43) | 10 | 10 | 39.6 | 19.9 | 4 | Inventive Example |
| 142 | A | Compound (7-44) | 10 | 10 | 39.6 | 19.4 | 4 | Inventive Example |
| 143 | A | Compound (7-45) | 10 | 10 | 40.0 | 19.1 | 4 | Inventive Example |
| 144 | A | Compound (7-46) | 10 | 10 | 39.8 | 19.6 | 4 | Inventive Example |
| 145 | A | Compound (7-47) | 10 | 10 | 40.3 | 18.9 | 4 | Inventive Example |
| 146 | B | — | — | 8 | 34.6 | 153.7 | 1 | Comparative Example |
| 147 | B | — | — | 10 | 42.0 | 68.9 | 2 | Comparative Example |
| 148 | B | Compound (18) | 5 | 8 | 40.7 | 32.1 | 3 | Inventive Example |
| 149 | B | Compound (18) | 5 | 10 | 45.1 | 18.7 | 4 | Inventive Example |
| 150 | B | Compound (18) | 10 | 10 | 48.2 | 16.2 | 4 | Inventive Example |
| 151 | B | Compound (30) | 5 | 10 | 48.6 | 15.8 | 4 | Inventive Example |
| 152 | B | Compound (30) | 10 | 10 | 52.0 | 13.4 | 4 | Inventive Example |
| 153 | B | Compound (12) | 10 | 10 | 48.1 | 16.0 | 5 | Inventive Example |
| 154 | B | Compound (6-18) | 10 | 10 | 44.2 | 19.4 | 4 | Inventive Example |
| 155 | B | Compound (6-21) | 10 | 10 | 46.4 | 16.8 | 4 | Inventive Example |
| 156 | B | Compound (7-13) | 10 | 10 | 49.1 | 15.2 | 4 | Inventive Example |
| 157 | B | Compound (7-34) | 10 | 10 | 50.5 | 14.8 | 5 | Inventive Example |
| 158 | C | — | — | 10 | 38.3 | 69.1 | 1 | Comparative Example |
| 159 | C | Compound (2) | 10 | 10 | 40.7 | 22.3 | 4 | Inventive Example |
| 160 | C | Compound (12) | 5 | 10 | 42.6 | 22.4 | 4 | Inventive Example |
| 161 | C | Compound (12) | 10 | 10 | 44.4 | 18.7 | 4 | Inventive Example |
| 162 | C | Compound (18) | 10 | 10 | 46.3 | 16.5 | 5 | Inventive Example |
| 163 | C | Compound (32) | 10 | 10 | 45.9 | 16.8 | 4 | Inventive Example |
| 164 | C | Compound (47) | 10 | 10 | 46.8 | 16.1 | 4 | Inventive Example |
| 165 | C | Compound (6-9) | 10 | 10 | 43.2 | 19.8 | 4 | Inventive Example |
| 166 | C | Compound (6-21) | 10 | 10 | 44.8 | 17.8 | 4 | Inventive Example |
| 167 | C | Compound (7-5) | 10 | 10 | 45.3 | 17.2 | 4 | Inventive Example |
| 168 | C | Compound (7-34) | 10 | 10 | 46.1 | 16.6 | 5 | Inventive Example |

TABLE II

| Polyimide film No. | Polyimide Type | Additive compound Type | Amount of addition [part(s) by mass] | Thickness of electrode [nm] | Light transmittance value [%] | Sheet resistance value [Ω/sq.] | Change in sheet resistance value in high temperature storage | Note |
|---|---|---|---|---|---|---|---|---|
| 169 | D | — | — | 10 | 34.4 | 30.7 | 2 | Comparative Example |
| 170 | D | Compound (2) | 5 | 10 | 37.2 | 28.2 | 3 | Inventive Example |
| 171 | D | Compound (12) | 5 | 10 | 39.9 | 23.6 | 4 | Inventive Example |
| 172 | D | Compound (30) | 10 | 10 | 44.8 | 17.7 | 5 | Inventive Example |
| 173 | D | Compound (32) | 5 | 10 | 42.1 | 20.5 | 4 | Inventive Example |
| 174 | D | Compound (32) | 10 | 10 | 44.5 | 19.1 | 4 | Inventive Example |
| 175 | D | Compound (47) | 10 | 10 | 46.9 | 15.3 | 4 | Inventive Example |
| 176 | D | Compound (6-18) | 10 | 10 | 43.6 | 19.4 | 4 | Inventive Example |
| 177 | D | Compound (6-21) | 10 | 10 | 44.5 | 18.3 | 5 | Inventive Example |
| 178 | D | Compound (7-13) | 10 | 10 | 44.6 | 18.5 | 4 | Inventive Example |
| 179 | D | Compound (7-34) | 10 | 10 | 45.8 | 17.1 | 5 | Inventive Example |
| 180 | E | — | — | 8 | 39.8 | 148.4 | 1 | Comparative Example |
| 181 | E | Compound (12) | 10 | 8 | 51.9 | 21.3 | 4 | Inventive Example |
| 182 | E | Compound (30) | 10 | 10 | 55.3 | 16.6 | 5 | Inventive Example |
| 183 | E | Compound (32) | 10 | 10 | 53.3 | 15.3 | 4 | Inventive Example |
| 184 | E | Compound (47) | 10 | 10 | 52.8 | 14.9 | 4 | Inventive Example |
| 185 | E | Compound (6-18) | 10 | 10 | 51.1 | 15.1 | 4 | Inventive Example |
| 186 | E | Compound (6-21) | 10 | 10 | 52.4 | 14.9 | 4 | Inventive Example |
| 187 | E | Compound (6-22) | 10 | 10 | 53.1 | 15.1 | 4 | Inventive Example |
| 188 | E | Compound (6-25) | 10 | 10 | 52.2 | 16.8 | 4 | Inventive Example |
| 189 | E | Compound (6-27) | 10 | 10 | 52.1 | 17.2 | 3 | Inventive Example |
| 190 | E | Compound (6-32) | 10 | 10 | 51.9 | 18.2 | 3 | Inventive Example |
| 191 | E | Compound (7-34) | 10 | 10 | 52.5 | 15.1 | 4 | Inventive Example |
| 192 | E | Compound (7-36) | 10 | 10 | 52.2 | 16.2 | 4 | Inventive Example |
| 193 | E | Compound (7-40) | 10 | 10 | 52.2 | 16.9 | 4 | Inventive Example |
| 194 | E | Compound (7-43) | 10 | 10 | 52.1 | 17.3 | 3 | Inventive Example |
| 195 | E | Compound (7-45) | 10 | 10 | 51.9 | 18.3 | 4 | Inventive Example |
| 196 | E | Compound (7-47) | 10 | 10 | 51.8 | 18.8 | 3 | Inventive Example |
| 197 | F | — | — | 10 | 32.8 | 27.4 | 2 | Comparative Example |
| 198 | F | Compound (2) | 10 | 10 | 40.9 | 22.6 | 4 | Inventive Example |
| 199 | F | Compound (47) | 10 | 10 | 47.4 | 19.5 | 3 | Inventive Example |
| 200 | F | Compound (6-21) | 10 | 10 | 45.4 | 20.3 | 4 | Inventive Example |
| 201 | F | Compound (7-34) | 10 | 10 | 46.6 | 19.8 | 4 | Inventive Example |
| 202 | G | — | — | 10 | 38.5 | 33.8 | 1 | Comparative Example |
| 203 | G | Compound (32) | 10 | 10 | 46.5 | 26.6 | 3 | Inventive Example |
| 204 | G | Compound (47) | 10 | 10 | 47.2 | 21.9 | 4 | Inventive Example |
| 205 | G | Compound (6-18) | 10 | 10 | 47.1 | 23.4 | 4 | Inventive Example |
| 206 | G | Compound (7-13) | 10 | 10 | 46.5 | 24.5 | 4 | Inventive Example |
| 207 | H | — | — | 10 | 36.8 | 41.4 | 2 | Comparative Example |
| 208 | H | Compound (30) | 10 | 10 | 45.1 | 23.7 | 4 | Inventive Example |
| 209 | H | Compound (47) | 10 | 10 | 49.1 | 20.2 | 4 | Inventive Example |
| 210 | H | Compound (6-21) | 10 | 10 | 47.2 | 22.2 | 4 | Inventive Example |
| 211 | H | Compound (7-34) | 10 | 10 | 46.4 | 21.4 | 4 | Inventive Example |

It was found from the above results that each polyimide film using any compound according to Inventive Examples was excellent in terms of light transmittance, sheet resistance value, and change in sheet resistance value in high temperature storage as compared with each polyimide film of Comparative Examples.

Example 2

An acrylic film and an electrode thereof were produced and evaluated in the same manner as in Example 1 except that an acrylic resin for use in Examples was prepared and an acrylic film was formed according to the following method.

<Production of Acrylic Film 201>
(Composition of main dope)

| | |
|---|---|
| Acrylic resin (Hitaloid 7927, manufactured by Hitachi Chemical Co., Ltd.) | 90 parts by mass |

After the main dope of the composition was prepared, a coating liquid was applied onto a glass base material to form a coating film, the coating film was dried at 70° C., and thereafter the coating film was cured by using an ultraviolet lamp with an irradiator at an illuminance of 300 mW/cm$^2$ and an irradiation level of 0.3 J/cm$^2$, with an atmosphere having an oxygen concentration of 1.0% by volume or less being purged with nitrogen, thereby obtaining acrylic film 201.

(Electrode Production Step)

Acrylic film 201 dried was cut out to a size of 50 mm×50 mm, and secured to a substrate holder of a commercially available vacuum deposition apparatus.

A crucible for deposition in the vacuum deposition apparatus was filled with silver in an optimal amount for production. The crucible for deposition, here used, was one produced from a tantalum material for resistive heating.

After reduction in pressure to a degree of vacuum of 1×10$^{-4}$ Pa, the crucible for deposition, where silver was placed, was energized and heated, deposition was made at a rate of deposition of 0.1 nm/second to form an electrode having a thickness of 8 nm, and the electrode was defined as electrode 201.

<Production of Acrylic Film 202>

Acrylic film 202 and an electrode thereof were produced in the same manner as in production of acrylic film 201 except that the following main dope was prepared.

(Composition of Main Dope)

| | |
|---|---|
| Acrylic resin (Hitaloid 7927, manufactured by Hitachi Chemical Co., Ltd.) | 90 parts by mass |
| Compound (2) | 10 parts by mass |

<Production of Acrylic Films 203 to 207, 222 and 223>

Acrylic films 203 to 207, 222, 223 and electrodes thereof were each produced in the same manner as in production of acrylic film 202 except that compound (2) was changed to each of the following compounds.

Acrylic film 203 . . . compound (12)
Acrylic film 204 . . . compound (18)
Acrylic film 205 . . . compound (30)
Acrylic film 206 . . . compound (32)
Acrylic film 207 . . . compound (47)
Acrylic film 222 . . . compound (6-9)
Acrylic film 223 . . . compound (7-13)

<Production of Acrylic Film 208>

Acrylic film 208 and an electrode thereof were produced in the same manner as in production of acrylic electrode 201 except that the acrylic film was formed according to the following method.

(Composition of Main Dope)

| | |
|---|---|
| Diethylene glycol monoethyl ether acetate | 80 parts by mass |
| Styrene acrylic resin (YL-1098, manufactured by Seiko PMC Corporation) | 90 parts by mass |

After the main dope of the composition was prepared, a coating liquid was applied onto a glass base material and the resultant was dried, thereby obtaining acrylic film 208.

<Production of Acrylic Film 209>

Acrylic film 209 and an electrode thereof were produced in the same manner as in production of acrylic electrode 208 except that the following main dope was prepared.

| | |
|---|---|
| Diethylene glycol monoethyl ether acetate | 80 parts by mass |
| Styrene acrylic resin (YL-1098, manufactured by Seiko PMC Corporation) | 90 parts by mass |
| Compound (2) | 10 parts by mass |

<Production of Acrylic Films 210 to 214, 224, and 225>

Acrylic film 210 to 214, 224, 225 and electrodes thereof were each produced in the same manner as in production of acrylic film 209 except that compound (2) was changed to each of the following compounds.

Acrylic film 210 . . . compound (12)
Acrylic film 211 . . . compound (18)
Acrylic film 212 . . . compound (30)
Acrylic film 213 . . . compound (32)
Acrylic film 214 . . . compound (47)
Acrylic film 224 . . . compound (6-9)
Acrylic film 225 . . . compound (7-13)

<Production of Acrylic Film 215>

Acrylic film 215 and an electrode thereof were produced in the same manner as in production of acrylic electrode 201 except that the acrylic film was formed according to the following method.

(Composition of Main Dope)

| | |
|---|---|
| Methyl ethyl ketone | 150 parts by mass |
| Acrylic resin (Hitaloid 7975, manufactured by Hitachi Chemical Co., Ltd.) | 90 parts by mass |

After the main dope of the composition was prepared, a coating liquid was applied onto a glass base material to form a coating film, the coating film was dried at 70° C., and thereafter the coating film was cured by using an ultraviolet lamp with an irradiator at an illuminance of 300 mW/cm$^2$ and an irradiation level of 0.3 J/cm$^2$, with an atmosphere having an oxygen concentration of 1.0% by volume or less being purged with nitrogen, thereby obtaining acrylic film 215.

<Production of Acrylic Film 216>

Acrylic film 216 and an electrode thereof were produced in the same manner as in production of acrylic electrode 215 except that the following main dope was prepared.

(Composition of Main Dope)

| | |
|---|---|
| Methyl ethyl ketone | 150 parts by mass |
| Acrylic resin (Hitaloid 7975, manufactured by Hitachi Chemical Co., Ltd.) | 90 parts by mass |
| Compound (2) | 10 parts by mass |

<Production of Acrylic Films 217 to 221, 226 and 227>

Acrylic film 217 to 221, 226, 227 and electrodes thereof were each produced in the same manner as in production of acrylic film 216 except that compound (2) was changed to each of the following compounds.

Acrylic film 217 . . . compound (12)
Acrylic film 218 . . . compound (18)
Acrylic film 219 . . . compound (30)
Acrylic film 220 . . . compound (32)
Acrylic film 221 . . . compound (47)
Acrylic film 226 . . . compound (6-9)
Acrylic film 227 . . . compound (7-13)

The electrode of each of the acrylic films produced was subjected to measurement of the sheet resistance at the initial stage of production and the sheet resistance value after 10 hours at a temperature of 80° C. The resulting respective sheet resistance values before and after high temperature storage were compared to evaluate the rate of change in resistance value, and each electrode using acrylic films 202 to 207, 209 to 214, 216 to 221, and 222 to 227 according to Inventive Examples exhibited a rate of change within 7% and was excellent in storage stability, but each electrode according to Comparative Examples 201, 208 and 215 exhibited a variation in rate of change in resistance value, of 10% or more.

Example 3

The polyimide film produced in Example 1 was used to obtain a polyimide electrode according to the following configuration.

<Production of Polyimide Electrode 301>

(Electrode Production Step)

Polyimide film 101 dried was cut out to a size of 50 mm×50 mm, and secured to a substrate holder of a commercially available vacuum deposition apparatus.

A crucible for deposition in the vacuum deposition apparatus was filled with silver in an optimal amount for production. The crucible for deposition, here used, was one produced from a tantalum material for resistive heating.

After reduction in pressure to a degree of vacuum of $1\times10^{-4}$ Pa, the crucible for deposition, where silver was placed, was energized and heated, deposition was made at a rate of deposition of 0.1 nm/second to form an electrode having a thickness of 50 inn, and the electrode was defined as polyimide electrode 301.

<Production of Polyimide Electrodes 302 to 324>

Each of polyimide electrodes 302 to 324 was produced in the same manner as in production of polyimide electrode 301 except that the polyimide film serving as the substrate was changed as shown in Table III.

<Production of Polyimide Electrodes 325 to 378>

Each of polyimide electrodes 325 to 378 was produced in the same manner as in production of polyimide electrode 301 except that the electrode was changed to copper or titanium and the polyimide film serving as the substrate was changed as shown in Table IV below.

[Evaluation]

<Change in Sheet Resistance Value in High Temperature Storage>

Each of polyimide electrodes 301 to 378 produced was subjected to measurement of the sheet resistance value at the initial stage of film formation and the sheet resistance value after 10 hours at a temperature of 80° C.

The resulting sheet resistance after high temperature storage and that at the initial stage of film formation were compared, and the rate of change in resistance value was evaluated based on the following evaluation criteria.

Ratings 3, 4, and 5 in the following evaluation were regarded as levels not causing any problems in practical use.

5: the rate of change in sheet resistance value after high temperature storage exhibited a value of less than 5.0%

4: the rate of change in sheet resistance value after high temperature storage exhibited a value of 5.0% or more and less than 7.5%

3: the rate of change in sheet resistance value after high temperature storage exhibited a value of 7.5% or more and less than 10.0%

2: the rate of change in sheet resistance value after high temperature storage exhibited a value of 10.0% or more 1: the sheet resistance value after high temperature storage could not be measured <Adhesiveness>

Polyimide electrodes 301 to 378 obtained were used to perform a tape peeling test. The tape peeling test was performed according to JIS K5600.

A cutter was used to make six slits in a longitudinal direction and six slits in a lateral direction at an interval of 1 mm width at a depth level so as not to cut, but reach the base material, thereby forming 25 squares in total of 5 squares×5 squares. Such square sections were strongly pressure bonded with a commercially available cellophane tape (24 mm width, manufactured by Nichiban Co., Ltd.) by the ball of a finger, an end of the tape was pulled and peeled at an angle of 60° at one time, and the state of any square remaining was evaluated based on the following evaluation criteria.

AA: Not changed. (Favorable)

BB: squares were not fully peeled, but partially peeled. (No problems in practical use)

CC: 1 to 5 squares were peeled. (not available in practical use)

DD: 6 or more squares were peeled. (not available in practical use)

TABLE III

| Polyimide electrode No. | Polyimide film No. | Electrode Thickness of Ag [nm] | Evaluation Change in sheet resistance value in high temperature storage | Adhesiveness | Note |
| --- | --- | --- | --- | --- | --- |
| 301 | 101 | 50 | 2 | CC | Comparative Example |
| 302 | 103 | 50 | 1 | CC | Comparative Example |
| 303 | 109 | 50 | 4 | BB | Inventive Example |
| 304 | 114 | 50 | 4 | BB | Inventive Example |
| 305 | 115 | 50 | 4 | BB | Inventive Example |
| 306 | 116 | 50 | 4 | BB | Inventive Example |
| 307 | 117 | 50 | 4 | BB | Inventive Example |
| 308 | 120 | 50 | 4 | BB | Inventive Example |
| 309 | 130 | 50 | 4 | BB | Inventive Example |
| 310 | 131 | 50 | 4 | BB | Inventive Example |
| 311 | 132 | 50 | 5 | BB | Inventive Example |
| 312 | 134 | 50 | 4 | BB | Inventive Example |
| 313 | 138 | 50 | 4 | BB | Inventive Example |
| 314 | 147 | 50 | 2 | CC | Comparative Example |
| 315 | 151 | 50 | 4 | BB | Inventive Example |
| 316 | 152 | 50 | 5 | AA | Inventive Example |
| 317 | 154 | 50 | 4 | BB | Inventive Example |
| 318 | 157 | 50 | 5 | BB | Inventive Example |
| 319 | 180 | 50 | 1 | DD | Comparative Example |
| 320 | 181 | 50 | 4 | BB | Inventive Example |
| 321 | 182 | 50 | 4 | AA | Inventive Example |
| 322 | 184 | 50 | 5 | AA | Inventive Example |
| 323 | 185 | 50 | 4 | AA | Inventive Example |
| 324 | 191 | 50 | 5 | AA | Inventive Example |

TABLE IV

| Polyimide electrode No. | Polyimide film No. | Electrode Thickness of Cu [nm] | Electrode Thickness of Ti [nm] | Evaluation Change in sheet resistance value in high temperature storage | Note |
|---|---|---|---|---|---|
| 325 | 101 | 50 | — | 1 | Comparative Example |
| 326 | 103 | 50 | — | 1 | Comparative Example |
| 327 | 109 | 50 | — | 4 | Inventive Example |
| 328 | 114 | 50 | — | 4 | Inventive Example |
| 329 | 115 | 50 | — | 5 | Inventive Example |
| 330 | 116 | 50 | — | 5 | Inventive Example |
| 331 | 117 | 50 | — | 4 | Inventive Example |
| 332 | 120 | 50 | — | 4 | Inventive Example |
| 333 | 130 | 50 | — | 4 | Inventive Example |
| 334 | 131 | 50 | — | 4 | Inventive Example |
| 335 | 132 | 50 | — | 5 | Inventive Example |
| 336 | 134 | 50 | — | 4 | Inventive Example |
| 337 | 138 | 50 | — | 4 | Inventive Example |
| 338 | 180 | 50 | — | 2 | Comparative Example |
| 339 | 181 | 50 | — | 4 | Inventive Example |
| 340 | 182 | 50 | — | 5 | Inventive Example |
| 341 | 184 | 50 | — | 5 | Inventive Example |
| 342 | 185 | 50 | — | 5 | Inventive Example |
| 343 | 186 | 50 | — | 4 | Inventive Example |
| 344 | 187 | 50 | — | 5 | Inventive Example |
| 345 | 188 | 50 | — | 4 | Inventive Example |
| 346 | 189 | 50 | — | 4 | Inventive Example |
| 347 | 191 | 50 | — | 5 | Inventive Example |
| 348 | 192 | 50 | — | 4 | Inventive Example |
| 349 | 193 | 50 | — | 4 | Inventive Example |
| 350 | 194 | 50 | — | 4 | Inventive Example |
| 351 | 195 | 50 | — | 4 | Inventive Example |
| 352 | 101 | — | 50 | 2 | Comparative Example |
| 353 | 103 | — | 50 | 2 | Comparative Example |
| 354 | 109 | — | 50 | 5 | Inventive Example |
| 355 | 114 | — | 50 | 4 | Inventive Example |
| 356 | 115 | — | 50 | 4 | Inventive Example |
| 357 | 116 | — | 50 | 5 | Inventive Example |
| 358 | 117 | — | 50 | 4 | Inventive Example |
| 359 | 120 | — | 50 | 4 | Inventive Example |
| 360 | 130 | — | 50 | 4 | Inventive Example |
| 361 | 131 | — | 50 | 4 | Inventive Example |
| 362 | 132 | — | 50 | 5 | Inventive Example |
| 363 | 134 | — | 50 | 4 | Inventive Example |
| 364 | 138 | — | 50 | 4 | Inventive Example |
| 365 | 180 | — | 50 | 1 | Comparative Example |
| 366 | 181 | — | 50 | 4 | Inventive Example |
| 367 | 182 | — | 50 | 4 | Inventive Example |
| 368 | 184 | — | 50 | 4 | Inventive Example |
| 369 | 185 | — | 50 | 5 | Inventive Example |
| 370 | 186 | — | 50 | 4 | Inventive Example |
| 371 | 187 | — | 50 | 4 | Inventive Example |
| 372 | 188 | — | 50 | 4 | Inventive Example |
| 373 | 189 | — | 50 | 4 | Inventive Example |
| 374 | 191 | — | 50 | 4 | Inventive Example |
| 375 | 192 | — | 50 | 4 | Inventive Example |
| 376 | 193 | — | 50 | 4 | Inventive Example |
| 377 | 194 | — | 50 | 4 | Inventive Example |
| 378 | 195 | — | 50 | 4 | Inventive Example |

It was found from the above results that each polyimide electrode using any compound according to Inventive Examples was excellent in terms of change in sheet resistance value in high temperature storage as compared with each polyimide electrode of Comparative Examples.

Example 4

A dope having the same composition as in the polyimide film used in Example 1 was used to obtain a polyimide electrode according to the following configuration.
<Production of Metal Film>
A glass substrate having a size of 150 mm×150 mm and a thickness of 0.7 mm was secured to a substrate holder of a commercially available vacuum deposition apparatus. A crucible for deposition in the vacuum deposition apparatus was filled with silver in an optimal amount for production. The crucible for deposition, here used, was one produced from a tantalum material for resistive heating.

After reduction in pressure to a degree of vacuum of $1\times10^{-4}$ Pa, the crucible for deposition, where silver was placed, was energized and heated, and deposition was made at a rate of deposition of 0.1 nm/second to form an electrode having a thickness of 50 nm.
<Production of Polyimide Electrode 401>
Polyimide electrode 401 was produced on the glass substrate provided with a silver film, as described above, by use of a dope having the same composition as in polyimide film 101 used in Example 1.

After abase was assembled so that the glass substrate was at the same height as that of the periphery thereof, the main dope composition of polyimide film 101 and a commercially available film applicator were used for application onto the glass substrate provided with a silver film, and the resultant was subjected to drying and curing steps, thereby producing polyimide electrode 401.

<Production of Polyimide Electrodes 402 to 415>

Each of polyimide electrodes 402 to 415 was produced in the same manner as in production of polyimide electrode 401 except that the polyimide film serving as the substrate was changed as shown in Table V below.

[Evaluation]

<Change in Sheet Resistance Value in High Temperature Storage>

Each of polyimide electrodes 401 to 415 produced was subjected to measurement of the sheet resistance value at the initial stage of film formation and the sheet resistance value after 10 hours at a temperature of 80° C.

The sheet resistance value was measured with a resistance measurement instrument (EC-80 manufactured by Napson) with an eddy current system.

The resulting sheet resistance after high temperature storage and that at the initial stage of film formation were compared, and the rate of change in resistance value was evaluated based on the following evaluation criteria. Ratings 3, 4, and 5 in the following evaluation were regarded as levels not causing any problems in practical use.

5: the rate of change in sheet resistance value after high temperature storage exhibited a value of less than 5.0%.

4: the rate of change in sheet resistance value after high temperature storage exhibited a value of 5.0% or more and less than 7.5%.

3: the rate of change in sheet resistance value after high temperature storage exhibited a value of 7.5% or more and less than 10.0%.

2: the rate of change in sheet resistance value after high temperature storage exhibited a value of 10.0% or more.

1: the sheet resistance value after high temperature storage could not be measured.

It was found from the above results that each polyimide electrode using any compound according to Inventive Examples was excellent in terms of change in sheet resistance value in high temperature storage as compared with each polyimide electrode of Comparative Examples.

Example 5

Each of polyimide films 101 to 211 produced in Example 1 was used to obtain an organic EL element according to the following configuration.

<Production of Organic EL Element>

Each of polyimide films 101 to 107 and 109 to 211 produced in Example 1 was secured to a substrate holder of a commercially available vacuum deposition apparatus, and was used as a substrate.

Each crucible for deposition in the vacuum deposition apparatus was filled with a constituting material of each layer in an optimal amount for production of each element. The crucible for deposition, here used, was one produced from a molybdenum or tungsten material for resistive heating.

After reduction in pressure to a degree of vacuum of $1 \times 10^{-4}$ Pa, the crucible for deposition, where Ag was placed, was energized and heated, and deposition on a polyimide film substrate was made at a rate of deposition of 0.1 nm/second, thereby forming an anode having a thickness of 100 nm.

Furthermore, HAT-CN (1,4,5,8,9,12-hexaazatriphenylenehexacarbonitrile) was deposited on an Ag electrode at a rate of deposition of 0.1 nm/second, thereby forming a hole-injection layer having a thickness of 10 nn.

Next, α-NPD (4,4'-bis[N-(1-naphthyl)-N-phenylamino]biphenyl) was deposited on the hole-injection layer at a rate of deposition of 0.1 nm/second, thereby forming a hole-transport layer having a thickness of 40 nm.

CBP below as a host compound and Ir(ppy)$_3$ below as a light-emitting dopant were co-deposited at a rate of deposition of 0.1 nm/second so as to be at respective proportions of 90% by volume and 10% by volume, thereby forming a light-emitting layer having a thickness of 30 nn.

TABLE V

| | | | | Composition of main dope | | Evaluation | |
| | | | | | Additive compound | | |
| Polyimide electrode No. | Metal Thickness of Ag [nm] | Polyimide film No. | Polyimide Type | Type | Amount of addition [part(s) by mass] | Change in sheet resistance value in high temperature storage | Note |
|---|---|---|---|---|---|---|---|
| 401 | 50 | 101 | A | — | — | 1 | Comparative Example |
| 402 | 50 | 103 | A | Comparative compound | 10 | 1 | Comparative Example |
| 403 | 50 | 107 | A | Compound (2) | 10 | 4 | Inventive Example |
| 404 | 50 | 109 | A | Compound (12) | 10 | 4 | Inventive Example |
| 405 | 50 | 114 | A | Compound (6-9) | 10 | 4 | Inventive Example |
| 406 | 50 | 115 | A | Compound (6-18) | 10 | 4 | Inventive Example |
| 407 | 50 | 130 | A | Compound (7-12) | 10 | 4 | Inventive Example |
| 408 | 50 | 131 | A | Compound (7-32) | 10 | 4 | Inventive Example |
| 409 | 50 | 180 | E | — | — | 2 | Comparative Example |
| 410 | 50 | 182 | E | Compound (30) | 10 | 4 | Inventive Example |
| 411 | 50 | 184 | E | Compound (47) | 10 | 5 | Inventive Example |
| 412 | 50 | 185 | E | Compound (6-18) | 10 | 4 | Inventive Example |
| 413 | 50 | 186 | E | Compound (6-21) | 10 | 4 | Inventive Example |
| 414 | 50 | 190 | E | Compound (7-32) | 10 | 5 | Inventive Example |
| 415 | 50 | 191 | E | Compound (7-34) | 10 | 5 | Inventive Example |

Next, Alq$_3$ (tris(8-quinolinol)aluminum) and LiF were each deposited on the light-emitting layer at a rate of deposition of 0.1 nm/second, thereby forming each electron-transport layer having a thickness of 40 nm.

Furthermore, LiQ (lithium 8-hydroxyquinolate) was formed at a thickness of 2 nm, and thereafter aluminum was deposited at 100 nm, thereby forming a cathode. Next, a 200-nm silicon nitride film was formed on the cathode according to the CVD method and thus formed into an insulation film, thereby producing an organic EL element unit.

Next, a polyethylene terephthalate film provided with a gas barrier layer having a thickness of 20 m was used as a glass barrier film, and a sealing unit was produced where a thermosetting liquid adhesive (epoxy-based resin) was provided as a sealing layer having a thickness of 25 m on one surface of such a gas barrier film.

Next, the organic EL element unit where the transparent substrate to the insulation layer were formed, and the sealing unit were pressed at 90° C. under a reduced pressure condition of 0.1 MPa, and retained for 5 minutes. Subsequently, a stacked body was placed back in an ambient pressure environment, and furthermore heated at 90° C. for 30 minutes to cure the adhesive, thereby producing an organic EL element.

[Formula 41]

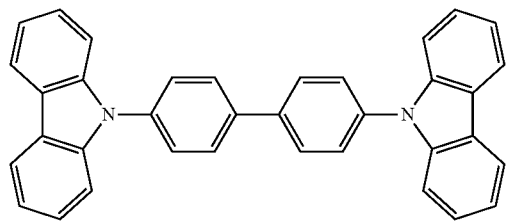

CBP

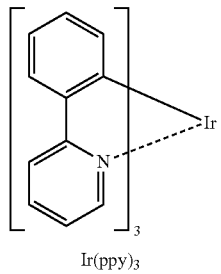

Ir(ppy)$_3$

The front brightness in ignition of a direct voltage of 6 V to the organic EL element produced was 1200 cd/m$^2$. The front brightness was determined by measuring the brightness at a visible light wavelength of 430 to 480 nm with a spectral radiance meter CS-1000 manufactured by Konica Minolta, Inc., with adjustment of the front brightness at a viewing angle of 2° so that the optical axis in the spectral radiance meter was matched to the normal line from the light-emitting surface, and determining the integral intensity.

Furthermore, the organic EL element produced was allowed to emit light in a constant current condition of 2.5 mA/cm$^2$ at a temperature of 80° C., and the drive voltage immediately after the start of light emission and the drive voltage after 100 hours from the start were measured.

The drive voltages obtained before and after high temperature storage were compared to evaluate the rate of change in drive voltage, and each element using polyimide films 105 to 107, 109 to 145, 148 to 157, 159 to 168, 170 to 179, 181 to 186, 188 to 191, 193 to 196, 198 to 201, 203 to 206, and 208 to 211 according to Inventive Examples exhibited a rate of change in drive voltage within 5% and thus was excellent in storage stability, but each element using polyimide films 101 to 104, 146, 147, 158, 169, 180, 197, 202, and 207 according to Comparative Examples exhibited a rate of change in drive voltage of 10% or more.

Example 6

Each resin film and each electrode thereof, described in Table VI, were produced in the same manner as in Example 1 except that each resin for use in Examples was prepared and each resin film was formed according to the following method, and such resin film and electrode were evaluated.

<Production of TAC Film 601>

TAC film 601 and electrode 601 thereof were produced in the same manner as in production of TAC film 601 except that the following main dope was prepared.

(Composition of Main Dope)

| Dichloromethane | 350 parts by mass |
| Triacetylcellulose (TAC) | 100 parts by mass |

<Production of Polyimide Electrode 601>
(Electrode Production Step)

TAC film 601 dried was cut out to a size of 50 mm×50 mm, and secured to a substrate holder of a commercially available vacuum deposition apparatus.

A crucible for deposition in the vacuum deposition apparatus was filled with silver in an optimal amount for production. The crucible for deposition, here used, was one produced from a tantalum material for resistive heating.

After reduction in pressure to a degree of vacuum of 1×10$^{-4}$ Pa, the crucible for deposition, where silver was placed, was energized and heated, deposition was made at a rate of deposition of 0.1 nm/second to form an electrode having a thickness of 50 inn, and the electrode was defined as electrode 601.

<Production of TAC Film 602>

TAC film 602 and an electrode thereof were produced in the same manner except that the following main dope was prepared in production of acrylic film 601.

(Composition of Main Dope)

| Dichloromethane | 350 parts by mass |
| Triacetylcellulose (TAC) | 90 parts by mass |
| Compound (30) | 10 parts by mass |

<Production of Respective Resin Films 603 to 632>

Resin films 603 to 632 and electrodes thereof were each produced in the same manner as in production of TAC film 602 except that each main dope described in Table VI was prepared.

(Resin)
Polycarbonate resin (PC)
Cycloolefin resin (Zeonor)
Polyester resin (polyethylene terephthalate (PET)
Melamine resin
[Evaluation]
<Change in Sheet Resistance Value in High Temperature Storage>

Each of resin electrodes 601 to 632 produced was subjected to measurement of the sheet resistance value at the initial stage of film formation and the sheet resistance value after 10 hours at a temperature of 80° C.

The resulting sheet resistance after high temperature storage and that at the initial stage of film formation were compared, and the rate of change in resistance value was evaluated based on the following evaluation criteria. Ratings 3, 4, and 5 in the following evaluation were regarded as levels not causing any problems in practical use.

5: the rate of change in sheet resistance value after high temperature storage exhibited a value of less than 5.0%

4: the rate of change in sheet resistance value after high temperature storage exhibited a value of 5.0% or more and less than 7.5%

3: the rate of change in sheet resistance value after high temperature storage exhibited a value of 7.5% or more and less than 10.0%

2: the rate of change in sheet resistance value after high temperature storage exhibited a value of 10.0% or more 1: the sheet resistance value after high temperature storage could not be measured.

peeling liquid, and thereafter a stacked body was obtained according to the following procedure.

<Production of Stacked Body 701>
(Composition of Main Dope)

| | |
|---|---|
| Dichloromethane | 350 parts by mass |
| Polyimide A described above | 100 parts by mass |
| Matting agent (Aerosil R812, manufactured by Nippon Aerosil Co., Ltd.) | 0.5 parts by mass |

After a main dope having the composition was adjusted, a coating liquid was applied onto the copper base material subjected to a surface treatment, to form a coating film, and the coating film was dried at a drying temperature so that the amount of the remaining solvent was less than 0.1% by mass, thereby obtaining stacked body 701 having a dry thickness of 20 m.

TABLE VI

| | | | Composition of main dope | | Evaluation | |
|---|---|---|---|---|---|---|
| | | | Additive compound | | | |
| Electrode No. | Film No. | Resin Type | Type | Amount of addition [part(s) by mass] | Change in sheet resistance value in high temperature storage | Note |
| 601 | 601 | TAC | — | — | 2 | Comparative Example |
| 602 | 602 | TAC | Compound (30) | 10 | 4 | Inventive Example |
| 603 | 603 | TAC | Compound (47) | 10 | 5 | Inventive Example |
| 604 | 604 | TAC | Compound (6-18) | 10 | 4 | Inventive Example |
| 605 | 605 | TAC | Compound (6-21) | 10 | 5 | Inventive Example |
| 606 | 606 | TAC | Compound (7-13) | 10 | 4 | Inventive Example |
| 607 | 607 | TAC | Compound (7-34) | 10 | 4 | Inventive Example |
| 608 | 608 | PC | — | — | 1 | Comparative Example |
| 609 | 609 | PC | Compound (30) | 10 | 4 | Inventive Example |
| 610 | 610 | PC | Compound (47) | 10 | 4 | Inventive Example |
| 611 | 611 | PC | Compound (6-18) | 10 | 4 | Inventive Example |
| 612 | 612 | PC | Compound (6-21) | 10 | 4 | Inventive Example |
| 613 | 613 | PC | Compound (7-13) | 10 | 4 | Inventive Example |
| 614 | 614 | PC | Compoimd (7-34) | 10 | 4 | Inventive Example |
| 615 | 615 | Zeonor | — | — | 1 | Comparative Example |
| 616 | 616 | Zeonor | Compound (30) | 10 | 4 | Inventive Example |
| 617 | 617 | Zeonor | Compoimd (6-18) | 10 | 5 | Inventive Example |
| 618 | 618 | Zeonor | Compound (6-21) | 10 | 5 | Inventive Example |
| 619 | 619 | Zeonor | Compound (7-13) | 10 | 4 | Inventive Example |
| 620 | 620 | Zeonor | Compound (7-34) | 10 | 4 | Inventive Example |
| 621 | 621 | PET | — | — | 2 | Comparative Example |
| 622 | 622 | PET | Compound (30) | 10 | 5 | Inventive Example |
| 623 | 623 | PET | Compound (6-18) | 10 | 4 | Inventive Example |
| 624 | 624 | PET | Compound (6-21) | 10 | 4 | Inventive Example |
| 625 | 625 | PET | Compound (7-13) | 10 | 4 | Inventive Example |
| 626 | 626 | PET | Compound (7-34) | 10 | 5 | Inventive Example |
| 627 | 627 | Melamine | — | — | 1 | Comparative Example |
| 628 | 628 | Melamine | Compound (30) | 10 | 4 | Inventive Example |
| 629 | 629 | Melamine | Compound (6-18) | 10 | 4 | Inventive Example |
| 630 | 630 | Melamine | Compound (6-21) | 10 | 4 | Inventive Example |
| 631 | 631 | Melamine | Compound (7-13) | 10 | 4 | Inventive Example |
| 632 | 632 | Melamine | Compoimd (7-34) | 10 | 4 | Inventive Example |

It was found from the above results that each electrode using any compound according to Inventive Examples was excellent in terms of change in sheet resistance value in high temperature storage as compared with each electrode of Comparative Examples.

Example 7

A copper-clad stacked body sheet (manufactured by Sunhayato Corp.) (hereinafter, also referred to as "copper base material".) was subjected to a surface treatment with a <Production of Stacked Body 727>
(Composition of Main Dope)

| | |
|---|---|
| Acrylic resin (Hitaloid7927) | 90 parts by mass |

After a main dope having the composition was adjusted, a coating liquid was applied onto the copper base material subjected to a surface treatment, to form a coating film, the coating film was dried at 70° C., and thereafter the coating film was cured by using an ultraviolet lamp with an irradiator at an illuminance of 300 mW/cm² and an irradiation level of 0.3 J/cm², with an atmosphere having an oxygen concentration of 1.0% by volume or less being purged with nitrogen, thereby obtaining stacked body 727 having a dry thickness of 20 m.

<Production of Stacked Body 754>
(Composition of Main Dope)

| | |
|---|---|
| Methyl ethyl ketone | 350 parts by mass |
| Epoxy resin (HP-5000, manufactured by DIC Corporation) | 50 parts by mass |
| Phenol curing agent (MEH-7851-3H, manufactured by Meiwa Chemical Co., Ltd.) | 48 parts by mass |
| Cyclic siloxane compound (1,3,5,7-tetramethylcyclotetrasiloxane, manufactured by Azmax Corp.) | 2 parts by mass |

After a main dope having the composition was adjusted, a coating liquid was applied onto the copper base material subjected to a surface treatment, to form a coating film, the coating film was dried at 150° C., and thereafter stacked body 754 having a dry thickness of 20 m was obtained.

<Production of Stacked Bodies 702 to 706, 728 to 753 and 755 to 780>

Each of stacked bodies 702 to 706, 728 to 753, and 755 to 780 was produced in the same manner except that the compounding amounts of the resin and the additive compound were changed as shown in Table VII below. The amount of the solid content of the additive compound in the main dope used was here 100 parts by mass. The amount of addition in the Table is expressed by part(s) by mass.

Each resin shown in the Table is as follows.
Polyimide: polyimide A
Acryl: Hitaloid 7927
Epoxy: epoxy resin (25) HP-5000: methoxynaphthalenedimethylene-type epoxy resin, manufactured by DIC Corporation, epoxy equivalent 250

[Evaluation]
<Peeling Strength in High Temperature Storage>
Each of the stacked bodies produced was subjected to measurement of the peeling strength at the initial stage of film formation and the peeling strength after 168 hours at a temperature of 80° C.

The peeling strength was measured with SAICAS (NN-04T manufactured by Daipla Wintes Co., Ltd.) in a constant load mode.

The measurement values in each Example and each Comparative Example were compared and evaluated under the assumption that those in stacked bodies 701, 727, and 754 according to Comparative Examples were each 100%.

TABLE VII-1

| Stacked body No. | Composition of main dope | | Evaluation | |
| | Resin | Additive compound (1 part by mass) | Adhesiveness after high temperature storage | Note |
|---|---|---|---|---|
| 701 | Polyimide | — | 100 | Comparative Example |
| 702 | Polyimide | Compound (2) | 119 | Inventive Example |
| 703 | Polyimide | Compound (12) | 114 | Inventive Example |
| 704 | Polyimide | Compound (30) | 123 | Inventive Example |
| 705 | Polyimide | Compound (6- 5) | 117 | Inventive Example |
| 706 | Polyimide | Compound (6- 6) | 121 | Inventive Example |
| 707 | Polyimide | Compound (6- 9) | 128 | Inventive Example |
| 708 | Polyimide | Compound (6-18) | 132 | Inventive Example |
| 709 | Polyimide | Compound (6-21) | 125 | Inventive Example |
| 710 | Polyimide | Compound (6-22) | 133 | Inventive Example |
| 711 | Polyimide | Compound (6-23) | 120 | Inventive Example |
| 712 | Polyimide | Compound (6-24) | 119 | Inventive Example |
| 713 | Polyimide | Compound (6-47) | 123 | Inventive Example |
| 714 | Polyimide | Compound (6-48) | 129 | Inventive Example |
| 715 | Polyimide | Compound (7-11) | 120 | Inventive Example |
| 716 | Polyimide | Compound (7-12) | 124 | Inventive Example |
| 717 | Polyimide | Compound (7-32) | 118 | Inventive Example |
| 718 | Polyimide | Compound (7-34) | 126 | Inventive Example |
| 719 | Polyimide | Compound (7-35) | 123 | Inventive Example |
| 720 | Polyimide | Compound (7-36) | 121 | Inventive Example |
| 721 | Polyimide | Compound (7-37) | 119 | Inventive Example |
| 722 | Polyimide | Compound (7-38) | 118 | Inventive Example |
| 723 | Polyimide | Compound (7-39) | 119 | Inventive Example |
| 724 | Polyimide | Compound (7-48) | 126 | Inventive Example |
| 725 | Polyimide | Compound (7-49) | 127 | Inventive Example |
| 726 | Polyimide | Compound (7-50) | 126 | Inventive Example |
| 727 | Acrylic | — | 100 | Comparative Example |
| 728 | Acrylic | Compound (2) | 121 | Inventive Example |
| 729 | Acrylic | Compound (12) | 118 | Inventive Example |
| 730 | Acrylic | Compound (30) | 122 | Inventive Example |
| 731 | Acrylic | Compound (6- 6) | 120 | Inventive Example |
| 732 | Acrylic | Compound (6- 9) | 126 | Inventive Example |
| 733 | Acrylic | Compound (6-18) | 131 | Inventive Example |
| 734 | Acrylic | Compound (6-21) | 127 | Inventive Example |
| 735 | Acrylic | Compound (6-22) | 129 | Inventive Example |
| 736 | Acrylic | Compound (6-25) | 124 | Inventive Example |
| 737 | Acrylic | Compound (6-26) | 120 | Inventive Example |
| 738 | Acrylic | Compound (6-27) | 123 | Inventive Example |
| 739 | Acrylic | Compound (6-28) | 121 | Inventive Example |
| 740 | Acrylic | Compound (6-47) | 123 | Inventive Example |

TABLE VII-2

| Stacked body No. | Composition of main dope | | Evaluation | |
| | Resin | Additive compound (1 part by mass) | Adhesiveness after high temperature storage | Note |
|---|---|---|---|---|
| 741 | Acrylic | Compound (6-48) | 130 | Inventive Example |
| 742 | Acrylic | Compound (7-11) | 119 | Inventive Example |
| 743 | Acrylic | Compound (7-12) | 122 | Inventive Example |
| 744 | Acrylic | Compound (7-32) | 118 | Inventive Example |
| 745 | Acrylic | Compound (7-34) | 125 | Inventive Example |
| 746 | Acrylic | Compound (7-35) | 121 | Inventive Example |
| 747 | Acrylic | Compound (7-40) | 123 | Inventive Example |
| 748 | Acrylic | Compound (7-41) | 120 | Inventive Example |
| 749 | Acrylic | Compound (7-42) | 121 | Inventive Example |
| 750 | Acrylic | Compound (7-43) | 123 | Inventive Example |
| 751 | Acrylic | Compound (7-48) | 125 | Inventive Example |
| 752 | Acrylic | Compound (7-49) | 124 | Inventive Example |
| 753 | Acrylic | Compound (7-50) | 124 | Inventive Example |
| 754 | Epoxy | — | 100 | Comparative Example |
| 755 | Epoxy | Compound (2) | 118 | Inventive Example |
| 756 | Epoxy | Compound (12) | 117 | Inventive Example |
| 757 | Epoxy | Compound (30) | 120 | Inventive Example |
| 758 | Epoxy | Compound (6-6) | 119 | Inventive Example |
| 759 | Epoxy | Compound (6-9) | 124 | Inventive Example |
| 760 | Epoxy | Compound (6-18) | 130 | Inventive Example |
| 761 | Epoxy | Compound (6-21) | 124 | Inventive Example |
| 762 | Epoxy | Compound (6-22) | 130 | Inventive Example |
| 763 | Epoxy | Compound (6-29) | 121 | Inventive Example |
| 764 | Epoxy | Compound (6-30) | 121 | Inventive Example |
| 765 | Epoxy | Compound (6-31) | 119 | Inventive Example |
| 766 | Epoxy | Compound (6-32) | 121 | Inventive Example |
| 767 | Epoxy | Compound (6-47) | 121 | Inventive Example |
| 768 | Epoxy | Compound (6-48) | 128 | Inventive Example |
| 769 | Epoxy | Compound (7-1) | 116 | Inventive Example |
| 770 | Epoxy | Compound (7-11) | 117 | Inventive Example |
| 771 | Epoxy | Compound (7-12) | 119 | Inventive Example |
| 772 | Epoxy | Compound (7-32) | 117 | Inventive Example |
| 773 | Epoxy | Compound (7-34) | 121 | Inventive Example |
| 774 | Epoxy | Compound (7-44) | 118 | Inventive Example |
| 775 | Epoxy | Compound (7-45) | 117 | Inventive Example |
| 776 | Epoxy | Compound (7-46) | 118 | Inventive Example |
| 777 | Epoxy | Compound (7-47) | 117 | Inventive Example |
| 778 | Epoxy | Compound (7-48) | 121 | Inventive Example |
| 779 | Epoxy | Compound (7-49) | 122 | Inventive Example |
| 780 | Epoxy | Compound (7-50) | 121 | Inventive Example |

It was found from the above results that each stacked body using any compound according to Inventive Examples was excellent in terms of adhesiveness after high temperature storage as compared with each stacked body of Comparative Examples.

Example 8

A solder resist liquid (hereinafter, also referred to as "SR".) as a commercially available product was prepared in the form of a combination (SR composition) of a resin and an additive compound shown in Table VIII below, applied in a comb-type pattern (line width/space width: 75/75 m), and subjected to a curing step, thereby obtaining each of cured products 801 to 860, having a thickness of 30 m. The curing step was according to the technical data of each SR.

SR1 . . . SR-4000 HT-1/CA-40 HT-1 (manufactured by Taiyo Ink Mfg. Co., Ltd.)

SR1 includes an acrylic resin, an epoxy resin, and the like.

SR2 . . . PSR-4000 LEW3/CA-40 LEW3 (manufactured by Taiyo Ink Mfg. Co., Ltd.)

SR2 includes an acrylic resin, an epoxy resin, and the like.

SR3 . . . PLAS FINE PSR-310 (manufactured by Goo Chemical Co., Ltd.) (ultraviolet-curable solder resist)

[Evaluation]

<Surface Curability> (UV Curability)

The surface of each of the cured products obtained as described above was touched with a finger, and the tackiness (stickiness) was evaluated.

BB: no stickiness

CC: slight stickiness and remaining of fingerprint

DD: stickiness

<Pencil Hardness>

After each of the cured products obtained as described above was left to still stand in an environment of 25° C.-60% RH for 24 hours, the pencil hardness of the surface thereof was measured according to JIS-K-5400, and evaluated according to the following ranks.

BB: the pencil hardness was 2H or more

CC: the pencil hardness was B, F, or H

DD: the pencil hardness was 2B or less

<Storage Stability>

The viscosity at room temperature was measured with a dynamic viscoelasticity measurement apparatus every one hour after adjustment of each SR before curing. The time until the viscosity doubled the initial value was measured, and defined as the pot life. A case of a pot life of more than 2 hours was rated as "BB", and a case of a pot life within 2 hours was rated as "DD".

<Confirmation of Insulating Properties of Solder Resist>

After cured products 801 to 860 were subjected to measurement of the initial insulation resistance, a moistening test for 1500 hours was performed in conditions of 85° C. and a relative temperature of 85%, and application of a direct current of 75 V. The insulation resistance was again measured after the moistening test, and insulating properties of the solder resist were evaluated according to the following ranks.

BB: the change in insulation resistance relative to the initial was less than $1 \times 10^2 \Omega$ DD: the change in insulation resistance relative to the initial was $1 \times 10^2 \Omega$ or more

TABLE VIII-1

| Cured product No. | Composition of SR Resin | Additive compound (1 part by mass) | Surface curability | Pencil hardness | Storage stability | Change in insulation resistance | Note |
|---|---|---|---|---|---|---|---|
| 801 | SR1 | — | BB | BB | BB | DD | Comparative Example |
| 802 | SR1 | Compound (2) | BB | BB | BB | BB | Inventive Example |
| 803 | SR1 | Compound (12) | BB | BB | BB | BB | Inventive Example |
| 804 | SR1 | Compound (30) | BB | BB | BB | BB | Inventive Example |
| 805 | SR1 | Compound (6-5) | BB | BB | BB | BB | Inventive Example |
| 806 | SR1 | Compound (6-6) | BB | BB | BB | BB | Inventive Example |
| 807 | SR1 | Compound (6-9) | BB | BB | BB | BB | Inventive Example |
| 808 | SR1 | Compound (6-18) | BB | BB | BB | BB | Inventive Example |
| 809 | SR1 | Compound (6-21) | BB | BB | BB | BB | Inventive Example |
| 810 | SR1 | Compound (6-22) | BB | BB | BB | BB | Inventive Example |
| 811 | SR1 | Compound (6-23) | BB | BB | BB | BB | Inventive Example |
| 812 | SR1 | Compound (6-24) | BB | BB | BB | BB | Inventive Example |
| 813 | SR1 | Compound (7-12) | BB | BB | BB | BB | Inventive Example |
| 814 | SR1 | Compound (7-32) | BB | BB | BB | BB | Inventive Example |
| 815 | SR1 | Compound (7-34) | BB | BB | BB | BB | Inventive Example |
| 816 | SR1 | Compound (7-35) | BB | BB | BB | BB | Inventive Example |
| 817 | SR1 | Compound (7-36) | BB | BB | BB | BB | Inventive Example |
| 818 | SR1 | Compound (7-37) | BB | BB | BB | BB | Inventive Example |
| 819 | SR1 | Compound (7-38) | BB | BB | BB | BB | Inventive Example |
| 820 | SR1 | Compound (7-39) | BB | BB | BB | BB | Inventive Example |
| 821 | SR2 | — | BB | BB | BB | DD | Comparative Example |
| 822 | SR2 | Compound (2) | BB | BB | BB | BB | Inventive Example |
| 823 | SR2 | Compound (12) | BB | BB | BB | BB | Inventive Example |
| 824 | SR2 | Compound (30) | BB | BB | BB | BB | Inventive Example |
| 825 | SR2 | Compound (6-6) | BB | BB | BB | BB | Inventive Example |
| 826 | SR2 | Compound (6-9) | BB | BB | BB | BB | Inventive Example |
| 827 | SR2 | Compound (6-18) | BB | BB | BB | BB | Inventive Example |
| 828 | SR2 | Compound (6-22) | BB | BB | BB | BB | Inventive Example |
| 829 | SR2 | Compound (6-25) | BB | BB | BB | BB | Inventive Example |
| 830 | SR2 | Compound (6-26) | BB | BB | BB | BB | Inventive Example |

TABLE VIII-2

| Cured product No. | Composition of SR Resin | Additive compound (1 part by mass) | Surface curability | Pencil hardness | Storage stability | Change in insulation resistance | Note |
|---|---|---|---|---|---|---|---|
| 831 | SR2 | Compound (6-27) | BB | BB | BB | BB | Inventive Example |
| 832 | SR2 | Compound (6-28) | BB | BB | BB | BB | Inventive Example |
| 833 | SR2 | Compound (7-12) | BB | BB | BB | BB | Inventive Example |
| 834 | SR2 | Compound (7-32) | BB | BB | BB | BB | Inventive Example |
| 835 | SR2 | Compound (7-34) | BB | BB | BB | BB | Inventive Example |
| 836 | SR2 | Compound (7-35) | BB | BB | BB | BB | Inventive Example |
| 837 | SR2 | Compound (7-40) | BB | BB | BB | BB | Inventive Example |
| 838 | SR2 | Compound (7-41) | BB | BB | BB | BB | Inventive Example |
| 839 | SR2 | Compound (7-42) | BB | BB | BB | BB | Inventive Example |
| 840 | SR2 | Compound (7-43) | BB | BB | BB | BB | Inventive Example |
| 841 | SR3 | — | BB | BB | BB | DD | Comparative Example |
| 842 | SR3 | Compound (2) | BB | BB | BB | BB | Inventive Example |
| 843 | SR3 | Compound (12) | BB | BB | BB | BB | Inventive Example |
| 844 | SR3 | Compound (30) | BB | BB | BB | BB | Inventive Example |
| 845 | SR3 | Compound (6-6) | BB | BB | BB | BB | Inventive Example |
| 846 | SR3 | Compound (6-9) | BB | BB | BB | BB | Inventive Example |
| 847 | SR3 | Compound (6-18) | BB | BB | BB | BB | Inventive Example |

TABLE VIII-2-continued

| Cured product No. | Composition of SR | | Evaluation | | | | |
|---|---|---|---|---|---|---|---|
| | Resin | Additive compound (1 part by mass) | Surface curability | Pencil hardness | Storage stability | Change in insulation resistance | Note |
| 848 | SR3 | Compound (6-22) | BB | BB | BB | BB | Inventive Example |
| 849 | SR3 | Compound (6-29) | BB | BB | BB | BB | Inventive Example |
| 850 | SR3 | Compound (6-30) | BB | BB | BB | BB | Inventive Example |
| 851 | SR3 | Compound (6-31) | BB | BB | BB | BB | Inventive Example |
| 852 | SR3 | Compound (6-32) | BB | BB | BB | BB | Inventive Example |
| 853 | SR3 | Compound (7- 1) | BB | BB | BB | BB | Inventive Example |
| 854 | SR3 | Compound (7-12) | BB | BB | BB | BB | Inventive Example |
| 855 | SR3 | Compound (7-32) | BB | BB | BB | BB | Inventive Example |
| 856 | SR3 | Compound (7-34) | BB | BB | BB | BB | Inventive Example |
| 857 | SR3 | Compound (7-44) | BB | BB | BB | BB | Inventive Example |
| 858 | SR3 | Compound (7-45) | BB | BB | BB | BB | Inventive Example |
| 859 | SR3 | Compound (7-46) | BB | BB | BB | BB | Inventive Example |
| 860 | SR3 | Compound (7-47) | BB | BB | BB | BB | Inventive Example |

It was found from the above results that each cured product using any compound according to Inventive Examples was excellent in terms of insulating properties of a solder resist without any loss of resist characteristics as compared with each cured product of Comparative Examples.

Example 9

A copper-clad stacked body sheet (manufactured by Sunhayato Corp.) (hereinafter, also referred to as "copper base material".) was subjected to a surface treatment with a peeling liquid, and thereafter a stacked body was obtained according to the following procedure.

<Production of Stacked Body 901>
(Formation of Resin Layer)

| | |
|---|---|
| Dichloromethane | 350 parts by mass |
| Polyimide A described above | 100 parts by mass |
| Matting agent (Aerosil R812, manufactured by Nippon Aerosil Co., Ltd.) | 0.5 parts by mass |

After a main dope having the composition was adjusted, a coating liquid was applied onto the copper base material to form a coating film, and the coating film was dried at a drying temperature so that the amount of the remaining solvent was less than 0.1% by mass, thereby obtaining stacked body 901 including a resin layer and having a dry thickness of 20 m.

<Production of Stacked Body 902>
(Formation of Intermediate Layer)

After 5 mg of compound (12) was dissolved in 1 mL of toluene, the resultant was applied onto the copper base material subjected to a surface treatment, according to a spin coating method (3000 rpm, 30 seconds), thereby forming an intermediate layer having a dry thickness of 30 nm.

(Formation of Resin Layer)

After a main dope having the same composition as in formation of the resin layer in production of stacked body 901, a coating liquid was applied onto the intermediate layer, to form a coating film, and the coating film was dried at a drying temperature so that the amount of the remaining solvent was less than 0.1% by mass, to form a resin layer, thereby obtaining stacked body 902 including an intermediate layer and the resin layer and having a dry thickness of 20 m.

<Production of Stacked Body 910>
(Formation of Resin Layer)

| | |
|---|---|
| Acrylic resin (Hitaloid7927) | 90 parts by mass |

After a main dope having the composition was adjusted, a coating liquid was applied onto the copper base material subjected to a surface treatment, to form a coating film, the coating film was dried at 70° C., and thereafter the coating film was cured by using an ultraviolet lamp with an irradiator at an illuminance of 300 mW/cm$^2$ and an irradiation level of 0.3 J/cm$^2$, with an atmosphere having an oxygen concentration of 1.0% by volume or less being purged with nitrogen, thereby obtaining stacked body 910 having a dry thickness of 20 m.

<Production of Stacked Body 911>
(Formation of Intermediate Layer)

After 5 mg of compound (2) was dissolved in 1 mL of toluene, the resultant was applied onto the copper base material subjected to a surface treatment, according to a spin coating method (3000 rpm, 30 seconds), thereby forming an intermediate layer having a dry thickness of 30 nm.

(Formation of Resin Layer)

After a main dope having the same composition as in formation of the resin layer in production of stacked body 910, a coating liquid was applied onto the intermediate layer, to form a coating film, and the coating film was dried at a drying temperature so that the amount of the remaining solvent was less than 0.1% by mass, to form a resin layer, thereby obtaining stacked body 911 including an intermediate layer and the resin layer and having a dry thickness of 20 m.

<Production of Stacked Body 917>
(Formation of Resin Layer)

| | |
|---|---|
| Methyl ethyl ketone | 350 parts by mass |
| Epoxy resin (HP-5000, manufactured by DIC Corporation) | 501 parts by mass |
| Phenol curing agent (MEH-7851-3H, manufactured by Meiwa Chemical Co., Ltd.) | 48 parts by mass |
| Cyclic siloxane compound (1,3,5,7-tetramethylcyclotetrasiloxane, manufactured by Azmax Corp.) | 2 parts by mass |

After a main dope having the composition was adjusted, a coating liquid was applied onto the copper base material subjected to a surface treatment, to form a coating film, the coating film was dried at 150° C., and thereafter stacked body 917 having a dry thickness of 20 m was obtained.

<Production of Stacked Body 918>

(Formation of Intermediate Layer)

After 5 mg of compound (51) was dissolved in 1 mL of toluene, the resultant was applied to the copper base material subjected to a surface treatment, according to a spin coating method (3000 rpm, 30 seconds), thereby forming an intermediate layer having a dry thickness of 30 nm.

(Formation of Resin Layer)

After a main dope having the same composition as in formation of the resin layer in production of stacked body 917, a coating liquid was applied onto the intermediate layer, to form a coating film, and the coating film was dried at a drying temperature so that the amount of the remaining solvent was less than 0.1% by mass, to form a resin layer, thereby obtaining stacked body 918 including an intermediate layer and the resin layer and having a dry thickness of 20 m.

<Production of Stacked Bodies 903 to 909, 912 to 916, and 919 to 923>

Each of stacked bodies 903 to 909, 912 to 916, and 919 to 923 was produced in the same manner except that the compounding amounts of the resin and the additive compound were changed as shown in Table IX below.

Each resin shown in the Table is as follows.

Polyimide: polyimide A

Acryl: Hitaloid 7927

Epoxy: epoxy resin (25) HP-5000: methoxynaphthalenedimethylene-type epoxy resin, manufactured by DIC Corporation, epoxy equivalent 250

[Evaluation]

<Peeling Strength in High Temperature Storage>

Each of the stacked bodies produced was subjected to measurement of the peeling strength at the initial stage of film formation and the peeling strength after 168 hours at a temperature of 80° C.

The peeling strength was measured with SAICAS (NN-04T manufactured by Daipla Wintes Co., Ltd.) in a constant load mode.

The measurement values in each Example and each Comparative Example were compared and evaluated under the assumption that those in stacked bodies 901, 910, and 917 according to Comparative Examples were each 100%.

TABLE IX

| Stacked body No. | Intermediate layer Additive compound | Resin layer Resin | Evaluation Adhesiveness after high temperature storage | Note |
|---|---|---|---|---|
| 901 | — | Polyimide | 100 | Comparative Example |
| 902 | Compound (12) | Polyimide | 120 | Inventive Example |
| 903 | Compound (40) | Polyimide | 123 | Inventive Example |
| 904 | Compound (14) | Polyimide | 119 | Inventive Example |
| 905 | Compound (47) | Polyimide | 123 | Inventive Example |
| 906 | Compound (6-14) | Polyimide | 124 | Inventive Example |
| 907 | Compound (6-26) | Polyimide | 121 | Inventive Example |
| 908 | Compound (7-16) | Polyimide | 119 | Inventive Example |
| 909 | Compound (7-39) | Polyimide | 125 | Inventive Example |
| 910 | — | Acrylic | 100 | Comparative Example |
| 911 | Compound (2) | Acrylic | 118 | Inventive Example |
| 912 | Compound (27) | Acrylic | 120 | Inventive Example |
| 913 | Compound (38) | Acrylic | 127 | Inventive Example |
| 914 | Compound (6-39) | Acrylic | 130 | Inventive Example |
| 915 | Compound (7-3) | Acrylic | 122 | Inventive Example |
| 916 | Compound (7-22) | Acrylic | 123 | Inventive Example |
| 917 | — | Epoxy | 100 | Comparative Example |
| 918 | Compound (51) | Epoxy | 122 | Inventive Example |
| 919 | Compound (19) | Epoxy | 123 | Inventive Example |
| 920 | Compound (38) | Epoxy | 120 | Inventive Example |
| 921 | Compound (6-18) | Epoxy | 131 | Inventive Example |
| 922 | Compound (6-44) | Epoxy | 129 | Inventive Example |
| 923 | Compound (7-5) | Epoxy | 124 | Inventive Example |

It was found from the above results that each stacked body using any compound according to Inventive Examples was excellent in terms of adhesiveness after high temperature storage as compared with each stacked body of Comparative Examples.

INDUSTRIAL APPLICABILITY

The present invention can be utilized in a resin composition and an electronic device which are excellent in adhesiveness to a metallic conductive layer, stability in high temperature storage, and light transmittance.

The invention claimed is:

1. An electronic device comprising a resin layer, a compound layer, and a metallic conductive layer, wherein
the compound layer comprises a compound having a structure represented by the following general formula (6):

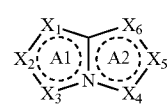

General Formula (6)

wherein, in the general formula (6), $X_1$ to $X_6$ each represent —N=, —NH—, or —CR$_1$—; R$_1$ represents a hydrogen atom, an aryl group, a heteroaryl group, an alkyl group, an alkenyl group, an alkynyl group, an alkoxy group, an amino group, a cyano group, a silyl group, a thiol group, a carbonyl group, a halogen atom, a trifluoromethyl group, or a hydroxy group, and optionally further has a substituent; and A1 and A2 form a heteroaryl ring, the metallic conductive layer, the compound layer, and the resin layer are laminated in this order, and the compound layer is formed only between the metallic conductive layer and the resin layer.

2. The resin composition according to claim 1, wherein the resin comprises any of a polyimide resin, an acrylic resin, a cellulose ester resin, a polycarbonate resin, a cycloolefin resin, a phenol resin, an epoxy resin, a polyphenylene ether resin, a polyester resin, or a melamine resin.

3. The electronic device according to claim 1, wherein the metallic conductive layer comprises any of Ag, Cu, Al, Mo, W, or Ti, or an alloy of any of Ag, Cu, Al, Mo, W, or Ti.

* * * * *